Figure 1:
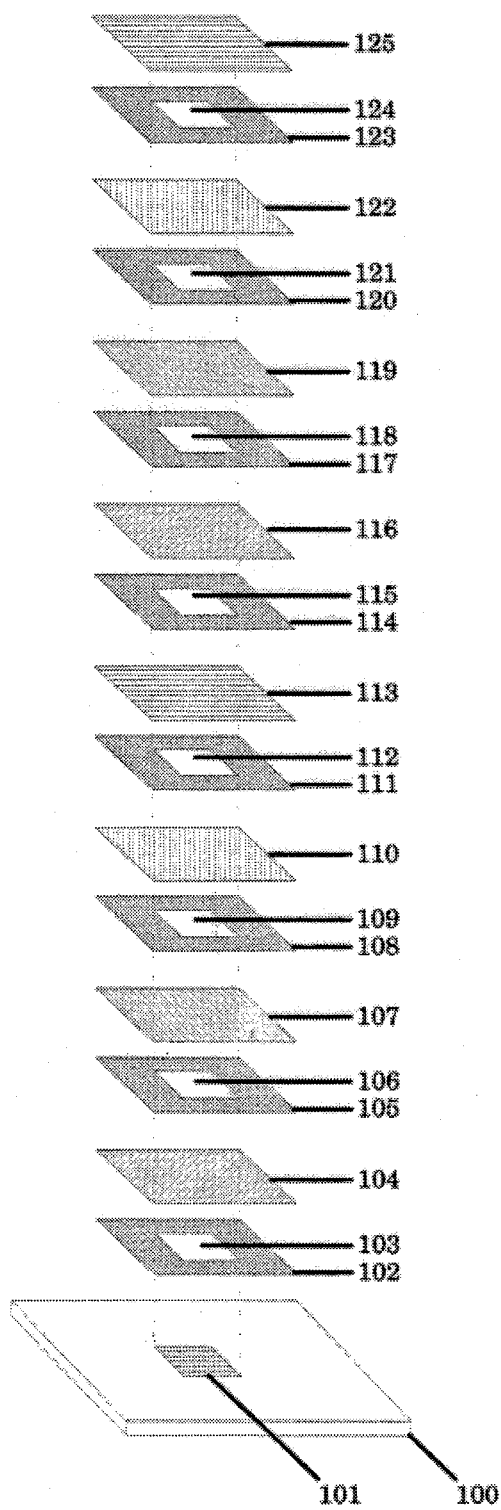

United States Patent [19]
Morton

[11] Patent Number: 5,567,573
[45] Date of Patent: Oct. 22, 1996

[54] OPTICAL DEVICE BEARING A PATTERN FOR REPRESENTING AT LEAST ONE IMAGE THAT IS CAPABLE OF HAVING MICROSCOPIC DETAIL

[76] Inventor: Steven G. Morton, 39 Old Good Hill Rd., Oxford, Conn. 06478

[21] Appl. No.: 416,446

[22] Filed: Apr. 3, 1995

Related U.S. Application Data

[62] Division of Ser. No. 23,630, Feb. 26, 1993, Pat. No. 5,426,010.

[51] Int. Cl.⁶ ..................................................... G03C 5/00
[52] U.S. Cl. ................................................. 430/321; 430/5
[58] Field of Search .............................. 430/19, 22, 321, 430/5

[56] References Cited

U.S. PATENT DOCUMENTS

| | | | |
|---|---|---|---|
| 5,257,182 | 10/1993 | Luck et al. | 364/413.1 |
| 5,287,272 | 2/1994 | Rutenberg et al. | 364/413.01 |
| 5,346,789 | 9/1994 | Lewis et al. | 430/19 |
| 5,415,835 | 5/1995 | Brueck et al. | 430/394 |

FOREIGN PATENT DOCUMENTS 420574  4/1991  European Pat. Off. .

Primary Examiner—S. Rosasco
Attorney, Agent, or Firm—Harry F. Smith

[57] ABSTRACT

A method for manufacturing ultra high resolution images, especially transmissive images, is described that is capable of fabricating images where each pixture element (pixel) has an intrinsic gray-scale, the gray-scale has a wide dynamic range, there are no voids between pixels, fabrication is not limited by the wavelength of light, and the pixels can be so tiny that their appearance is diffraction-limited. As a result, life-size images of cytology specimens can be fabricated with sufficient spatial and shading detail to show the details of the cell nuclei, and high-density, non-volatile, optical memory devices can be made. The method applies the tools of the semiconductor and optical device fabrication industries, and places registration marks on a substrate, repetitively: (1) masks the substrate, (2) places a layer of thin film upon the masked substrate, precisely registering each mask with the registration marks on the substrate, and (3) removes the mask and removes the thin film that did not land on the substrate or upon previously deposited thin film; where: (1) the optical transmission of the thin film varies from one layer to the next and is chosen from a set of transmission values, (2) the optical transmission of a given pixel is the composite of zero, one or a few thin film layers, (3) some of the thin film layers are used to form many of the pixels and some are not, and (4) the set of thin film optical transmissions is chosen in such a fashion as to give many shades while using a small number of manufacturing steps.

22 Claims, 28 Drawing Sheets (not to scale)

303

| 1 | 2 | 3 | 4 | 5 | 6 | 7 | 8 | 9 | 10 | 11 | 12 | 13 | 14 | 15 | 16 |
|---|---|---|---|---|---|---|---|---|----|----|----|----|----|----|----|
| 17 | 18 | 19 | 20 | 21 | 22 | 23 | 24 | 25 | 26 | 27 | 28 | 29 | 30 | 31 | 32 |
| 33 | 34 | 35 | 36 | 37 | 38 | 39 | 40 | 41 | 42 | 43 | 44 | 45 | 46 | 47 | 48 |
| 49 | 50 | 51 | 52 | 53 | 54 | 55 | 56 | 57 | 58 | 59 | 60 | 61 | 62 | 63 | 64 |
| 65 | 66 | 67 | 68 | 69 | 70 | 71 | 72 | 73 | 74 | 75 | 76 | 77 | 78 | 79 | 80 |
| 81 | 82 | 83 | 84 | 85 | 86 | 87 | 88 | 89 | 90 | 91 | 92 | 93 | 94 | 95 | 96 |
| 97 | 98 | 99 | 100 | 101 | 102 | 103 | 104 | 105 | 106 | 107 | 108 | 109 | 110 | 111 | 112 |
| 113 | 114 | 115 | 116 | 117 | 118 | 119 | 120 | 121 | 122 | 123 | 124 | 125 | 126 | 127 | 128 |
| 129 | 130 | 131 | 132 | 133 | 134 | 135 | 136 | 137 | 138 | 139 | 140 | 141 | 142 | 143 | 144 |
| 145 | 146 | 147 | 148 | 149 | 150 | 151 | 152 | 153 | 154 | 155 | 156 | 157 | 158 | 159 | 160 |
| 161 | 162 | 163 | 164 | 165 | 166 | 167 | 168 | 169 | 170 | 171 | 172 | 173 | 174 | 175 | 176 |
| 177 | 178 | 179 | 180 | 181 | 182 | 183 | 184 | 185 | 186 | 187 | 188 | 189 | 190 | 191 | 192 |
| 193 | 194 | 195 | 196 | 197 | 198 | 199 | 200 | 201 | 202 | 203 | 204 | 205 | 206 | 207 | 208 |
| 209 | 210 | 211 | 212 | 213 | 214 | 215 | 216 | 217 | 218 | 219 | 220 | 221 | 222 | 223 | 224 |
| 225 | 226 | 227 | 228 | 229 | 230 | 231 | 232 | 233 | 234 | 235 | 236 | 237 | 238 | 239 | 240 |
| 241 | 242 | 243 | 244 | 245 | 246 | 247 | 248 | 249 | 250 | 251 | 252 | 253 | 254 | 255 | 256 |

| Row | Col 2 | ran1 x256 | ran2 x256 | ran4 x256 | gra8 x8_0 | gra8 x8_1 | gra8 x8_2 | gra8 x8_3 | | top left | top1 | top2 | top3 | top4 | top right |
|---|---|---|---|---|---|---|---|---|---|---|---|---|---|---|---|
| Row 1: | rimg13mh | | | | | | | | | | | | | | |
| Row 2: | #1-890 | black | vert-1 | vert-2 | horiz -1 | horiz -2 | check -1 | check -2 | | left-a | fimg 26lg | fimg 22lg | fimg 21lg | fimg 20lg | right -a |
| Row 3: | #2-792 | black | vert-1 | vert-2 | horiz -1 | horiz -2 | check -1 | check -2 | | left-b | fimg 17lg | fimg 24lg | fimg 25lg | fimg 03lg | right -b |
| Row 4: | #3-705 | black | vert-1 | vert-2 | horiz -1 | horiz -2 | check -1 | check -2 | | left-c | rimg 01lg | rimg 37lg | rimg 33lg | rimg 26lg | right -c |
| Row 5: | #4-631 | black | vert-1 | vert-2 | horiz -1 | horiz -2 | check -1 | check -2 | | left-d | rimg 09lg | rimg 11lg | rimg 07lg | rimg 22lg | right -d |
| Row 6: | #5-560 | black | vert-1 | vert-2 | horiz -1 | horiz -2 | check -1 | check -2 | | left-e | rimg 24lg | rimg 13lg | rimg 28lg | rimg 31lg | right -e |
| Row 7: | #6-500 | black | vert-1 | vert-2 | horiz -1 | horiz -2 | check -1 | check -2 | | left-f | rimg 30lg | rimg 16lg | rimg 05lg | rimg 03lg | right -f |
| Row 8: | #7-250 | black | vert-1 | vert-2 | horiz -1 | horiz -2 | check -1 | check -2 | | left-g | rimg 20lg | | | | right -g |
| Row 9: | #8-125 | black | vert-1 | vert-2 | horiz -1 | horiz -2 | check -1 | check -2 | | left | | psml-2b | | | right |
| Row 10: | rimg13hh | | | | | | | | | bot left | bot1 | bot2 | bot3 | bot4 | bot right |

Column: 1  2  3  4  5  6  7  8  9  10  11  12  13  14  15  16  17

Figure 26

| 0 | 1 | 2 | 3 | 4 | 5 | 6 | 7 | ... |
|---|---|---|---|---|---|---|---|-----|
| 8 | 9 | 10 | 11 | 12 | 13 | 14 | 15 | ... |
| 16 | 17 | 18 | 19 | 20 | 21 | 22 | 23 | ... |
| 24 | 25 | 26 | 27 | 28 | 29 | 30 | 31 | ... |
| 32 | 33 | 34 | 35 | 36 | 37 | 38 | 39 | ... |
| 40 | 41 | 42 | 43 | 44 | 45 | 46 | 47 | ... |
| 48 | 49 | 50 | 51 | 52 | 53 | 54 | 55 | ... |
| 56 | 57 | 58 | 59 | 60 | 61 | 62 | 63 | ... |

Figure 27

| ... | 64 | 65 | 66 | 67 | 68 | 69 | 70 | 71 | ... |
|-----|----|----|----|----|----|----|----|----|----|
| ... | 72 | 73 | 74 | 75 | 76 | 77 | 78 | 79 | ... |
| ... | 80 | 81 | 82 | 83 | 84 | 85 | 86 | 87 | ... |
| ... | 88 | 89 | 90 | 91 | 92 | 93 | 94 | 95 | ... |
| ... | 96 | 97 | 98 | 99 | 100 | 101 | 102 | 103 | ... |
| ... | 104 | 105 | 106 | 107 | 108 | 109 | 110 | 111 | ... |
| ... | 112 | 113 | 114 | 115 | 116 | 117 | 118 | 119 | ... |
| ... | 120 | 121 | 122 | 123 | 124 | 125 | 126 | 127 | ... |

Figure 28

| ... | 128 | 129 | 130 | 131 | 132 | 133 | 134 | 135 | ... |
|---|---|---|---|---|---|---|---|---|---|
| ... | 136 | 137 | 138 | 139 | 140 | 141 | 142 | 143 | ... |
| ... | 144 | 145 | 146 | 147 | 148 | 149 | 150 | 151 | ... |
| ... | 152 | 153 | 154 | 155 | 156 | 157 | 158 | 159 | ... |
| ... | 160 | 161 | 162 | 163 | 164 | 165 | 166 | 167 | ... |
| ... | 168 | 169 | 170 | 171 | 172 | 173 | 174 | 175 | ... |
| ... | 176 | 177 | 178 | 179 | 180 | 181 | 182 | 183 | ... |
| ... | 184 | 185 | 186 | 187 | 188 | 189 | 190 | 191 | ... |

Figure 29

| ... | 192 | 193 | 194 | 195 | 196 | 197 | 198 | 199 |
|---|---|---|---|---|---|---|---|---|
| ... | 200 | 201 | 202 | 203 | 204 | 205 | 206 | 207 |
| ... | 208 | 209 | 210 | 211 | 212 | 213 | 214 | 215 |
| ... | 216 | 217 | 218 | 219 | 220 | 221 | 222 | 216 |
| ... | 224 | 225 | 226 | 227 | 228 | 229 | 230 | 217 |
| ... | 232 | 233 | 234 | 235 | 236 | 237 | 238 | 239 |
| ... | 240 | 241 | 242 | 243 | 244 | 245 | 246 | 247 |
| ... | 248 | 249 | 250 | 251 | 252 | 253 | 254 | 255 |

Figure 31

3100

| | | | |
|---|---|---|---|
| Stripe(1)_X, | Stripe(1)_Y, | path\Stripe(1)_name[, | options] |
| Image(1,1)_X, | Image(1,1)_Y, | path\Image(1,1)_name[, | options] |
| Image(1,2)_X, | Image(1,2)_Y, | path\Image(1,2)_name[, | options] |
| Image(1,3)_X, | Image(1,3)_Y, | path\Image(1,3)_name[, | options] |
| • | • | • | • |
| • | • | • | • |
| • | • | • | • |
| Image(1,M)_X, | Image(1,M)_Y, | path\Image(1,M)_name[, | options] |
| Stripe(1)_Xsize, | Stripe(1)_Ysize, | dummy_name[, | options] |

3106

| | | | |
|---|---|---|---|
| Stripe(2)_X, | Stripe(2)_Y, | path\Stripe(2)_name[, | options] |
| Image(2,1)_X, | Image(2,1)_Y, | path\Image(2,1)_name[, | options] |
| Image(2,2)_X, | Image(2,2)_Y, | path\Image(2,2)_name[, | options] |
| Image(2,3)_X, | Image(2,3)_Y, | path\Image(2,3)_name[, | options] |
| • | • | • | • |
| • | • | • | • |
| • | • | • | • |
| Image(2,N)_X, | Image(2,N)_Y, | path\Image(2,N)_name[, | options] |
| Stripe(2)_Xsize, | Stripe(2)_Ysize, | dummy_name[, | options] |

3112

| | | | |
|---|---|---|---|
| • | • | • | • |
| • | • | • | • |
| • | • | • | • |

OPTICAL DEVICE BEARING A PATTERN FOR REPRESENTING AT LEAST ONE IMAGE THAT IS CAPABLE OF HAVING MICROSCOPIC DETAIL

This invention was made with government support under grant #1-R43-CA54689-01 awarded by the National Cancer Institute of the National Institutes of Health. The U.S. government has certain rights in the invention.

This is a divisional of application Ser. No. 08/023,630 filed on Feb. 26, 1993 now U.S. Pat. No. 5,426,010.

1. FIELD OF THE INVENTION

This invention relates generally to the fabrication of permanent images upon a substrate, particularly where one desires to have extremely high spatial resolution and to create shaded images that are very small. Such small, high resolution images can be used to create optical memories or the life-size images of cytology specimens where one desires to resolve the shapes and contents of the cell nuclei in the life-size images created.

TABLE OF CONTENTS

1. Field of the Invention
2. Background of the Invention
   2.1 Prior An Printing and Photographic Techniques
   2.1.1 Printing
   2.1.2 Photography
   2.1.3 Photolithography
   2.1.4 e-beam lithography
   2.2 Prior Art Fabrication Techniques
   2.2.1 Thin-film Deposition
   2.2.2 Semiconductor Fabrication
   2.3 Mask File Definition
   2.4 Image File Manipulation
3. Objects of the Invention
4. Summary of the Invention
5. Brief Description of the Drawings
6. Detailed Description of the Invention
   6.1 Fabrication Example #1
   6.2 Fabrication Example #2
   6.3 Fabrication Process
   6.3.1 Preferred Embodiment
   6.3.2 Alternative Embodiment
   6.4 Method for Selecting Number and Densities of Thin-film Layers
   6.5 Additional Fabrication Details
   6.5.1 Patterning
   6.5.2 Photoresist Selection
   6.5.3 Substrate Selection
   6.5.4 Thin-film Deposition
   6.5.5 Mask Alignment
   6.5.6 Creation of Reflective Images
   6.5.7 Creation of Color Images
   6.5.8 Creation of Three-dimensional Images
   6.5.9 Correction of Manufacturing Errors
   6.6 Method for Defining Bit-Mapped Mask Files
   6.6.1 Method for Combining Image Files
   6.6.2 Method for Defining a Mask File
     6.6.2.1 Header Format
     6.6.2.2 Layer Identifier
     6.6.2.3 Scan Line Identifier
     6.6.2.4 CRC Coding
     6.6.2.5 Example of Layer, Line and CRC Coding
7. Appendices
   Appendix 1. Number of Layers Deposited in Each Test Area in Fabrication Example #1
   Appendix 2. Measured Transmission Values from Fabrication Example #1
   Appendix 3. Errors in Adjusted Transmission Values in Fabrication Example #1
   Appendix 4. Pixel Translations Used in Fabrication Example #2
   Appendix 5. File Header Focal for Bit-Mapped Mask Files
   Appendix 6. Text File Used to Create Pap Smear Micro Library #2B
8. Claims
9. Abstract of the Disclosure

2. BACKGROUND OF THE INVENTION

The invention was motivated by a series of articles in national newspapers including *The New York Times* and *The Wall Street Journal* in the mid 1980's about the difficulties of adequately screening millions of cervical Pap smears every year, resulting in the deaths of many women from cervical cancer. Others have responded to these same articles by developing automated Pap smear screening systems. Law makers have responded to these articles by mandating that the quality of the work performed by cytotechnicians in cytology screening laboratories should be assured.

As the performance of automated Pap smear screening systems improves and their use becomes widespread as a means of cost containment, it becomes increasingly important to periodically confirm that the machines are doing a good job. Periodic checking, rather than verification only at the time of machine type acceptance by the medical community, is necessary because the image processing algorithms will be updated over time and because the machines have many operational variables that affect their performance. An image digitization system as simple as a facsimile machine cannot produce the same digitized image twice, and a Pap smear screening system is far more complex, having to recognize the complex images it digitizes.

What is needed are comprehensive, standard sets of test images that can be periodically scanned by all of the machines. Subtle differences in the specimens that represent the extremes of laboratory practice in obtaining and preparing the specimens should be captured. Until the machines take over, cytotechnicians must be periodically requalified. Since the machines scan specimens on microscope slides, the test images must appear to be natural images and must be handled like natural images—they should be inserted into a batch of specimens without any change to the work flow. Since there may be many machines and cytotechnicians, and since test specimens may be broken during handling, many like copies of the test images must be produced.

By practicing the invention described herein, multiple specimen images can be combined and reproduced life-size to satisfy these requirements. Images with varying brightness and contrast can be made to test equipment behavior with poor quality specimens or lighting. Life-size images of any type of specimen can be provided—the technique is not restricted to Pap smear images. One can also synthesize images to simulate situations that rarely occur in nature, or to simulate situations that occur but for which no specimen is available.

2.1 Prior Art Printing and Photographic Techniques

A fundamental limitation of prior art techniques to produce permanent images is that they cannot produce shaded, life-size images of biological specimens or other very tiny objects. This limitation results from the inability of these techniques to resolve the fine detail required to produce the images at natural size. As a result, only greatly magnified images can be produced. Similarly, prior art techniques cannot reduce the size of relatively large images to exceedingly small dimensions.

Of the techniques for producing permanent images, previous printing methods have the lowest spatial resolution since they cast individual dots of pigment upon a substrate and rely upon the eye to blur them together when viewed at a sufficient distance and thus to create a range of colors and intensities. Shades of gray are created by varying the spacing between the dots, and only four colors of pigments are usually used, so the blurring properties of the eye are an essential part of the image formation process. With a small amount of magnification, the individual dots and blank spaces between them can be seen.

Photographic methods have much higher spatial resolution than the printing methods since they rely upon molecules in an emulsion rather than mechanically produced dots of pigment. Furthermore, the molecules produce picture elements (or pixels or dots—the smallest resolvable elements of a picture) with intrinsic gray scale and color, so no blurring by the eye is required. However, photography is an analog process, where successive errors in the reproduction process add up, and relies upon the manipulation of light to print an image. Differences in image color and sharpness in prints of the same negative from two photo labs are readily apparent.

Each of these techniques uses a different means to create a two-dimensional, visual image—a natural image. Unlike computer storage devices that store images that can only be read electronically using special equipment, these techniques do not require any electronic equipment to view the images they create.

Common techniques for creating permanent images are:

2.1.1 Printing

Printing places pigment upon a passive substrate. Common printing methods are:

- printing press—applies liquid ink or dye to a mechanically patterned plate or rotating drum, and from there onto a passive substrate
- stenciler—applies liquid ink or dye through a removable, patterned mask onto a passive substrate
- photocopier—applies dry ink or toner to an electrically charged, rotating drum that has been temporarily patterned by being optically exposed to a master copy, and from there onto a passive substrate
- laser printer—transfers dry ink or toner to an electrically charged, rotating drum that has been temporarily patterned by being exposed to one or more tiny light sources under control of an electronic master copy, and from them onto a passive substrate
- ink-jet printer—transfers liquid ink from a moving print head onto a passive substrate under control of an electronic master copy
- wax-jet printer—transfers liquid wax from a moving print head onto a passive substrate under control of an electronic master copy 2.1.2 Photography In photography, an entire, continuous tone image is projected upon, and captured in, a light-sensitive emulsion that has been placed upon a substrate. The entire image is usually formed at one time. The emulsion is developed and unexposed emulsion is removed. Image quality is limited by optical aberrations in the lenses and diffractive effects, and errors caused by making successive copies of an image.

Image content is limited by the difficulty of optically combining multiple images into one. This is an analog process so small errors in each step of the process add up.

2.1.3 Photolithography

In photolithography, individual elements of a binary (black OR white) image are successively projected upon, and captured in, a light-sensitive emulsion (photoresist) that has been placed upon a substrate. Images are created mechanically with a light source and a physical aperture that changes size, shape and position relative to the substrate to expose different portions of the substrate. The emulsion is developed and unexposed emulsion is removed, leaving an image on the substrate.

The process is limited by the size of the apertures that must be several times the wavelength of light to minimize diffractive effects, and the long time required to form a complex image.

2.1.4 e-beam lithography

In e-beam lithography, an electron beam (or other radiation with a short wavelength) is scanned across a glass substrate that has been covered with an electrical conductor and an emulsion. The electrical conductor is typically a thin film of chrome that has an optical density of about 3, giving an optical transmission of about 1/1000, making it essentially opaque. The emulsion, which is typically some form of photoresist, is activated by the e-beam. Individual elements of a binary (black OR white) image are successively projected upon, and captured in, the photoresist by rapidly turning the electron beam on and off. The photoresist is developed, leaving holes in the photoresist, the chrome that is exposed by the openings in the photoresist is etched away, and then the remaining photoresist is removed, leaving a binary image on the substrate.

The process is limited by its formation of a binary image.

2.2 Prior Art Fabrication Techniques 2.2.1 Thin-film Deposition

Optical filters for photographic and other applications are made by forming a thin metal film on glass. The thickness of the thin film determines the optical transmission of the filter. No pattern is used. The films can be formed in various ways including sputtering and thermal evaporation. Thin films are also deposited on other substrates, such as plastic, for making static-protective bags, but no images are formed.

Filters with a nearly flat spectral response can be made using Inconel, a chrome compound, giving them a neutral gray appearance in transmission (light passes through them rather than being reflected from them). Other metals, such as gold, have a non-uniform transmission spectrum and give colored images.

Neutral density filters with a range of gray shades are commonly made two ways. First, stepped filters have a set of distinct transmission values. A separate deposition step is used for each transmission value desired. Patterning is usually limited to defining relatively large areas, although photolithography is sometimes used to form test patterns such as checkerboards with minimum feature sizes of several micrometers. Second, graded-density filters are made by blocking thin-film deposition in a variable fashion, as by turning a substrate beneath an aperture so that a continuously varying amount of material is deposited upon a substrate. Again, patterning is limited to defining relatively large areas and the mechanical blockage of the deposition gives changes in optical density over large spatial extents (typically a fraction of an inch).

2.2.2 Semiconductor Fabrication

Integrated circuits are made by patterning a semiconductor wafer and depositing various materials upon the wafer. Since the objective is to build miniature electronic circuits, there is no concern for the appearance of the devices being fabricated so long as various process parameters, such as line width, are obtained. In addition, the intent is to make sharp distinctions between objects placed upon the wafer—one either wants a metal line as a conductor or not—there is no use for a gray-scale line.

2.3 Mask File Definition

There are two defacto data file standards, Calma GDS-II and MEBES, for defining the mask files for building integrated circuits. Both are proprietary to the vendors that make, or made, equipment for designing and/or building integrated circuits. Calma GDS-II (Graphic Design System) was developed by General Electric, and MEBES was developed by Etec Systems.

Both standards assume that one is creating integrated circuits, not natural images for optical devices. Integrated circuits have many regular structures, and structures that are repeated many times, so the standards enable one to define a collection of objects and to place these objects wherever one wants. The designs are based upon polygons. There are multiple (10 to 20 or more) fabrication steps, each of which is represented by a mask, that are precisely aligned with one another during device manufacture.

2.4 Image File Manipulation

In graphic design using electronic techniques, as for creating a magazine advertisement, one may combine multiple digitized photographic images together to create a finished design. Depending upon the complexity of the design, one may need to combine several to tens of photographic images. Computer-generated artwork, such as text, is often added to the photographic images.

The simplest way of combining multiple digitized images is to manually place each one on an electronic page using an image-editing program such as Micrografx' *Picture Publisher* or ZSoft's *PhotoFinish*. One uses a mouse to point to the position on the page where one desired to place an image. These programs represent each image as a collection of pixels, rather than a collection of objects, and can handle binary, shaded black-and-white (gray scale), and color images. Each pixel is represented by a single bit for binary images, an 8-bit byte for gray-scale, or three 8-bit bytes for color images. The pixel data is represented in several standard file formats including PCX and TIFF.

Alternatively, one can use a graphic design program such as Corel System's *Corel Draw*, or Micrografx' *Designer*, to place an image on an electronic page. These are vector-based programs that can import bit-mapped (digitized) images, although their native images are based upon lines, arcs and text. They cannot edit bit-mapped images.

However, there are many obstacles to taking these approaches for creating collections of large numbers of complex images. First, there is a limit on the size of each bit-mapped image that can be imported. Some programs have a limit as low as 256-×256-pixels, with a usual limit of several thousand by several pixels. Second, it is virtually impossible to place the images on the electronic page exactly where one wants if the combined images have more than a few hundred thousand pixels. Third, there is a limit to the size of the overall image, usually a few million to ten million pixels. Fourth, the time required to add each image to the composite image increases dramatically as more images were added, so the practical limits on image size are much less than the theoretical limits on image size.

In addition, since the programs are intended for creating images for graphic design purposes, where the loss of a few pixels may not be noticed, there are no safeguards to ensure that the data is handled properly. In addition, there is no concept of a mask—one simply has the bit or byte or bytes that represent a pixel. If one wants to do a four-color separation for printing purposes, one can translate a single file with color information into four gray-scale files, being careful to keep track of which file represents each of the four colors.

3. OBJECTS OF THE INVENTION

It is an object of the invention to adapt the tools of the semiconductor and optical devices industries to fabricate ultra high resolution, life-size images of cytology specimens. Such images cannot be obtained using any prior art printing processes because of the large dot size and lack of continuous tone capability of these printing processes. (A continuous-tone image has picture elements/pixels with an intrinsic gray-scale.) Furthermore, such cell images cannot be obtained using photographic film because of the large grain size of even the best film. By practicing the invention described herein, cell images can be fabricated on glass so that they can be used in place of natural specimens for imaging purposes. In addition, identical images can be mass produced so they can be widely used for educational purposes and to assure the quality of cytology labs and automated cell screening equipment.

Additional objects of the invention include the:

1. manufacturing life-size images of cytology specimens with sufficient spatial resolution to show the details of the cell nuclei,
2. creation of transmissive images of cytology specimens that can be viewed like ordinary specimens that are mounted on microscope slides,
3. providing an ultra high resolution printing process,
4. creation of such tiny pixels that their appearance is diffraction-limited,
5. creation of each pixel with an intrinsic gray-scale to produce an image with continuous tone,
6. production of pixels dots with no voids between them,
7. production of a printing process that is not limited by the wavelength of light to fabricate the pixels,
8. creation of a wide range of shades of gray that can optimized to give the best rendition possible of the images printed, such as for showing details in dark areas such as cell nuclei,
9. production of many shades of gray with only a small number of manufacturing steps,
10. production of a collection of life-size, cell images,
11. ability to print natural, modified and/or synthetic images of varied subject matter,
12. conversion of a group of many images into a set of composite images having a format suitable for fabrication,
13. making of many image-bearing devices at the same time,
14. ensuring the integrity of the data handling and manufacturing process,
15. ability to produce three-dimensional images,
16. ability to produce black-and-white and colored images,
17. ability to produce optical memories,
18. creation of transmissive and reflective images,
19. creation of stored data patterns that can be used with various types of incident energy, 20. minimizing of the likelihood that errors will be made during the manufacture of the devices, and 21. facilitation of the correction of manufacturing errors in the making of the devices.

4. SUMMARY OF THE INVENTION

The aforementioned problems are overcome and the objects of the invention are realized by the ultra high resolution printing method described herein. Compared to very high resolution (600 dots per inch) laser printers, even the use of relatively large, 1 µm pixels gives 40 times the dot density per linear inch or 1,600 times the dot density per square inch, and 50 times the dynamic range of shades for individual dots, for a net improvement of 80,000 times. With the use of 0.5 µm pixels, a net improvement of 320,000 times can be obtained.

The novel printing method that is the subject of the invention is able to fabricate optical chips, or application-specific optical devices, from the photographic images of biological cell specimens such as may be obtained from cervical Pap smears, but any type of cell specimens can be used. In addition, synthetic (computer-generated) images can also be printed, creating optical memories for many applications. Optical devices containing a combination of natural, computer-modified and synthetic images can also be created.

The basic technique for creating ultra high resolution images is:

1. obtain images in a digital format photograph of one or more subjects
2. compose said digital image(s) into a desired graphical format
3. use the novel method described herein to convert the graphic design to a form suitable for making an optical device
4. place registration marks on a substrate
5. in a series of manufacturing steps that is repeated several times:
   a. cover the substrate with photoresist or other material that can be finely patterned
   b. make many copies of a pattern of holes in the photoresist on the substrate to form a mask, precisely aligning the mask with the registration marks, where the mask varies from layer to layer
   c. deposit a very thin film of optical material upon the substrate, where the optical transmission of the thin film layer varies from layer to layer in a precise fashion
   d. remove the photoresist and any optical material upon it, leaving behind the optical material that fell through the holes in the photoresist and onto the substrate or upon previously deposited optical material
6. separate the optical devices from one another
7. mount each good optical device on a larger substrate for ease of use

5. BRIEF DESCRIPTION OF THE DRAWINGS

Note: For the convenience of the reader, reference numbers are coded in such a way as to make it easy to identify which Figure is being referenced. The coding is XXYY, where XX is the Figure number and YY is the number of an item within the Figure.

FIG. 1, Exploded View of Mask and Deposition Steps, is a simplified view that depicts the novel method taught by the invention to use a plurality of mask and deposition steps for fabricating ultra high resolution images upon a substrate. For simplicity, only a single pixel is shown. Typically, multiple pixels will be adjacent to one another, each requiring one or more holes in a mask, and not all mask layers will have holes in them for a single pixel.

Figure 2:
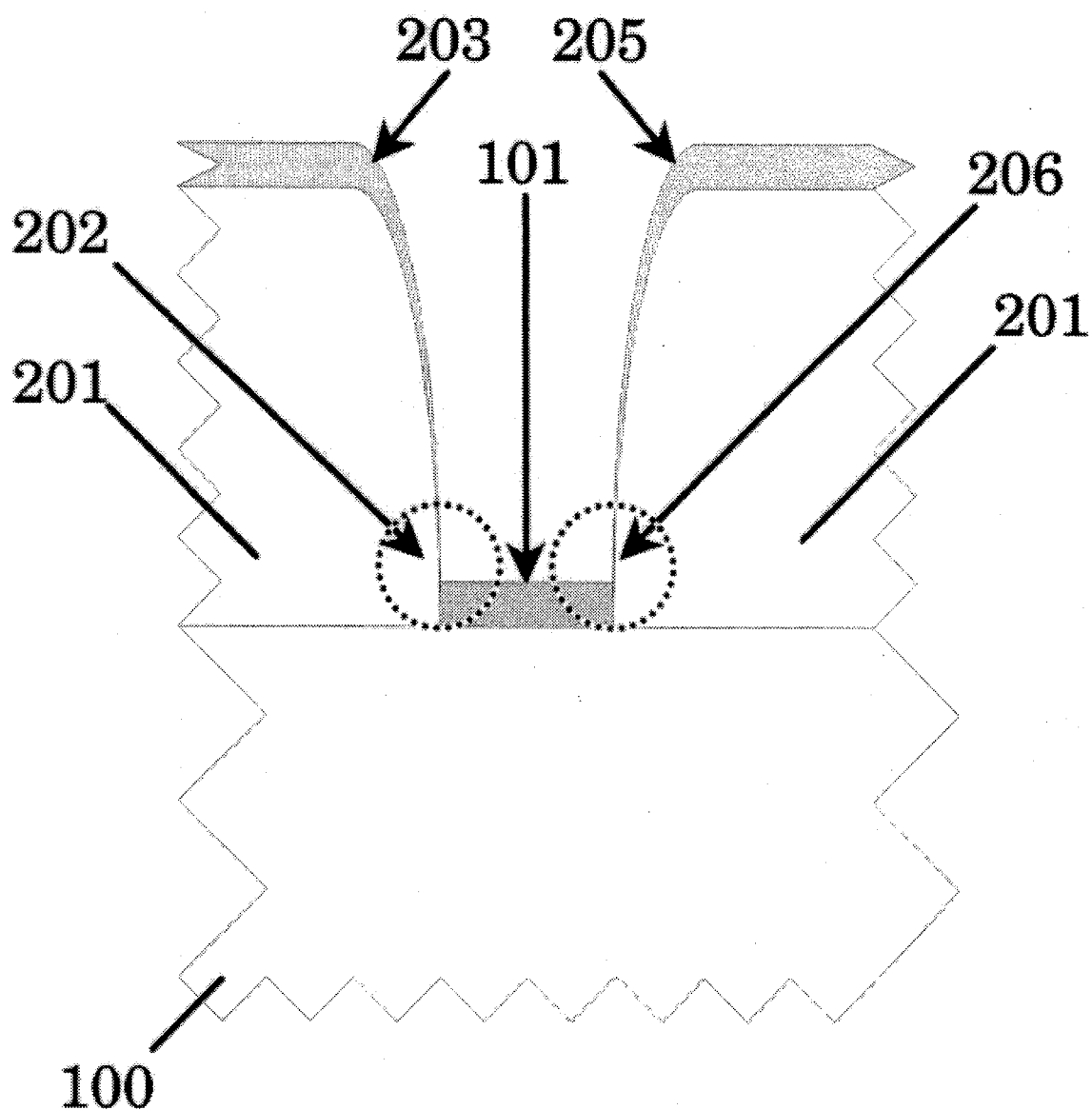

FIG. 2, Thin-film Fracturing, is an enlarged, not-to-scale, cross-sectional view of a portion of an image as it is fabricated, showing that the deposition of a thin film causes some of the thin film to pass through the hole in a mask and to land on a substrate, where it remains after the thin film landing on the photoresist has been removed.

FIGS. 3 to 10, Fabrication Example #1 Masks #1 to #8, each illustrate in detail an example of the masking steps shown in FIG. 1.

FIG. 11, Fabrication Example #1 Grid Labels, enumerates the 256 pixels created by the eight masks shown in FIGS. 3 to 10. Tables describing the results obtained are given in Appendices 1 to 3.

Figure 12:
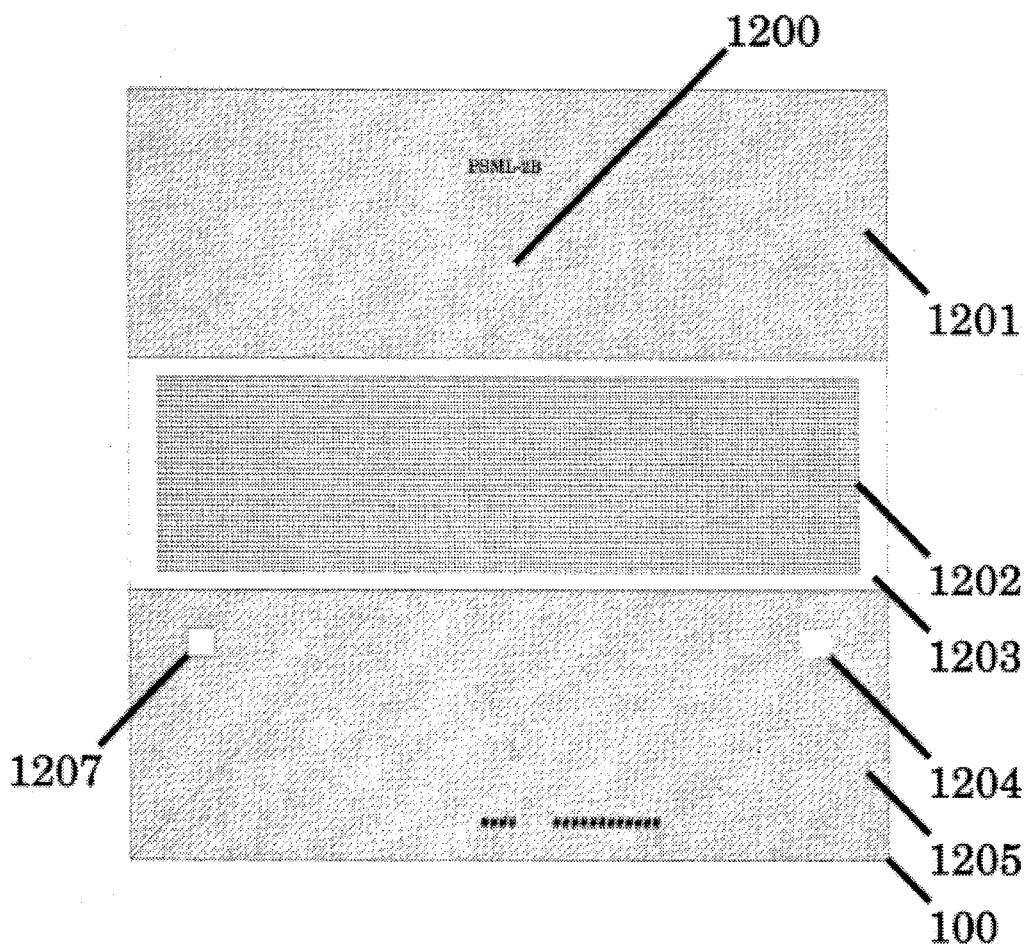

FIG. 12, Drawing of a Patterned Plate, depicts the design of a plate used to fabricate multiple optical devices using the teachings of this invention.

Figure 13:
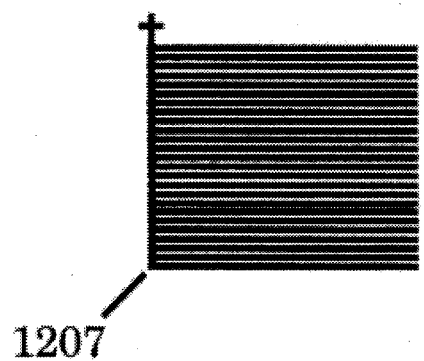

FIG. 13, Enlarged Drawing of Fiduciary Mark, depicts a typical pattern used to assure alignment of the masks during fabrication of the optical devices. (Prior art.)

Figure 14:
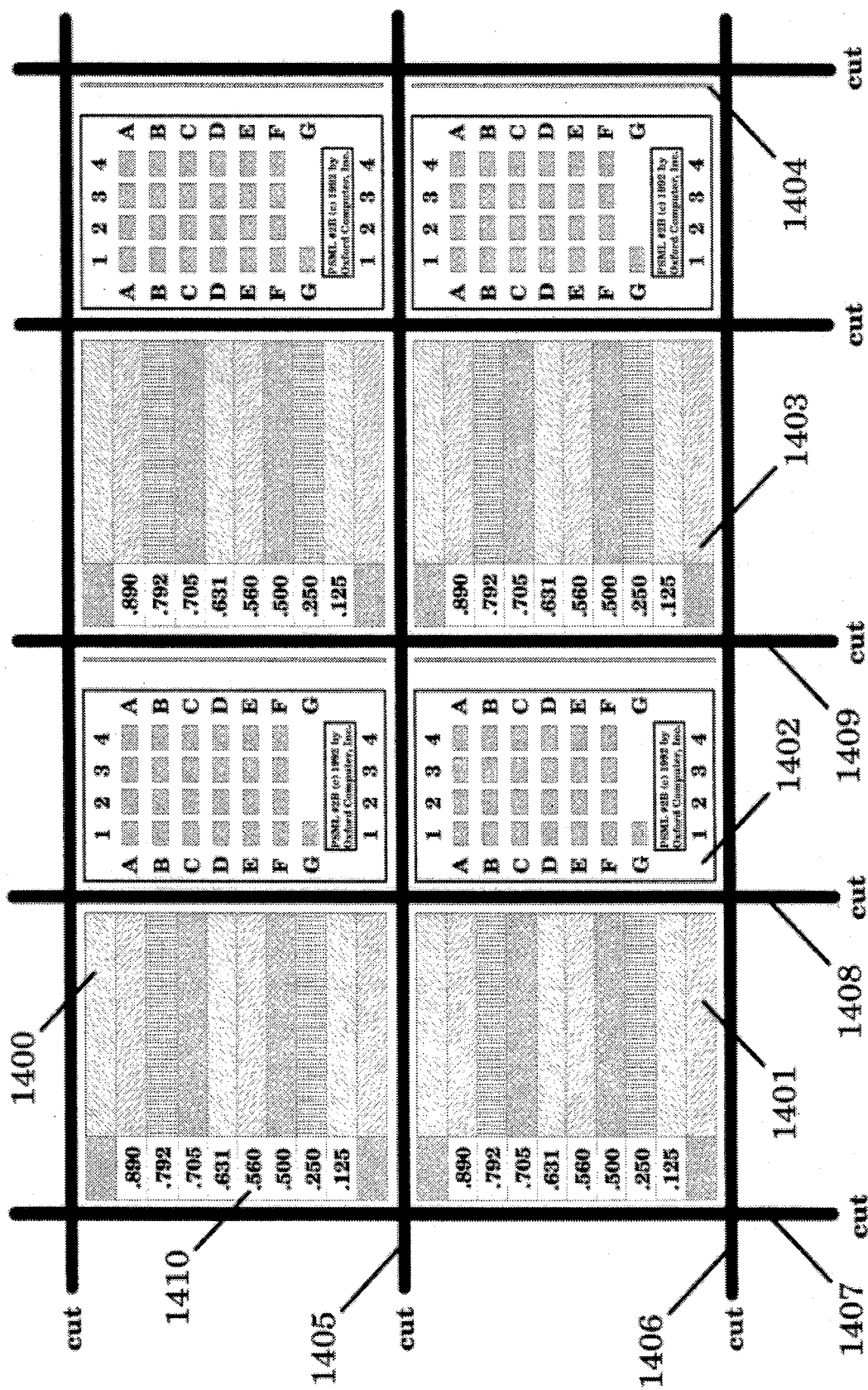

FIG. 14, Dicing Diagram for Pap Smear Micro Library Optical Devices, shows how a collection of optical devices formed on a single substrate or plate using the teachings of this invention are separated from one another.

Figure 15:
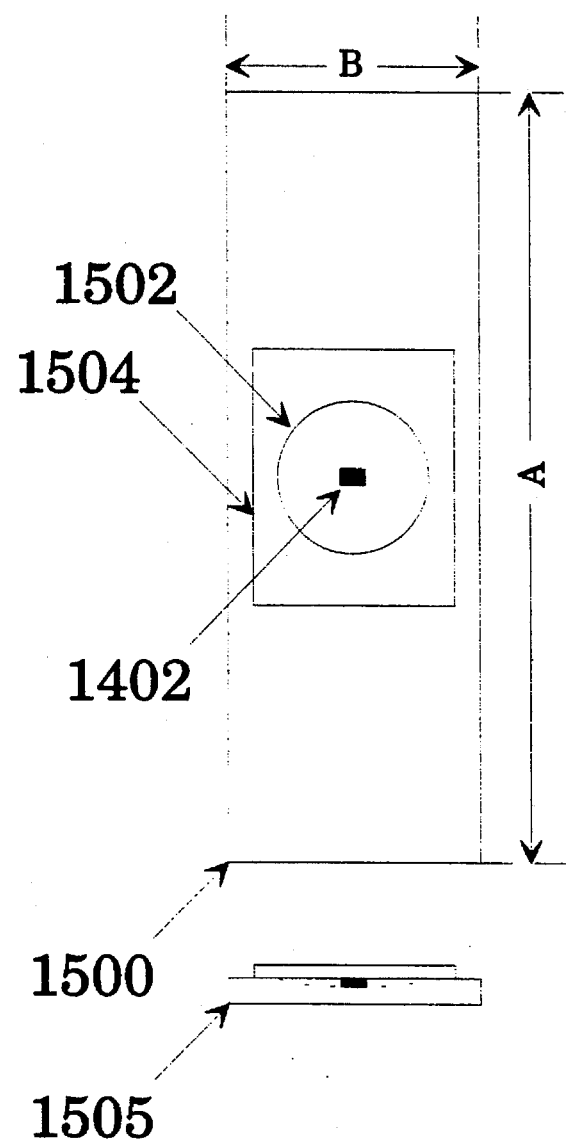

FIG. 15, Drawing of Mounted Pap Smear Micro Library Optical Device, shows how a single optical device can be mounted in the well of a microscope slide using the teachings of this invention.

Figure 16:
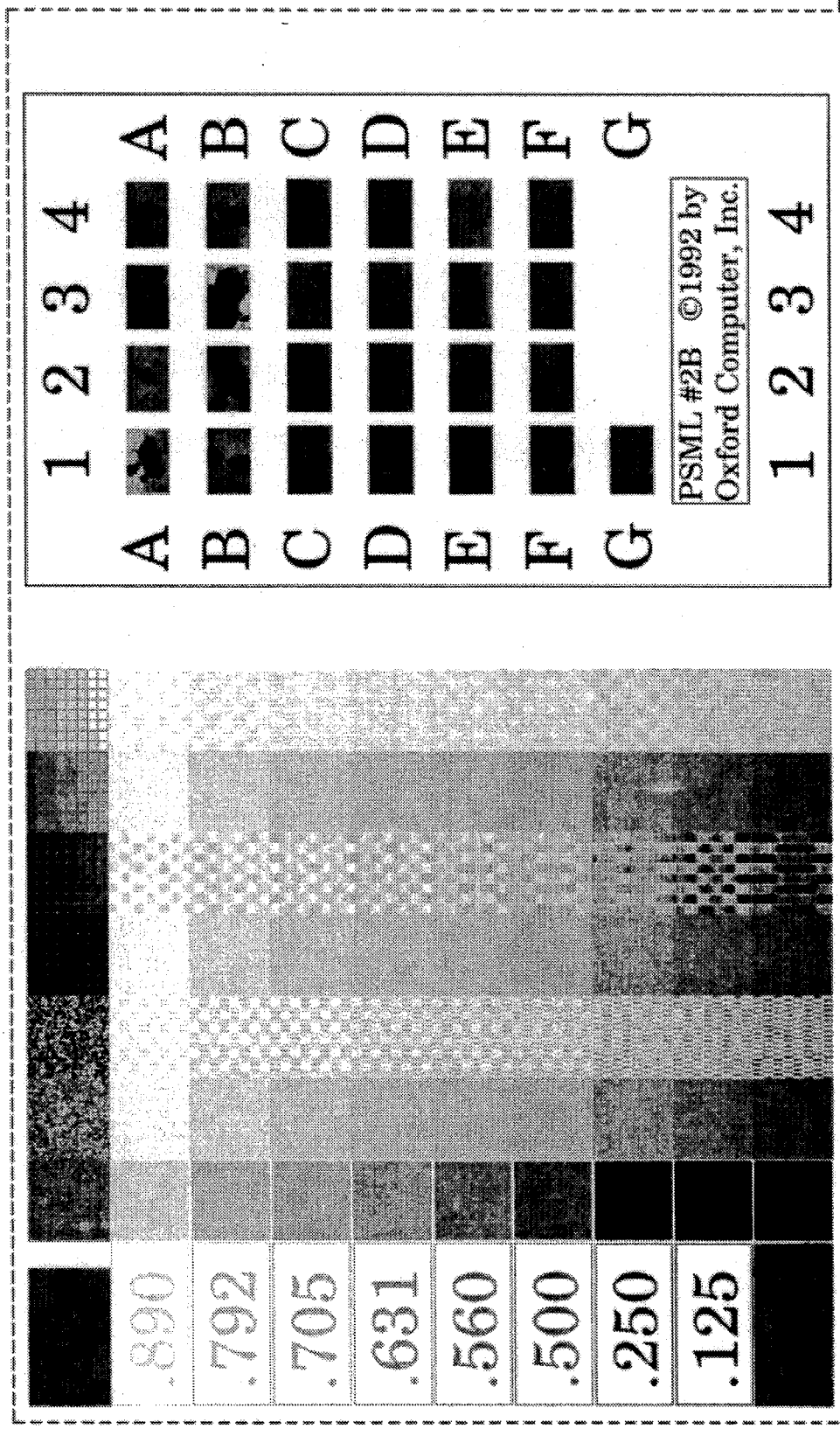
Figure 17:
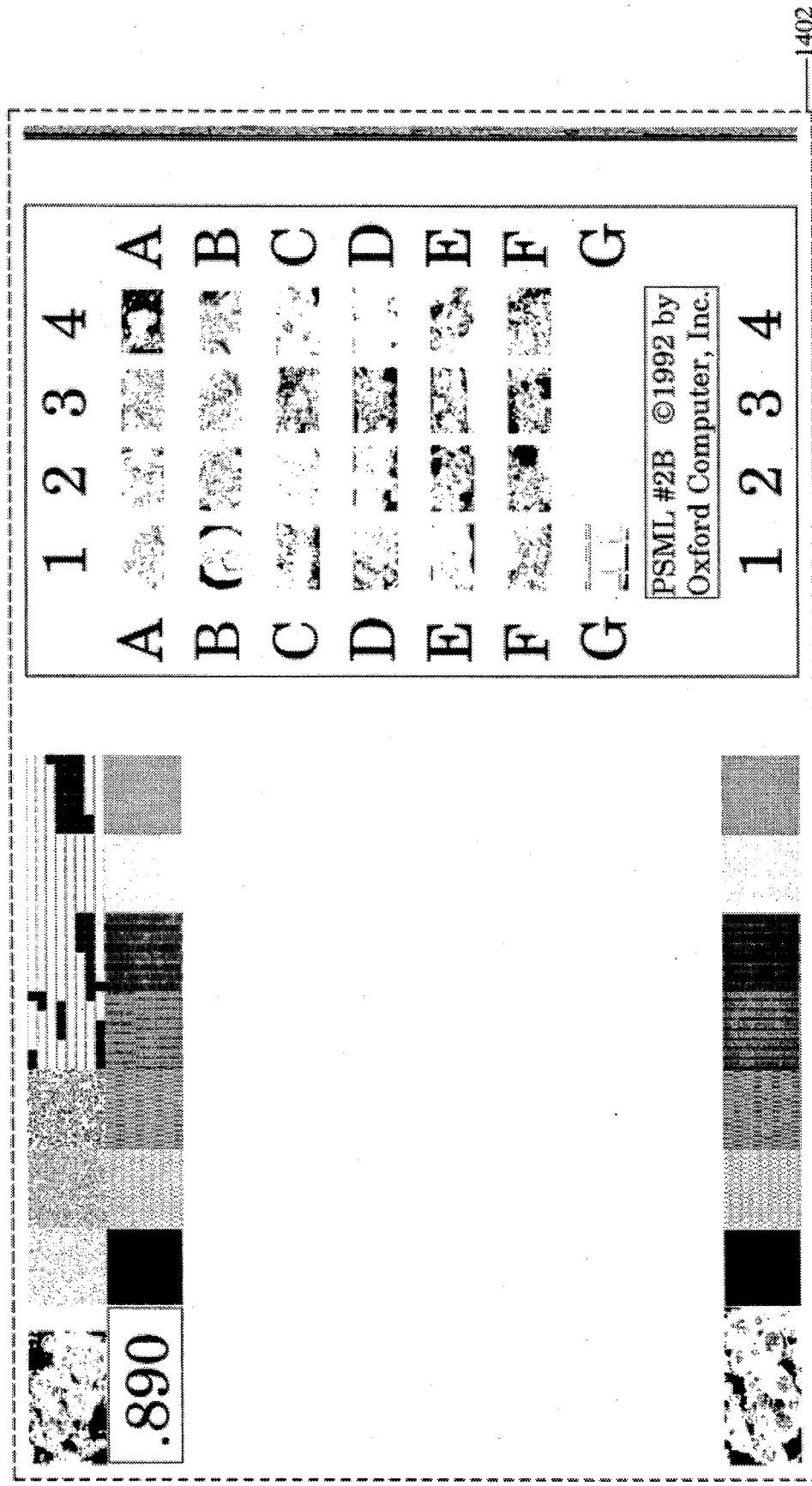
Figure 18:
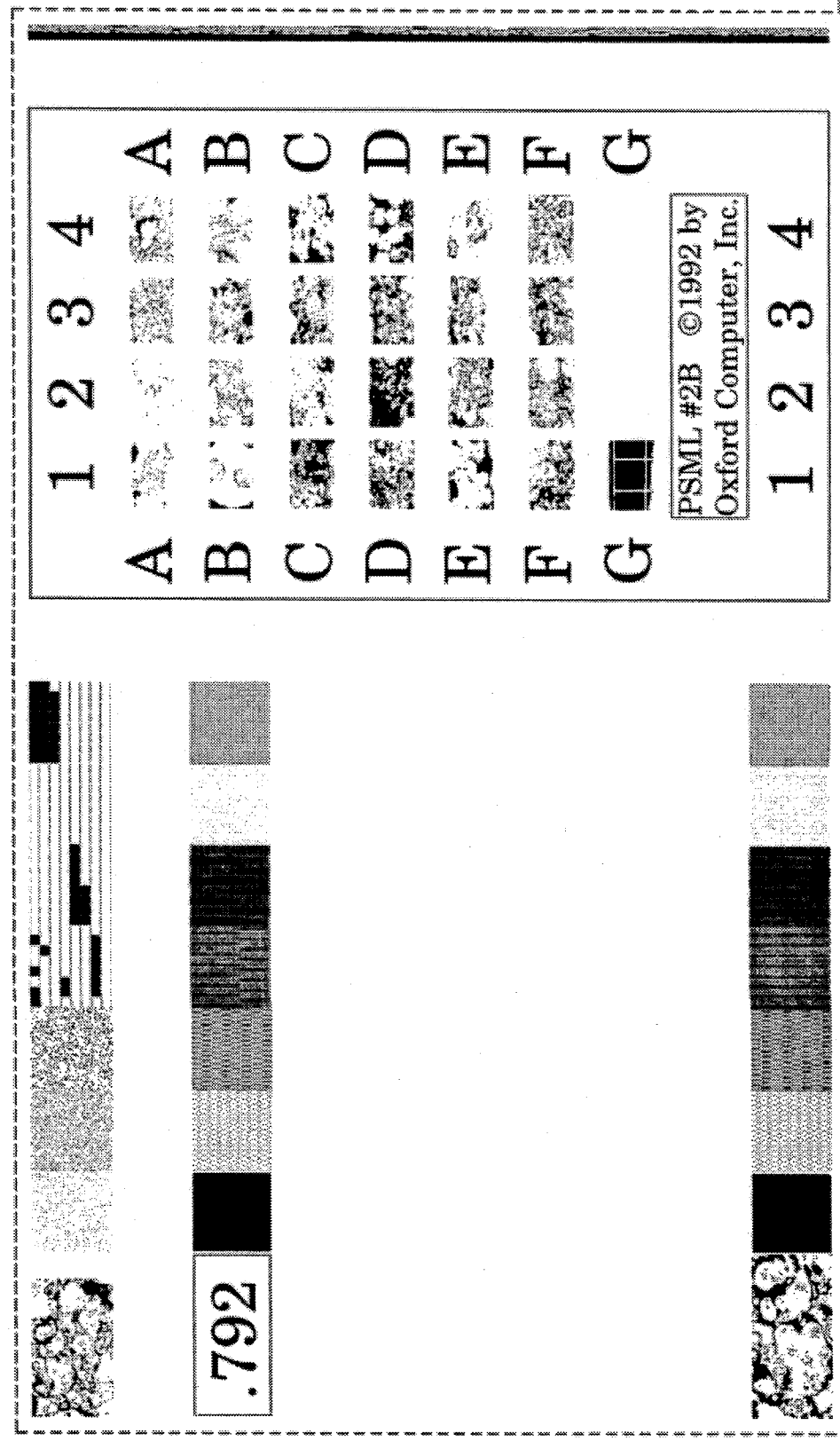
Figure 19:
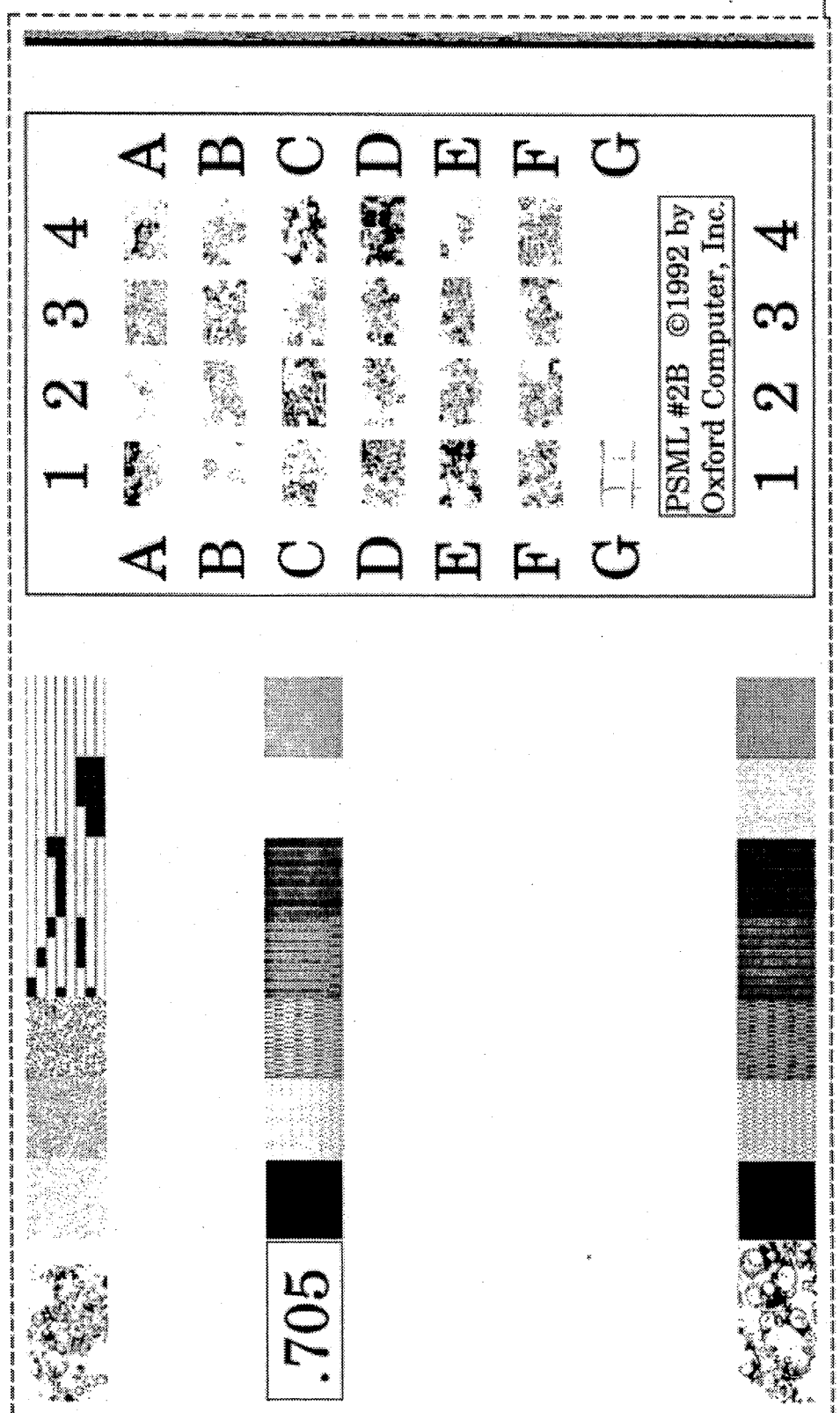
Figure 20:
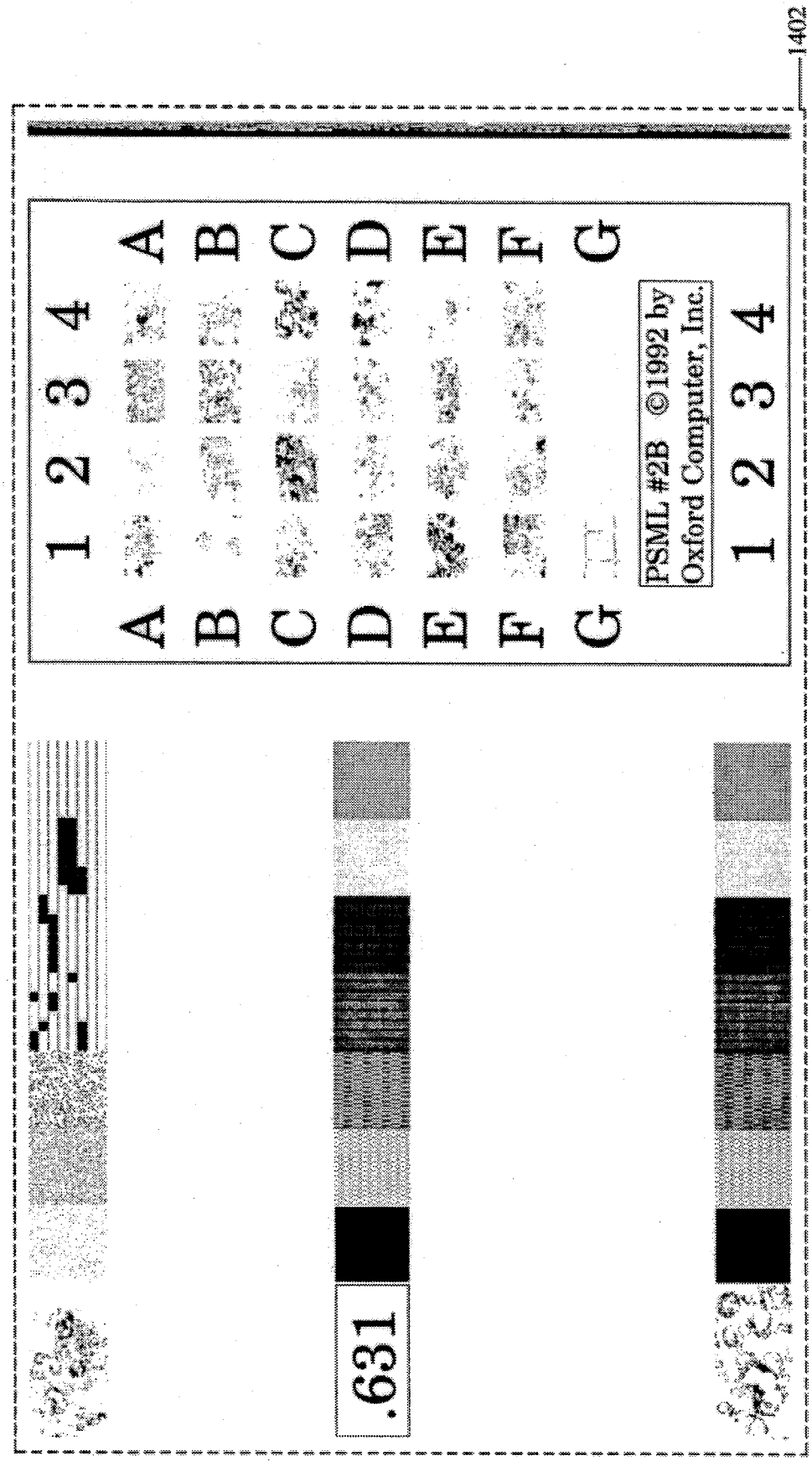
Figure 21:
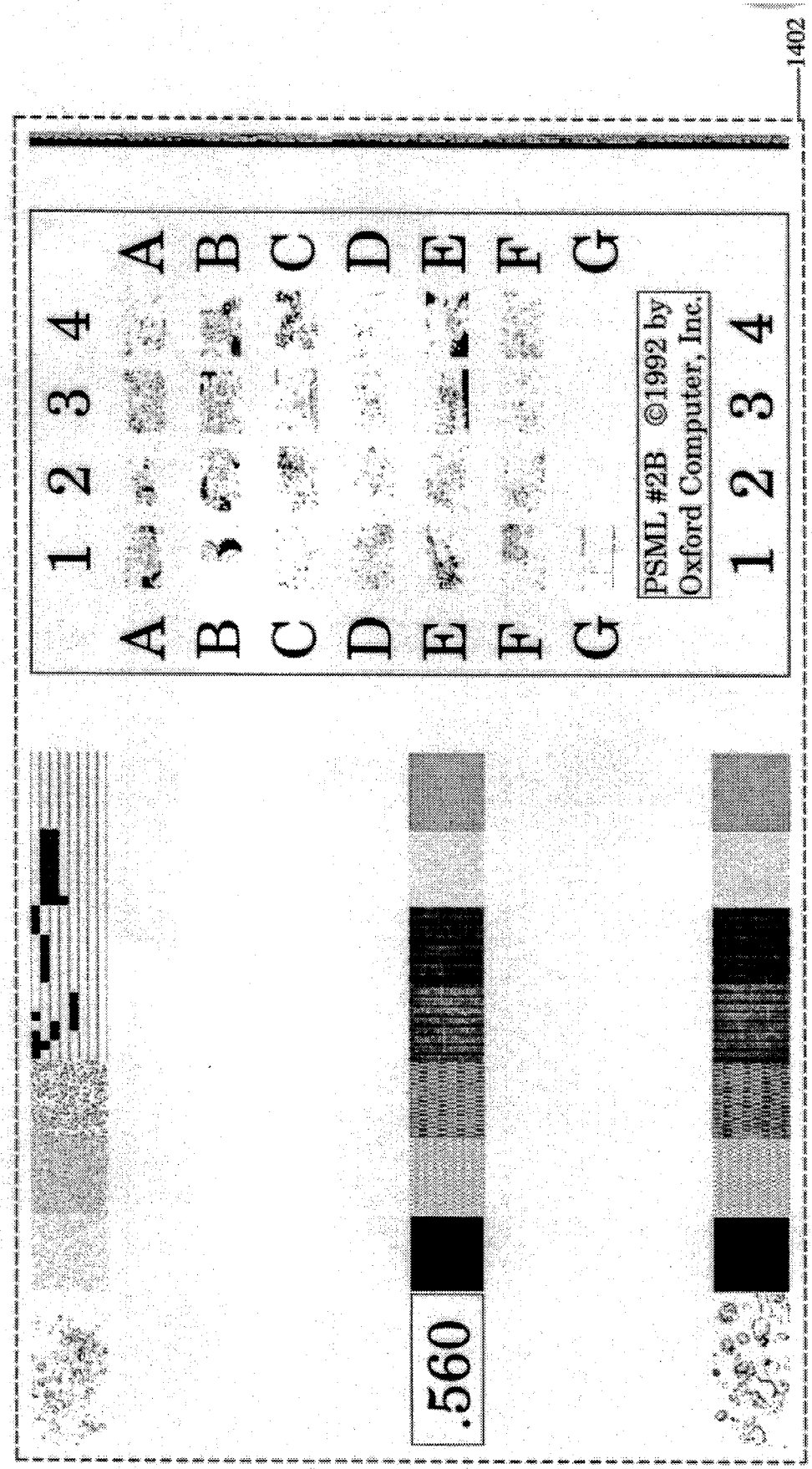
Figure 22:
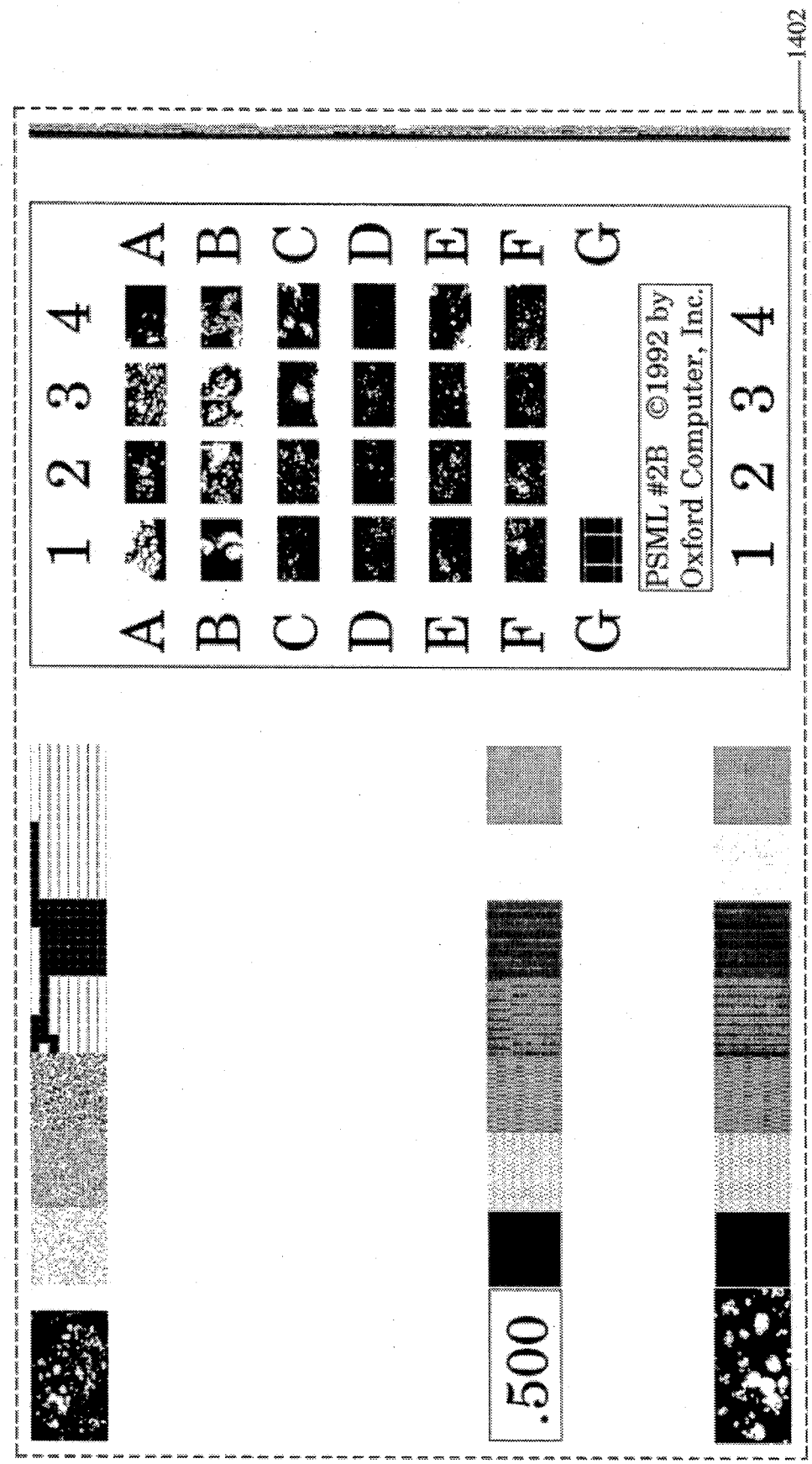
Figure 23:
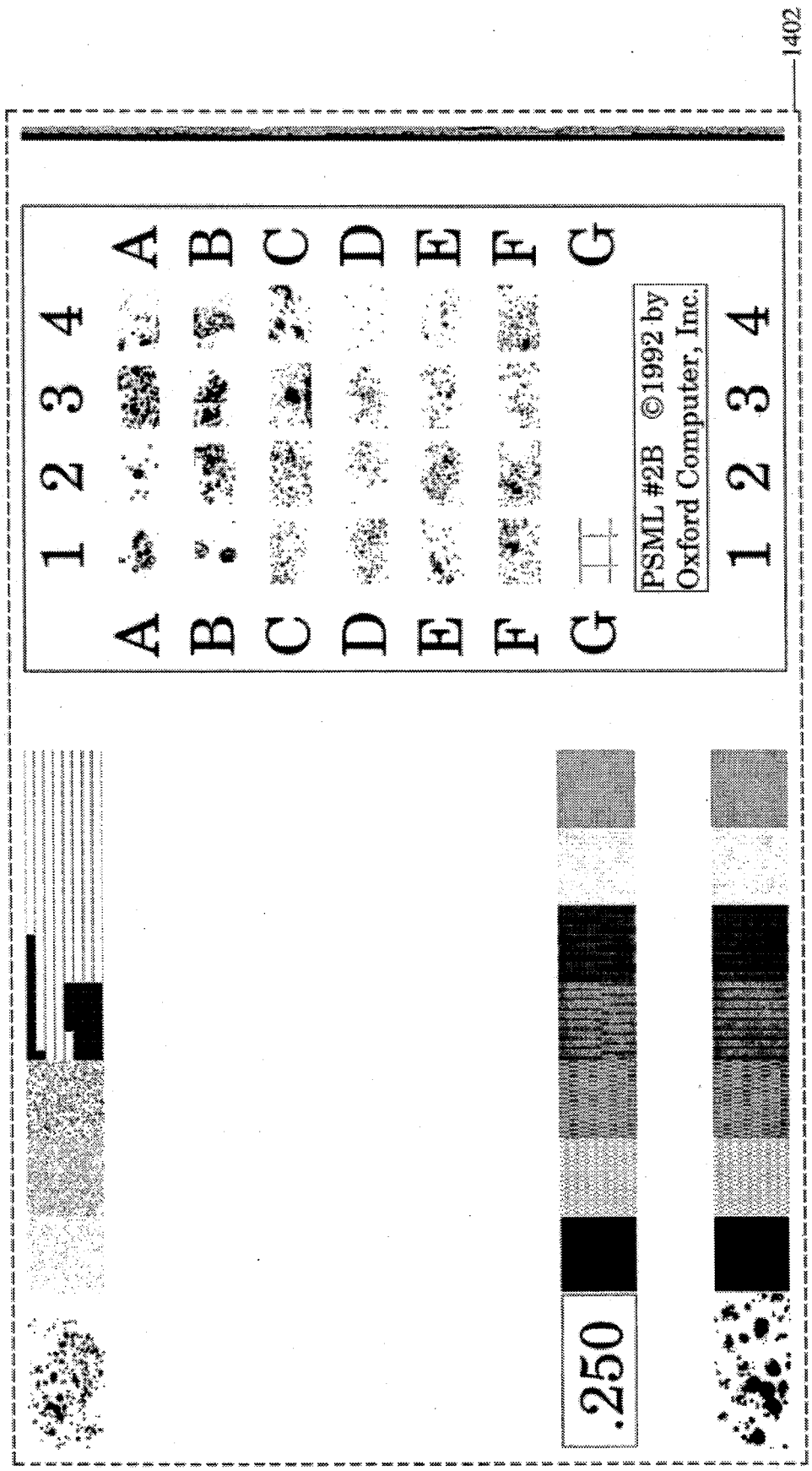
Figure 24:
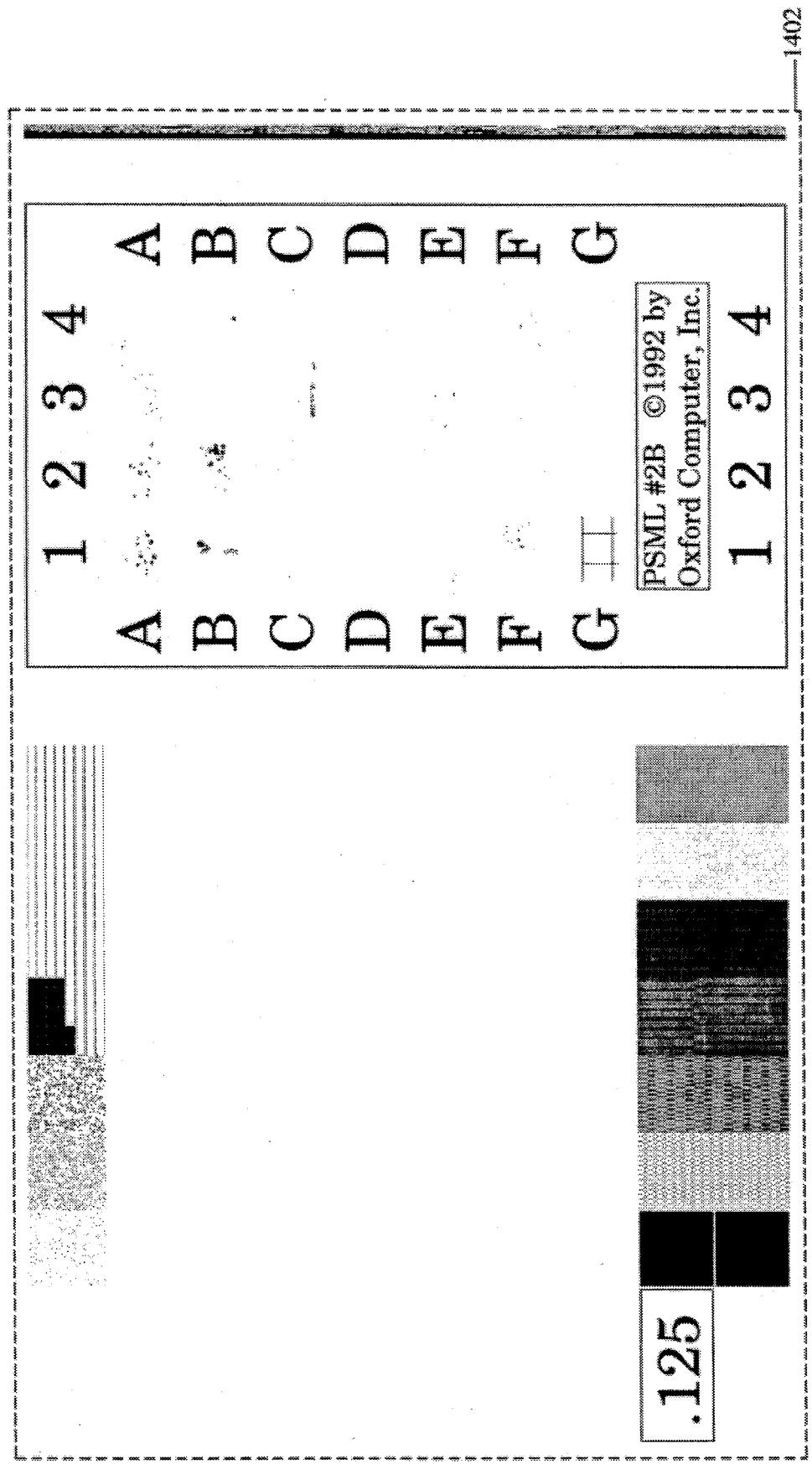

FIG. 16, Pap-Smear Micro Library #2B and Test Patterns in Gray-scale, shows the composite, gray-scale image formed from the masks given in FIGS. 17 to 24 using the teachings of this invention. The CRC field is not shown. Due to the high spatial resolution of the masks and the low spatial resolution of the printer used to create FIG. 16, aberrations in the figure occur, particularly in the test patterns, e.g., a high resolution checkerboard may appear as a low resolution checkerboard.

FIGS. 17 to 24, Mask Plot #1 to #8 for Pap-Smear Micro Library #2B and Test Patterns, show the masks to form the composite gray-scale image given in FIG. 16 using the teachings of this invention. Thin film remains on the plate wherever a mask is black. Due to the high spatial resolution of the masks and the low spatial resolution of the printer used to create FIGS. 17 to 24, aberrations in the figures occur, particularly in the test patterns e.g., a high resolution checkerboard may appear as a low resolution checkerboard.

FIG. 25, Graphic View of File Names Used to Build Pap-Smear Micro Library #2B, graphically depicts the file names used to form the composite image given in FIG. 16 and the masks in FIG. 17 to 24 using the teachings of this invention.

FIGS. 26 to 29, Pixel Input Values in Test Grid Sections #1 to #4, gives the target pixels values in Row 1, Columns 6 to 9 shown in FIG. 25. The target and achieved pixel values for this test grid are given in Appendix 4, Typical Pixel Translations. The periods ("...") on the left and/or right edge of a figure represent that the test grid continues in the direction of the periods.

Figure 30:
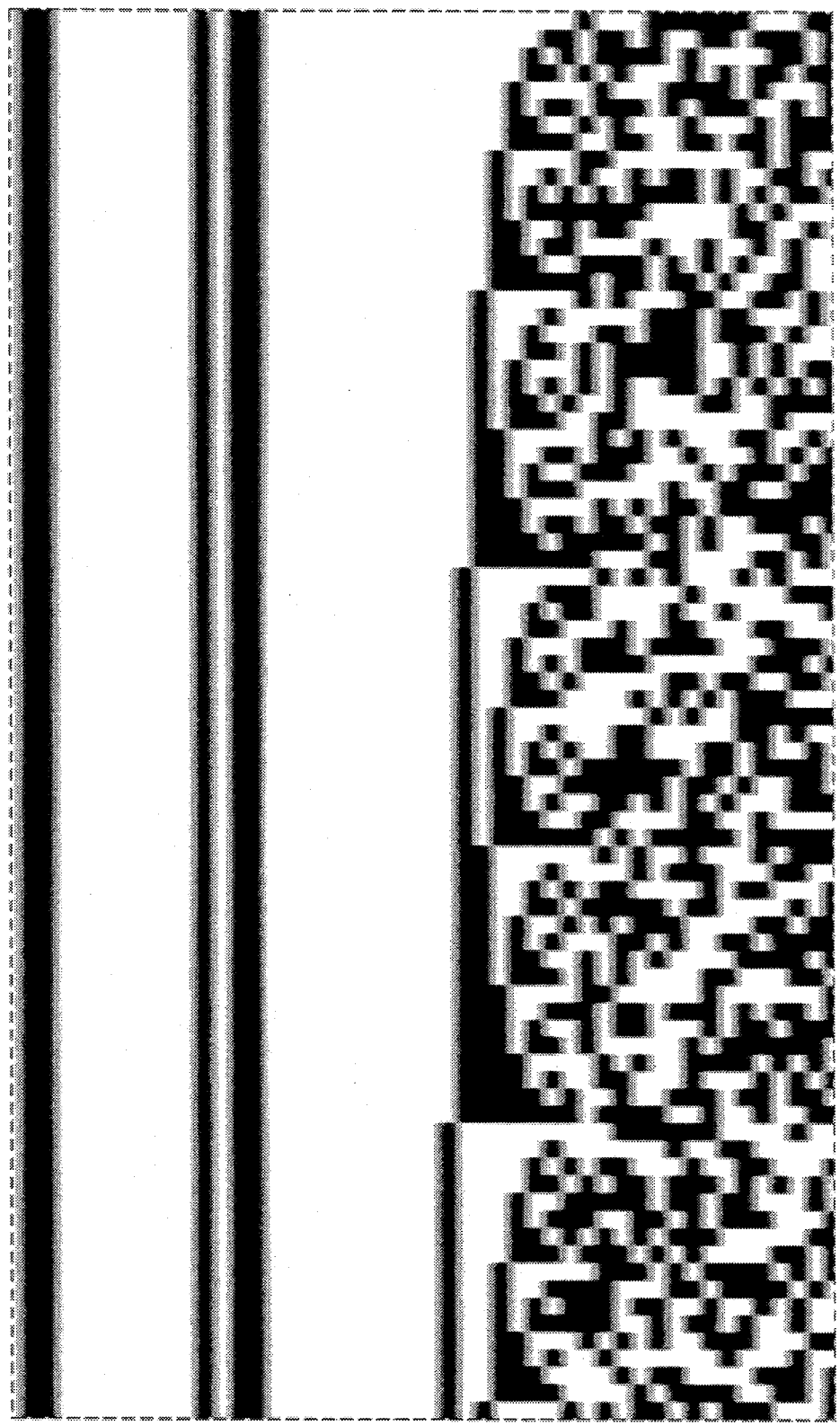

FIG. 30, Layer, Line and CRC Coding, gives a greatly enlarged view of an example of the novel method of the invention to append some pixels to the right edge of a mask to ensure the proper handling of the mask data.

FIG. 31, Text File Format for Automatically Making Mask Files, depicts the novel arrangement of multiple data fields and the multiple entries that are used in this invention to create complex mask files from multiple images.

6. DETAILED DESCRIPTION OF THE INVENTION

FIG. 1 is a simplified, exploded view of the masking and deposition steps used to create an optical device using the teachings of this invention. For consistency with the examples herein, eight masking-deposition steps are shown, but other numbers of steps many be used as well.

A substrate is shown as 100. Glass is commonly used for the substrate so that light may be shown through it and a transmissive image formed, but other materials, including opaque and translucent materials, and forms of illuminating radiation may also be used. (Photographic prints are reflective images, while photographic slides are transmissive images.)

In step #1, mask 102, which is typically made of photoresist and has at least one hole as 103 somewhere within it, is placed upon the substrate 100. A thin film 104 is deposited upon the face (the side upon which an image is being formed) of the plate (which is taken generally to mean the combination of a substrate with other materials as the mask 102), with some of the thin film traveling through the hole 103 and landing on the substrate. The mask and the thin film that landed upon it rather than passing through a hole in it and landing on the substrate, are then removed.

In step #2, mask 105, which has at least one hole as 106 somewhere within it, is placed upon the plate. A thin film 107 is deposited upon the plate, with some of the thin film traveling through the hole 106 and landing on the substrate or upon the thin film deposited in step #1. The mask and the thin film that landed upon it rather than passing through a hole in it are then removed.

The remaining masking, deposition and removal steps are then performed in a similar fashion to simultaneously form many optical devices having ultra high resolution and many shades.

A picture element, or pixel, is formed on the plate as 101. Many such pixels would be formed at the same time using the same set of masking and deposition steps, but for simplicity, only one pixel is shown in FIG. 1. The pixel is formed from the build-up of material deposited through holes in their respective masks, where all of the holes that are used to form each pixel must be precisely aligned with one another. In most cases, only a few of the masks would have a hole in them for any single pixel, but for simplicity, FIG. 1 shows holes in all of the masks as contributing to a single pixel 101.

Each of the deposition steps typically creates a thin (typically 50 to 300 Å thick) metal film with a different optical transmission. The depositions form many pixels, each composed of a thin film whose thickness is the sum of the thicknesses of the multiple thin film layers that passed through holes in masks to form that pixel, and whose optical transmission is the product of the transmissions of the individual contributing thin film layers. In contrast, a video monitor creates an image with active pixels that emit light and whose intensities add to increase brightness, whereas printed pixels are passive and multiply the intensity of incident radiation with factors of one (no deposition) or less, reducing brightness.

Removing the thin film that has landed on the photoresist, while leaving behind the thin film that has passed through the holes in the photoresist and landed on the substrate or upon previously deposited thin film, is a crucial step in the fabrication of the optical devices. This removal process is commonly known as liftoff.

The fabrication of optical devices is more sensitive to the quality of the liftoff process than semiconductor makers because the analog optical behavior, rather than the electrical behavior, of the devices is important. FIG. 2 is a cross sectional view (not to scale) showing the geometries involved. If one is unfortunate, then removing the photoresist and excess thin film damages the thin film that has landed on the substrate or previously deposited thin film, destroying the image. The thin film is typically porous to the solvent used, so the photoresist dissolves, setting the thin film upon it loose from the substrate.

In FIG. 2, the substrate is shown as 100, and the pixel being formed is shown as 101. The thickness of the pixel 101 may be the result of multiple deposition steps, and there may be other pixels adjacent to the one shown.

The photoresist or other material forming the mask is shown as 201. The thin film on the left side of the pixel is shown as 203, and the thin film on the fight side of the pixel is shown as 205. For an isolated pixel, photoresist would surround it. Thin films 203 and 205 would be deposited simultaneously. During lift-off, the thin film 203 would separate from the pixel 101 somewhere in the region shown by the circle 202, and the thin film 205 would separate from the pixel 101 somewhere in the region shown by the circle 206.

The key question is, where does the thin film separate from the pixel? Since the total thickness of all of the thin films forming the pixel 101 is very thin and the walls of a hole in the photoresist are presumably steep near the substrate, there should be almost no thin film connecting the pixel to the thin film on the top surface of the photoresist. Ideally, the thin film on the substrate is cleanly separated from the film on the photoresist.

6.1 Fabrication Example #1

A simple example of the masking and deposition steps is now given to explain how the printing process creates many shades of gray using a small number of masking and deposition steps. Thin films of Inconel, a chrome alloy, are used. Actual results from performing this fabrication example are reported herein.

Eight masking and deposition steps were used. A sixteen by sixteen checkerboard of all combinations of eight film thicknesses was made. The size of each test square was ¼" square so that its optical transmission could be measured easily since the spot size of the optical transmission test equipment used was 1/10" in diameter. The eight deposition test masks are shown in FIGS. 3 to 10. The hatched mask areas are actually solid so no thin film passes through them. Reference numbers relate to the eight masking and deposition steps shown in FIG. 1. The mask patterns given have been selected for simplicity and are not representative of the complex images that can be formed by the process.

For each masking and deposition step, a mask is formed on the substrate 100 using photoresist. Photoresist is placed on the entire plate, then is patterned and developed to form openings in it. A thin film is then deposited on the entire plate. The photoresist and the thin film that landed on it are then removed, leaving behind the thin film that landed on the bare substrate or upon previously deposited thin film.

Figure 3:
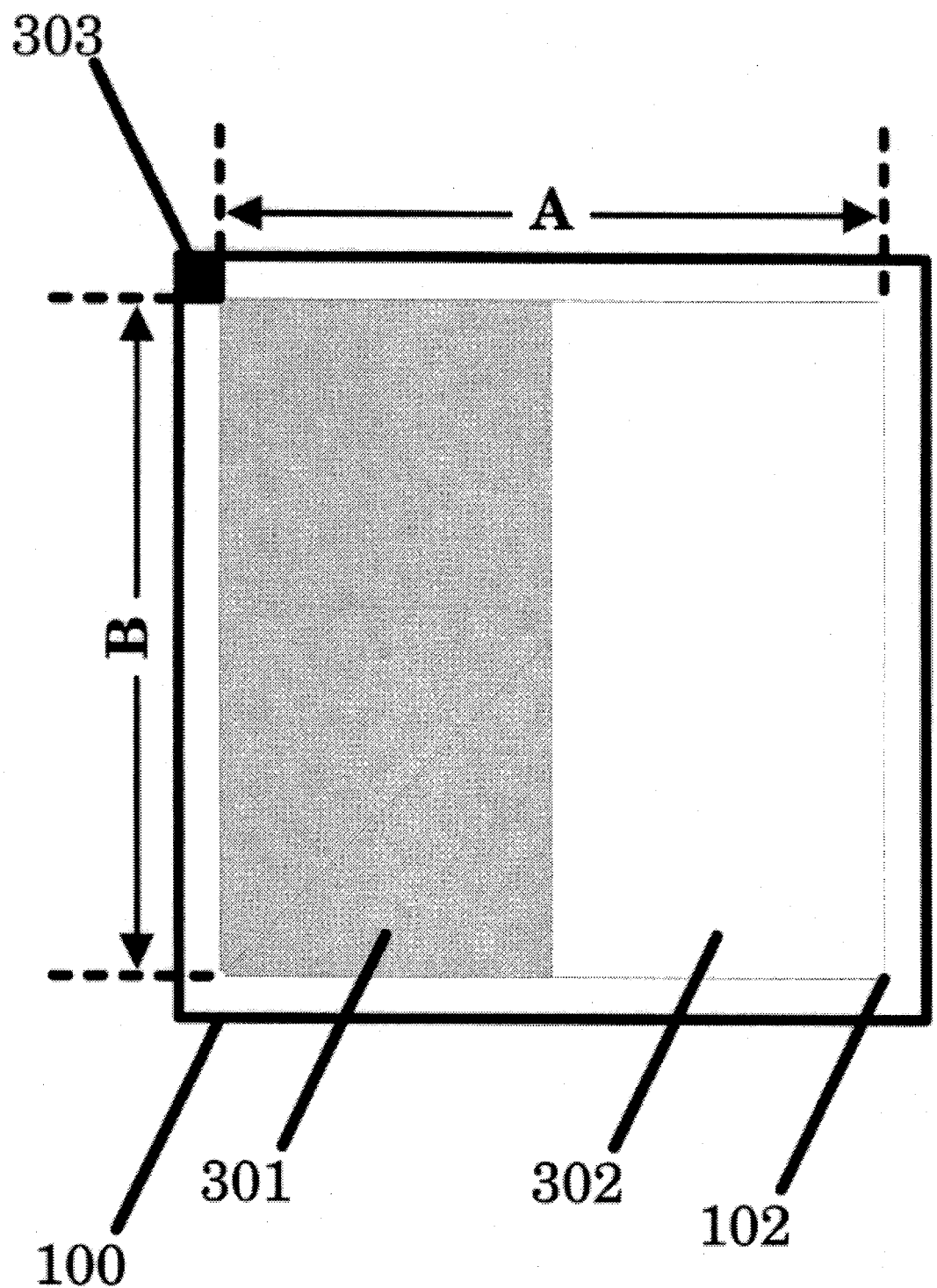

In FIG. 3, Fabrication Example #1 Mask #1, the substrate 100 has an area A wide by B high that is patterned with the mask 102. The area outside of the mask is not important. An orientation mark is given at 303, outside of the mask area. The mask 102 contains one vertical dark area 301, where photoresist remains, preventing the thin film from landing on the substrate, and one vertical open area 302, where an opening in the photoresist has been made, allowing the thin film to land on the substrate. This pattern, like the other patterns in this example, coats a total area equal to half of the A×B area with a thin film.

Figure 4:
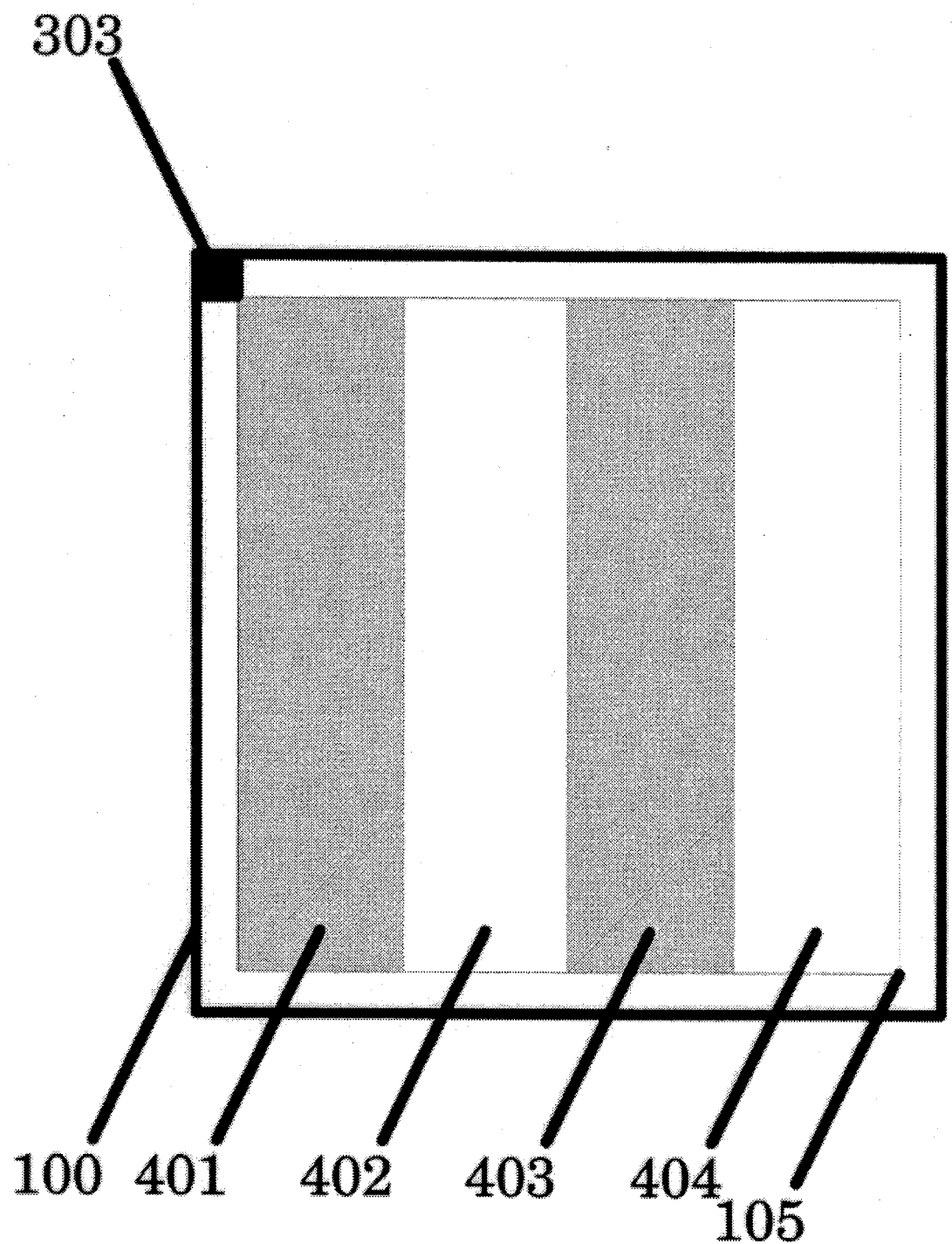

In FIG. 4, Fabrication Example #1 Mask #2, the substrate 100 has a mask 105 with two vertical open areas, 402 and 404, and two vertical areas, 401 and 403, that are blocked by photoresist.

Figure 5:
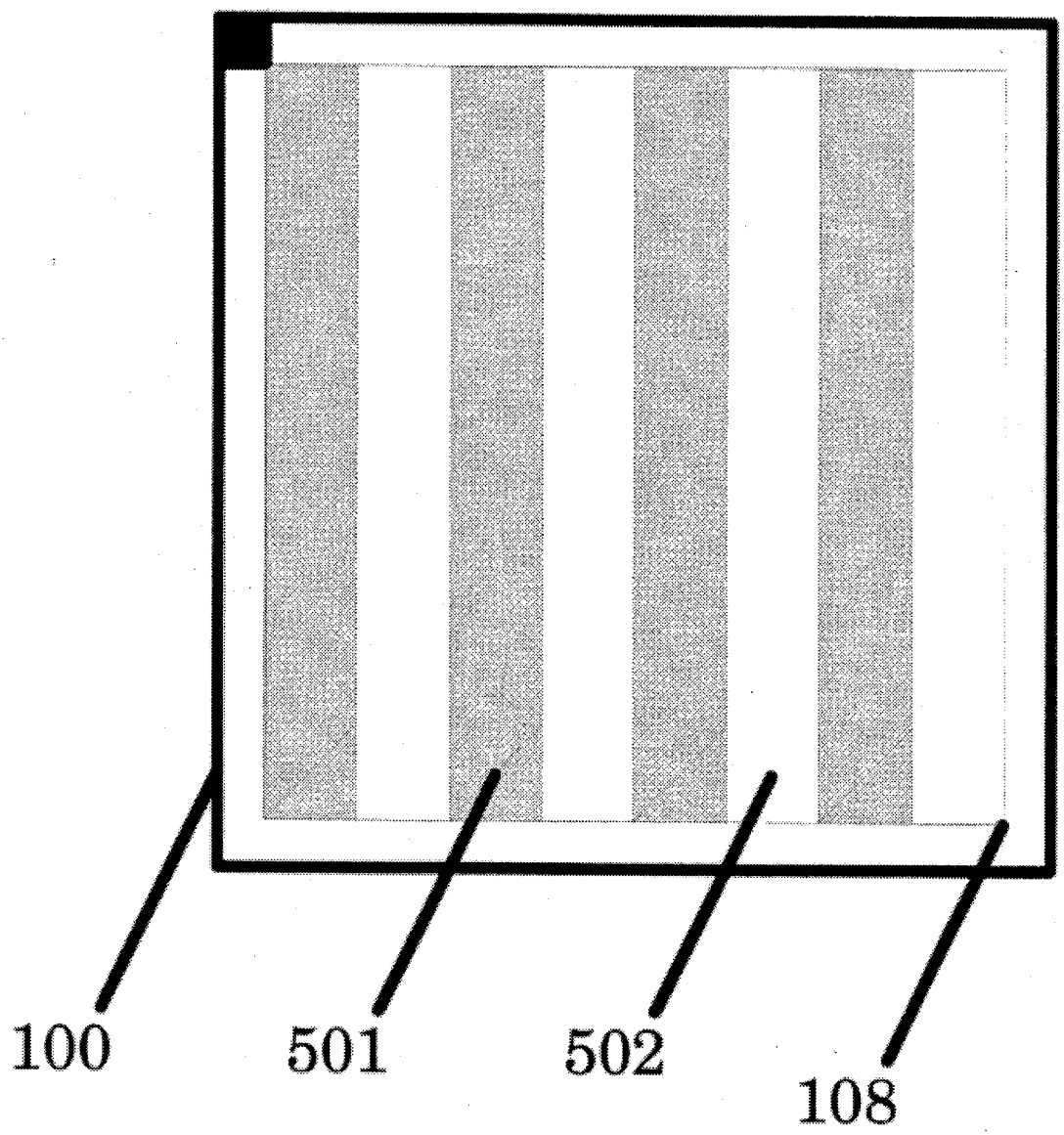

In FIG. 5, Fabrication Example #1 Mask #3, the substrate 100 has a mask 108 with four vertical open areas, as 502, and four vertical areas, as 501, that are blocked by photoresist.

Figure 6:
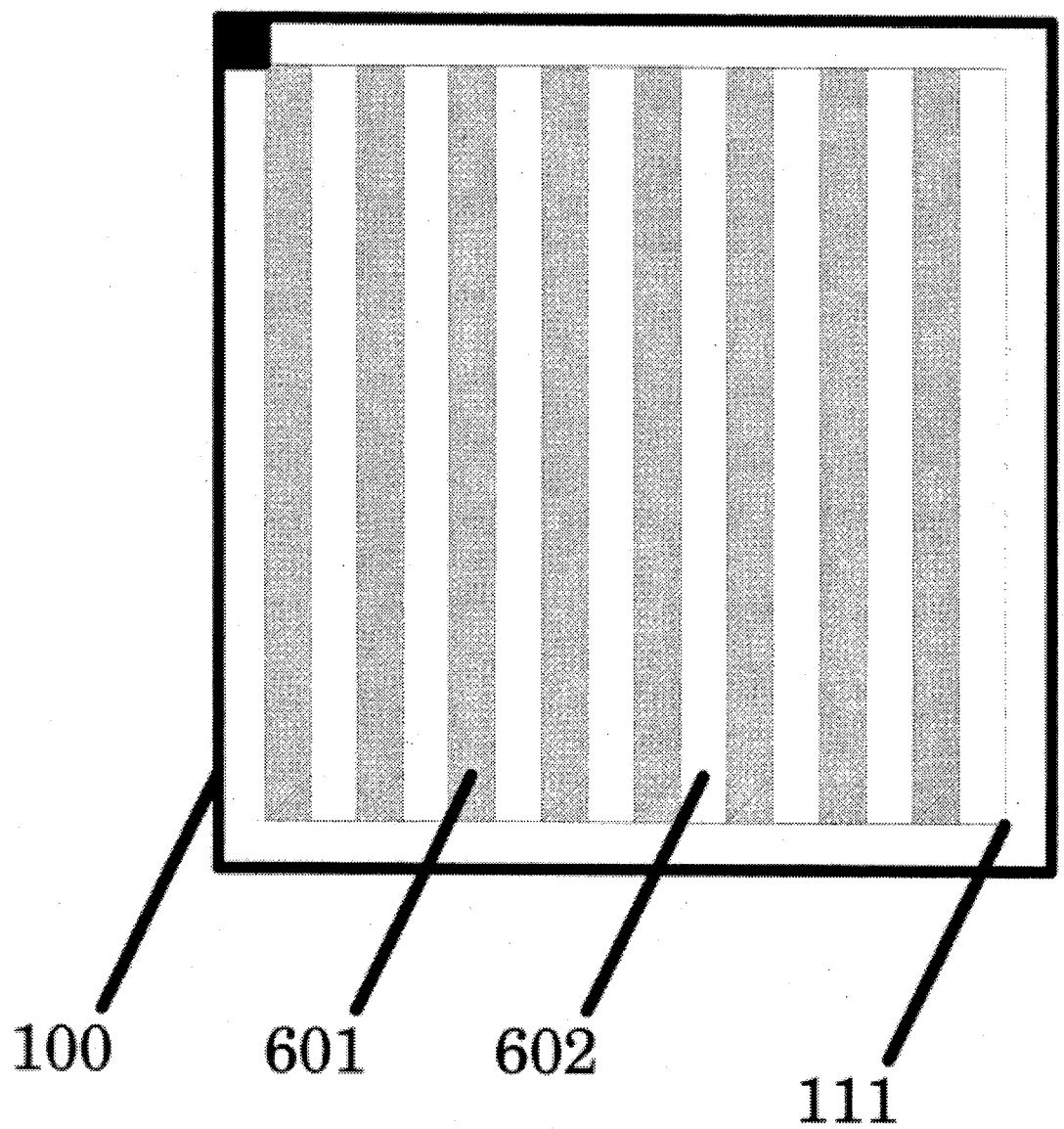

In FIG. 6, Fabrication Example #1 Mask #4, the substrate 100 has a mask 111 with eight vertical open areas, as 602, and eight vertical areas, as 601, that are blocked by photoresist.

Figure 7:
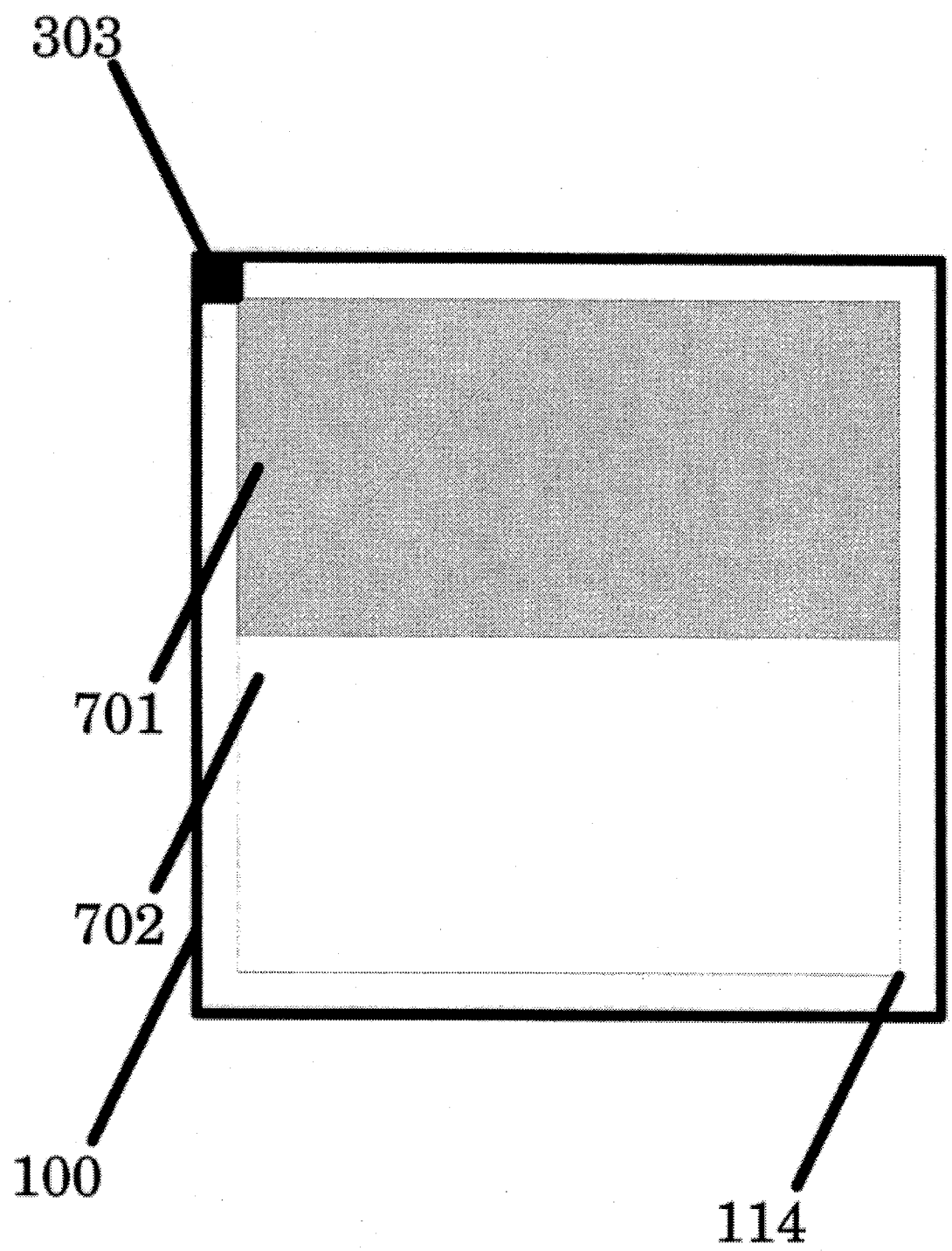

In FIG. 7, Fabrication Example #1 Mask #5, the substrate 100 has a mask 114 with one horizontal open area, 702, and one horizontal area, 701, that is blocked by photoresist.

Figure 8:
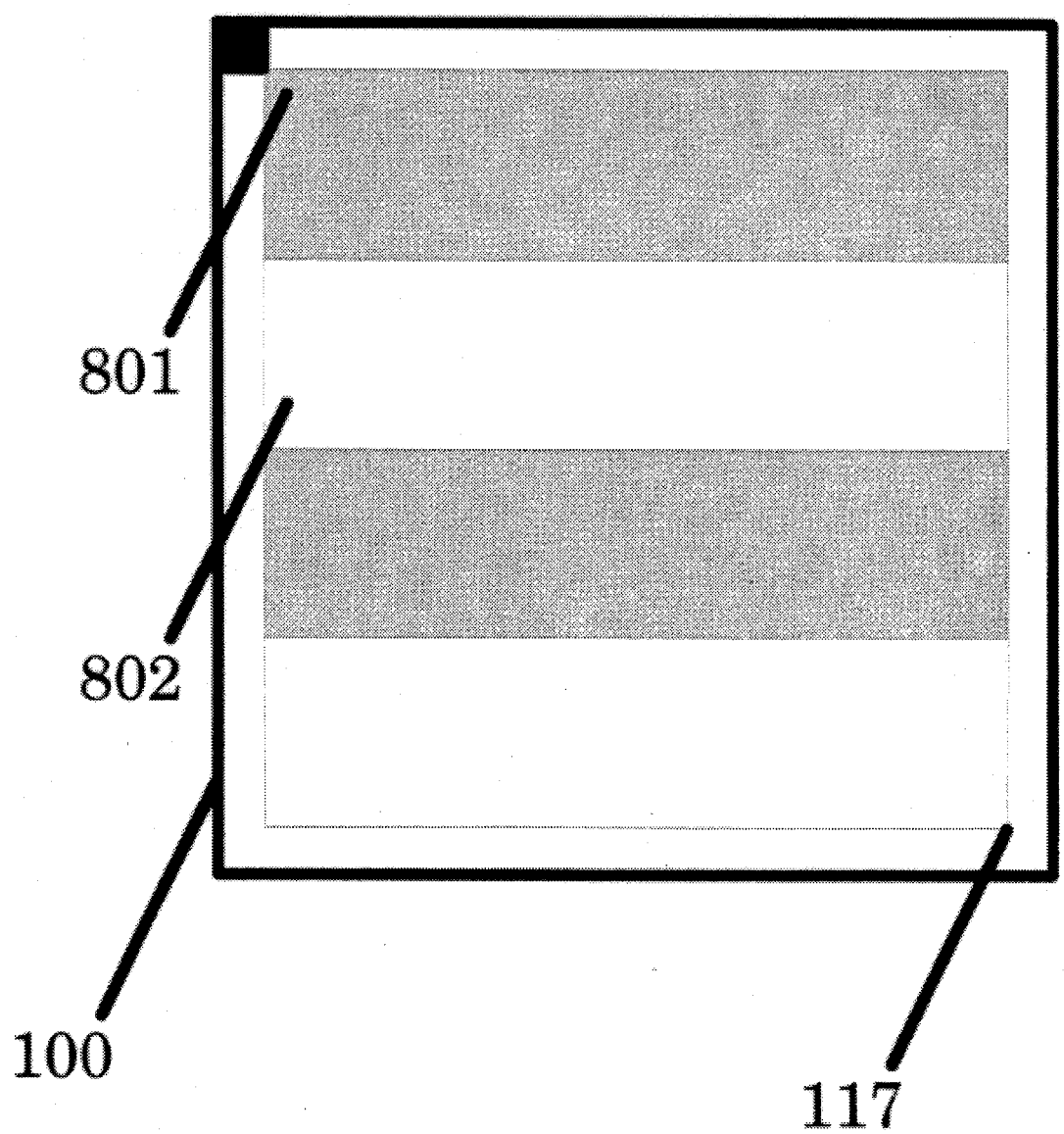

In FIG. 8, Fabrication Example #1 Mask #6, the substrate 100 has a mask 117 with two horizontal open areas, as 802, and two horizontal areas, as 801, that are blocked by photoresist.

Figure 9:
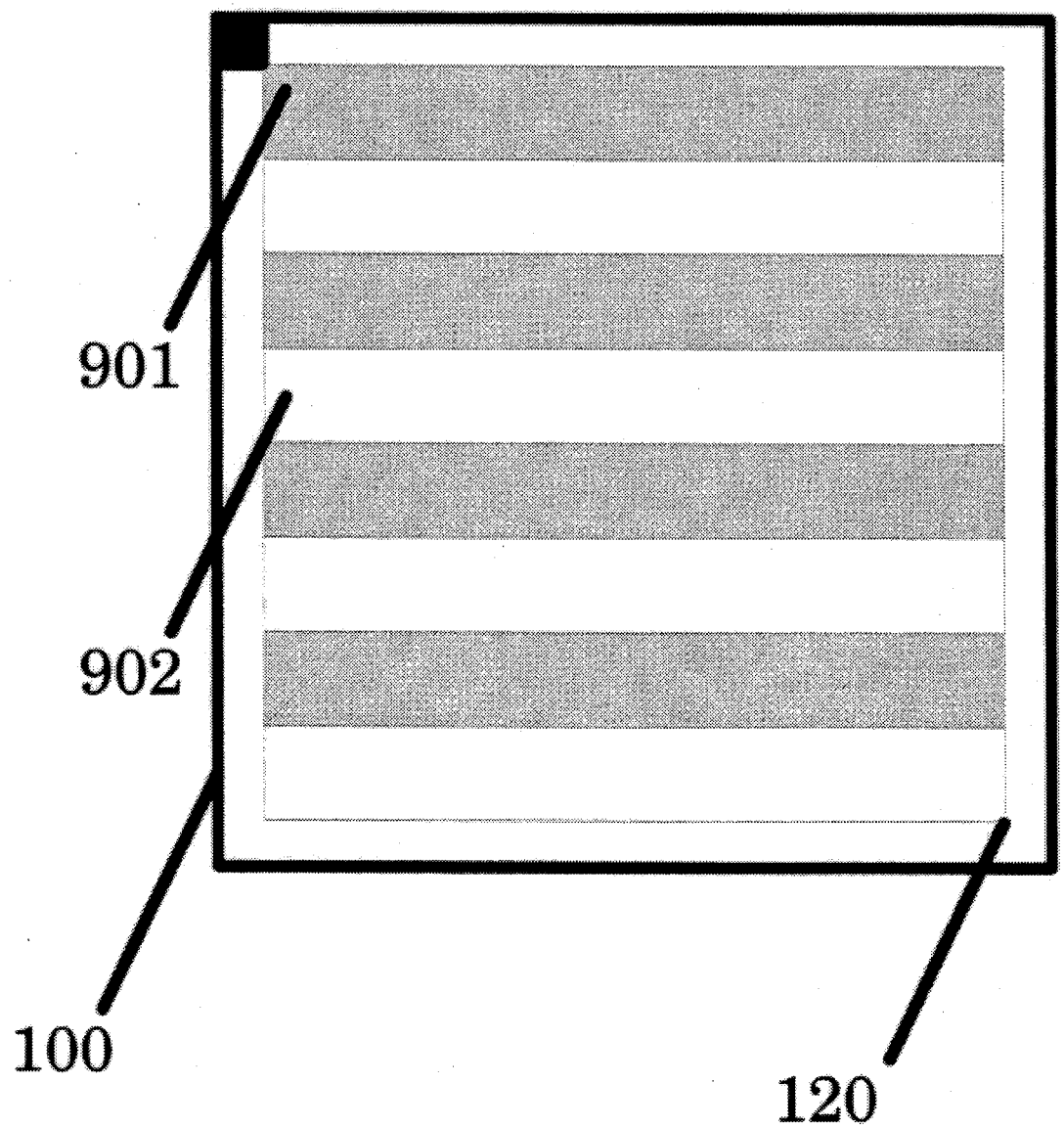

In FIG. 9, Fabrication Example #1 Mask #7, the substrate 100 has a mask 120 with four horizontal open areas, as 902, and four horizontal areas, as 901, that are blocked by photoresist.

Figure 10:
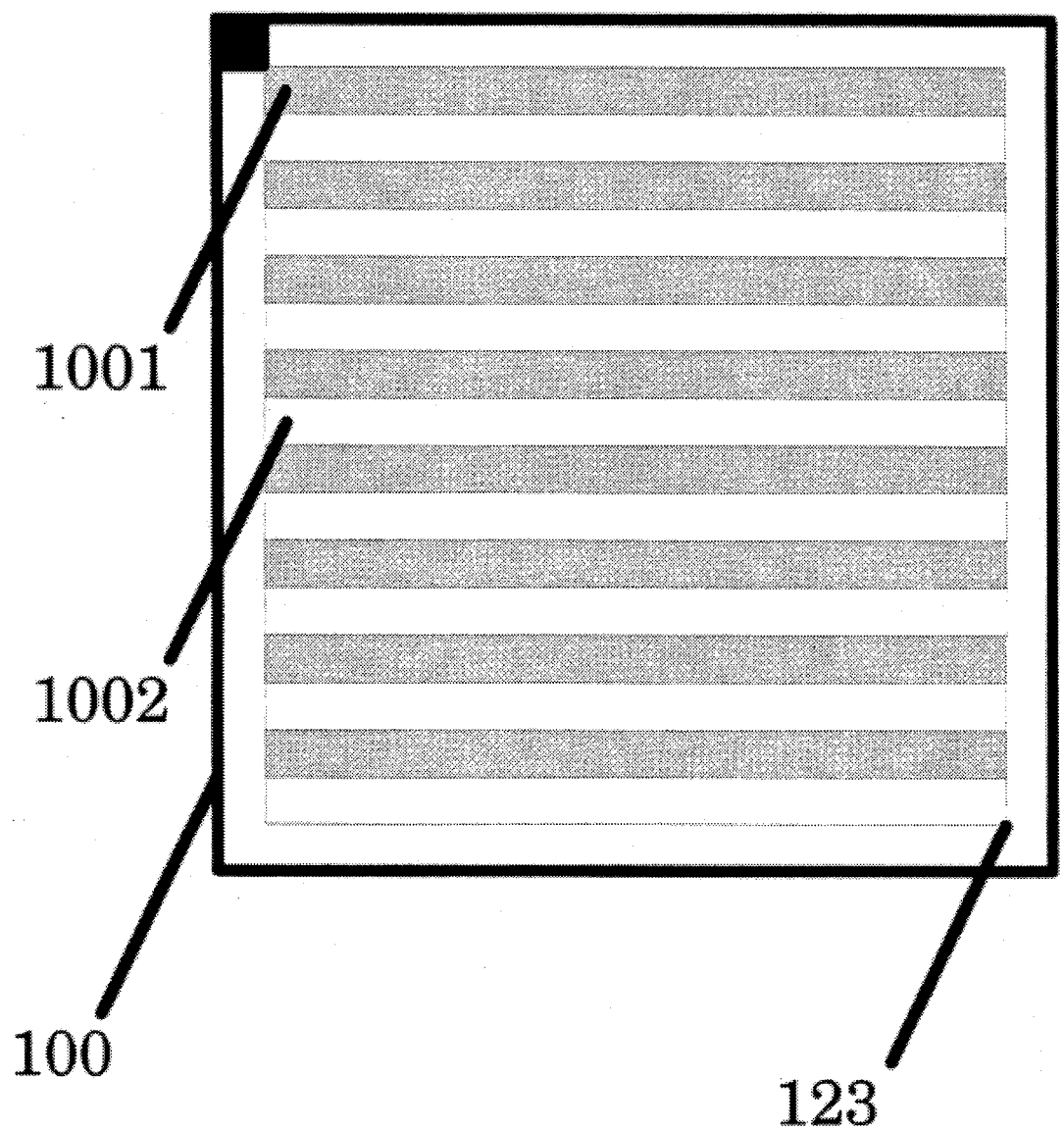

In FIG. 10, Fabrication Example #1 Mask #8, the substrate 100 has a mask 123 with eight horizontal open areas, as 1002, and eight horizontal areas, as 1001, that are blocked by photoresist.

To identify the 256 test areas created on the substrate 100 by the eight mask and deposition steps, the grid labels as 1 to 256 (not to be confused with the figure reference numbers) for Fabrication Example #1 are shown in FIG. 11. The test area identified as 1101 was protected by photoresist in all eight masking and deposition steps, so no thin film would be deposited on it, leaving a clear substrate. The test area identified as 1102 was not protected by photoresist in any of the eight masking and deposition steps, so it has the combined thin film from all eight deposition steps, leaving a greatly darkened substrate.

When these test patterns were actually fabricated, the eight thin film layers were deposited with optical transmissions of 1 minus X, rather than X, to test the robustness of the process. The values of X represent typical values for fabricating optical devices. In addition, relatively large (several percentage points) errors were made in depositing two of the eight thin film layers. However, once these errors were accounted for in the calculations of expected transmission, this test showed that a wide range of optical transmissions could be achieved accurately by depositing multiple layers of thin films on top of one another.

The number of thin film layers deposited onto the substrate itself or onto a previously deposited thin film layer in a test area, and thereby forming a pixel 101, is given in the table in Appendix 1. The boxes in the table identify the nine test areas having only zero or one thin film layers, so measuring the transmission of each of these test areas gives the transmission of the bare substrate and each single layer of thin film.

The measured transmission values for all of the test areas are shown in the table in Appendix 2 where the transmission of the test area (1101, square #1) with no deposition is normalized to 100% transmission (1.000). (The actual transmission of the bare substrate is 90% to 95%, but this is common to all test areas so it is normalized out.) As seen in Appendix 2, the thin film transmissions measured for the eight test areas having one thin film layer are as follows, where the Mask # is from FIGS. 3 to 10 and the Test Area # is from FIG. 11:

| Mask # | Test Area # | Transmission |
|---|---|---|
| 1 | 9 | 0.912 |
| 2 | 5 | 0.776 |
| 3 | 3 | 0.460 |
| 4 | 2 | 0.436 |
| 5 | 129 | 0.346 |
| 6 | 65 | 0.280 |
| 7 | 33 | 0.195 |
| 8 | 17 | 0.053 |

The errors in the measured transmission values are shown in the table in Appendix 3, where the expected transmissions have been computed based upon the measured transmissions of the single layer depositions. The expected transmission for each pixel is the mathematical product of all the measured transmissions of the individual thin films forming the pixel. Except for a few aberrations which may be due to measurement or transcription errors, excellent agreement is shown between the measured and expected values.

6.2 Fabrication Example #2

This example, which was also fabricated, demonstrates the formation of ultra high resolution images with small feature sizes (including the life-size images of cytology specimens), many shades of gray, and a small number of masking and deposition steps, using the teachings of the invention. As is immediately apparent to anyone skilled in the art, the many details of the example, such as the number, size, placement and graphical composition of devices, the number of mask and deposition layers, the size and composition of the substrate, the choice of material(s) deposited, the number, size and placement of alignment marks, may vary.

Two patterns were fabricated simultaneously, a set of test patterns and a life-size collection of images from cervical Pap smears, the latter forming a device known herein as *Pap Smear Micro Library #2B* (PSML#2B). While the pixel size used in Fabrication Example #1 was ¼ inch (6,250 μm) and could be obtained with rudimentary photolithography, the pixel size used in this example was 1 μm, requiring the use of the novel fabrication method given herein.

This example places nine rows of twenty columns of images on a 100 mm square quartz glass mask plate that is used as a substrate 100. Each column contains a pair of images, a set of test patterns and a *Pap Smear Micro Library*. Each finished image, when mechanically separated from the other images, forms an optical device. Such a glass plate is commonly used for making semiconductor masks and is initially covered with an optically dense layer of chrome in which a high contrast, binary mask image is formed.

A drawing of a patterned plate made in accordance with this invention is shown in FIG. 12. In this example, a portion 1203 of the plate, including the area 1202, has been cleared of chrome for creation of the optical devices in the area shown as 1202. The size of the area 1202 is 28 mm high by 95 mm wide. Chrome remains on the plate at 1201 and 1205. Alignment marks, also known as fiduciary marks or FID marks, are formed on the plate as 1200, 1204 and 1207.

The enlarged drawing of a typical alignment mark 1207 as is known in the art is shown in FIG. 13.

A dicing diagram of *Pap Smear Micro Library #2B* and the test patterns is shown in FIG. 14. The test patterns are shown as 1400, 1401 and 1403. A value, 0.560, uniquely identifying one of the deposition and masking steps, is shown at 1410; it would be deposited without any other thin films occupying its space. A *Pap Smear Micro Library #2B* is shown as 1402. A scan line and checksum (CKS) pattern is shown as 1404. Horizontal cutting lines are shown as 1405 and 1406, and vertical cutting lines are shown as 1407, 1408 and 1409, which are used for separating the images from one another. In many applications, the scan line and checksum pattern 1404 would be separated from the finished optical devices.

A single *Pap Smear Micro Library*, 1402, is shown mounted in the well 1502 of a microscope slide 1500 having dimensions A high by B wide. Dimension A is typically 75 mm and dimension B is typically 25 mm, although other sizes can also be used, and multiple optical devices can be mounted on a single substrate for ease of use. An optional cover glass 1504 is shown for protecting the optical device 1402 and giving a flat surface. Optical devices can also be affixed in a hole in a substrate, rather than being mounted in a recess in a substrate. Also, optical devices can be affixed to other devices.

The enlarged, composite, gray-scale image of *Pap Smear Micro Library #2B* and test patterns is shown in FIG. 16. The eight enlarged mask plots are shown in FIGS. 17 to 24, where a black area in a mask plot results in the formation of a hole in photoresist to form a deposition mask. (Note: Since there are large open areas in each mask plot, a twin-line border has been drawn around each mask plot to clearly delineate each mask plot. The border is spaced a small distance away from each mask plot.) Each mask plot is repeated over the plate to form a mask capable of building multiple optical devices. Once repeated, each of the eight mask plots corresponds to one of the eight masks shown in FIG. 1 as 102, 105, 108, 111, 114, 117, 120 and 123, although not necessarily in that order. For each mask, a thin-film of Inconel is deposited upon the plate, thereby passing through the holes in the photoresist and permanently darkening the substrate in the black areas shown in a mask plot. A different thickness of thin film is used with each mask, producing a different value of optical transmission for each layer. The irregular, narrow vertical stripe (not shown in FIG. 16) to the right of the *Pap Smear Micro Library* is line identification and checksum coding 1404, which is described in detail in a later section of this disclosure.

It should be realized that:

1. Gray-scale images print poorly on paper.
2. The fine detail in these images was undersampled by the 300 dpi printer that made them, giving aberrations, especially in the test patterns where fine checkerboards and lines are present, e.g., fine patterns print as large ones. Thus portions of the figures herein are not representative of the actual patterns obtained.

Note that the images were formed on a 100 mm square mask plate containing an anti-static layer. The anti-static layer is a thin (50 Å) metal (tantalum) film that is deposited directly upon the plate by the plate vendor. It provides a uniform conductor that drains off the e-beam, avoiding charge build-up and dislocation of the e-beam; it is normally used for making phase-shift masks. The combination of the bare substrate and this antistatic film has an optical transmission of about 85% that is fairly constant over the visible spectrum, ever so slightly darkening all of the images deposited upon it. (A bare quartz plate has a transmission of about 92%.)

Note also the unique annotation used in each mask plot. This annotation as 1410 identifies the mask layer and the required thin film optical transmission value to be achieved with that mask. This unique coding, which can be read from the patterned plate using low power magnification, ensures that if there is a mix-up in the handling of the plate and mask files, that the proper thickness and optical transmission of thin film will be used with the mask.

The transmission values and the sequence the masks were used to build *Pap Smear Micro Library #2B* are:

| FIG. # | Mask Plot # | Transmission | Sequence Used |
|--------|-------------|--------------|---------------|
| 17 | 1 | .890 (light film) | 8 |
| 18 | 2 | .792 | 7 |
| 19 | 3 | .705 | 6 |
| 20 | 4 | .631 | 5 |
| 21 | 5 | 560 | 4 |
| 22 | 6 | .500 | 3 |
| 23 | 7 | .250 | 2 |
| 24 | 8 | .125 (dark film) | 1 |

Each of these transmission values is normalized to the transmission of a clear, blank plate. To precisely control the optical transmission of a thin film being deposited, one can measure the transmission of a clear, blank plate which is undergoing the same deposition as a patterned plate and stop the deposition when the desired transmission value is achieved. It is expected that the optical transmission of the material being deposited upon the multiple plates is the same, and the transmission values of a clear, blank plate and the patterned plate are not significant. Since the transmission values of multiple thin film layers deposited upon one another are directly multiplicative so long as the deposition is uniform and there is no contamination or oxide growth between the thin film layers, every, spot on the patterned plate that retains the newly deposited thin film should have its transmission multiplied by the transmission value of that thin film layer.

Other numbers of layers with other transmission values for each layer could be used. In addition, if one can precisely control the optical transmission of a thin film without measuring the transmission during deposition, then a blind deposition step could be used.

FIG. 25 gives a graphic view of the file names used to build Pap Smear Micro Library #2B and its associated test patterns. The formation of the line identification and checksum (CKS) coding seen at the right edge of column 17 is given in a later section of this disclosure. For convenience, the devices were built using a uniform, 256 µm by 256 µm grid, which is shown by the light boxes in the figure and is reflected in the numbering of the 10 rows and 17 columns. Since the pixel size is 1 µm, the total number of gray-scale pixels fabricated is thus $256 \times 256 \times 10 \times 17 = 11,141,120$.

As indicated in FIG. 25, the fabrication of the subimages in columns 1 to 9 in rows #2 to #9 is layer-specific, i.e., only a single layer of thin film reaches the substrate in those areas. As explained earlier, this procedure enables one to see the effects of various thin film thicknesses and to identify the deposition required for a particular layer. The method for creating masks that have portions that are layer-specific is given in a later section of this disclosure.

6.3 Fabrication Process

For the preferred embodiment, an e-beam machine is used to write multiple copies of a set of patterns directly upon a single glass plate or other optically transmissive substrate (or plate) that, when diced, becomes the finished devices, rather than creating a series of masks on separate glass plates and using these masks to expose another glass plate that becomes the finished devices. The former method reduces costs when a relatively small number of devices is required, while the latter method reduces costs when a large number of devices is required. Both methods are described and covered by this invention.

6.3.1 Preferred Embodiment

For the preferred embodiment, the fabrication process is described by the following steps. Note that the sequence of steps 1 and 2 is not important.

Step 1—Prepare Mask Files

Using the method described herein, one or more natural and/or artificial images to be reproduced are created or otherwise obtained and placed in a format suitable for manipulation by a computer, and the graphic design for a device containing the image(s) is made. The graphic design is converted to one or more mask files, where each mask file defines openings/masks through which a material with a particular optical transmissivity can be deposited onto a plate to create an image.

Step 2—Substrate Preparation

First, a commercially available, fused silica (quartz) substrate (plate) or other optically transmissive substrate is obtained with these specifications:

a. very flat, e.g., 2 μm flatness b. one side of the bare quartz is coated with a very thin, antistatic (conductive) film c. the antistatic film is covered with an optically dense material such as chrome d. the chrome is coated with photoresist (or other material that can be activated by an e-beam)

Such a plate is often used for making phase-shift masks for manufacturing integrated circuits. Optical devices will be fabricated on the side of the plate having the antistatic film.

Second, using an e-beam machine such as an Etec Manufacturing Electron Beam Exposure System (MEBES), expose alignment/fiducial (FID) marks on the plate and expose an area in the plate where the optical devices will be formed. Sufficient alignment marks are required so that a series of patterns/masks may be precisely aligned with one another on the plate to form the optical devices. Conventional e-beam exposure techniques may be used.

Third, using conventional techniques, develop the photoresist to remove the portions of the photoresist that have been activated by exposure to the e-beam. (The logical inverse of this procedure can also be used.)

Fourth, using conventional techniques, etch the plate to remove the chrome that has been exposed by selective removal of the photoresist in the previous step. This etching clears the chrome from a region where the optical devices will be formed, and forms the FID marks.

Fifth, using conventional techniques, remove all remaining photoresist.

Step 3—Repetitive Patterning and Deposition

For each mask layer:

a. Apply a uniform coating of photoresist to the plate. Holes will be made in the photoresist after exposure to an e-beam and the exposed plate is developed. Typically, the application of an e-beam to the plate causes a chemical reaction in the photoresist, and the photoresist so exposed will later be removed. (The logical inverse of this procedure can also be used.) The e-beam current is removed from the plate via the antistatic film, avoiding the build-up of electric charges on the face of the plate.

b. Precisely align the e-beam machine to the FID marks so that successive masks will be precisely registered with one another, and apply multiple copies of a binary image pattern (mask) to the resist in the portion of the plate that does not contain chrome. A different mask is used for each layer. Periodically recheck and correct the alignment during the application of the many copies.

c. Develop the photoresist to remove the portions of the photoresist from the plate where the photoresist was exposed to the e-beam. Then, if necessary, place additional photoresist over the FID marks since the photoresist over them may have been exposed during alignment.

d. Place a uniform, thin film of optically transmissive material such as Inconel on the plate on the side bearing the patterned photoresist. Each layer of the thin film is typically only 50 to 300 Å thick to achieve a low optical density. A different thickness of thin film is used with each mask, giving a different optical transmission for each thin film layer. The placing of such a thin material on the plate is typically performed by evaporation in a vacuum chamber. If a vacuum chamber is used, it must be vented in such a way to minimize the growth of unwanted materials upon the plate after the evaporation is complete. Such venting may require placing nitrogen in the chamber and then air.

e. Place the plate in a wash containing a mild, photoresist-dissolving solution so that the photoresist dissolves and is carried away, allowing the thin film that has been deposited upon the photoresist to be lifted off (removed) along with the photoresist, being careful not to damage the thin film that has been deposited upon the plate or upon previously deposited metal film. This also removes the metal film that was deposited on the photoresist over the FID marks.

Step 4—Apply Protective Film

Optionally, apply a protective material such as silicon dioxide to the optical devices formed thus far.

Step 5—Dicing

Using conventional techniques, separate the finished optical devices from one another, being careful not to damage them. A dicing saw, which is widely using in the semiconductor industry, is typically used. A temporary., protective coveting on the devices may be used if required.

Step 6—Thinning

Optionally, using conventional techniques such as polishing of the unpatterned side of the plate, reduce the thickness of the optical devices to facilitate packaging them.

Step 7—Packaging

Optionally, for ease of handling and use, using the teachings of this invention, attach each optical device to another device or an optically transmissive substrate such as a microscope slide. An optically transmissive adhesive may be used, or the optical device may be affixed to the substrate in some other way such as welding. One or more optical devices can be attached to a single substrate.

6.3.2 Alternative Embodiment

The dominant manufacturing cost in the preferred embodiment of the manufacturing method is the patterning of a plate using an e-beam machine. If a large number of like optical devices is required, then the following alternative method may be used. Note that the sequence of steps 1, 2 and 3 is not important.

Step 1—Prepare Mask Files (as before)

Step 2—Substrate Preparation

First, a substrate is obtained with these specifications:

a. very flat, e.g., 2 μm flatness b. one side of the plate is covered with a dense material such as chrome c. the chrome is coated with photoresist Optical devices will be fabricated on the side of the plate having the chrome. This plate is the device plate.

Second, alignment/fiducial (FID) marks and an area in the plate where the optical devices will be formed are exposed. Sufficient alignment marks are required so that a series of patterns/masks may be precisely aligned with one another on the plate to form the optical devices. Alternative methods for forming the alignment marks may be used.

Third, develop the photoresist.

Fourth, etch the plate to remove the chrome that has been exposed by selective removal of the photoresist in the previous step. This etching clears the chrome from a region where the optical devices will be formed, and forms the FID marks.

Fifth, remove all remaining photoresist.

Step 3—Mask Plate Making

A plate containing a mask pattern is created. A different plate is typically created for each mask pattern. The portion of a mask that creates a single optical device may be larger than the size of the finished optical device if optical reduction is used when the mask is used to expose the plate bearing the optical devices. These plates are the mask plates.

Step 4—Repetitive Patterning and Deposition

For each mask layer:

a. Apply a uniform coating of photoresist to the device plate. Holes will be made in the photoresist after exposure and developing.

b. Precisely align an exposure machine to the FD marks on the device plate so that successive masks will be precisely registered with one another, and, using one of the mask plates, apply one or more copies of a binary image pattern (mask) to the resist in the device plate. A different mask is used for each layer.

c. Develop the photoresist to remove the portions of the photoresist from the device plate where the photoresist was exposed to the exposure machine.

d. Place a uniform, thin film of material on the device plate on the side bearing the patterned photoresist.

e. Place the device plate in a wash containing a mild, photoresist-dissolving solution so that the photoresist dissolves. Remove the thin film that has been deposited upon the photoresist being careful not to damage the thin film that has been deposited upon the substrate or upon previously deposited thin film. This also removes the thin film that was deposited on the photoresist over the FID marks.

Step 5—Apply Protective Film (as before)

Step 6—Dicing (as before)

Step 7—Thinning (as before)

Step 8—Packaging (as before)

6.4 Method for Selecting Number and Densities of Thin-film Layers

This section addresses the production of as good a quality of image as possible as inexpensively as possible. It derives from the observation that a lot of detail is present in the dark shades of the images in the cell nuclei, whereas relatively little data is present in the bright areas of the specimens.

Producing a transmissive image is quite different from producing an image on a video screen. On a video screen, one starts with a black image (the screen is off) and adds brightness. In a transmissive image, one starts with a white image (uniform incident light is present) and adds darkness. While brightness adds, darkness multiplies.

With brightness, eight brightness levels that are in the binary sequence 1, 2, 4, 8, 16, 32, 64, 128 give 256 brightness levels from 0 to 255 in steps of 1 when summed in all combinations. With darkness, eight transmission levels in the inverse binary sequence $1/1, 1/2, 1/4, 1/8, 1/16, 1/32, 1/64$ and $1/128$ give transmission values of 100%, 50%, 25%, 12.5% to $(4 \times 10^{-7})\%$ when multiplied in all combinations—which is useless since the resolution is much too coarse and most of the combinations are far too dark.

In Fabrication Examples #1 and #2, eight mask and deposition steps were used because eight-bit resolution is common in additive images and the manufacturing cost was acceptable. Other numbers of steps can be used to obtain higher quality images, a different distribution of shades, and/or lower cost.

To manufacture the highest quality, transmissive image with the fewest manufacturing steps and the fewest layers on top of one another to form individual pixels, the following novel method can be used:

Step 1. Select the total number of thin film layers desired.

Step 2. Determine the dynamic range of transmissions and distribution of shades desired.

Step 3. Compute a set of layer transmission values where the set is divided into two groups, the shared values and the unique values, where the number of shared values, minus 1 for the 1.000 shared value layer, plus the number, N, of unique values, minus 1 for the 1.000 unique value layer, equals the total number of layers desired.

The shared values, which can be thought of as exponents in scientific notation, where "^" signifies "to the power", are:

$C0=1.000$, $C1=2^{-A}$, $C2=C1^2$, $C3=C1^3$, etc., where A is in the range 0 to 1.

Using the equation, $C1 \times k^N = 1.000$, the unique values, which can be thought of as fractions in scientific notation, span the range from C1 to 1.000 and are:

$U1=C1 \times k^1$, where $k=(1/C1)^{(1/N)}$, $U2=C1 \times k^2$, $U3=C1 \times k^3$, etc., up to a maximum value of 1.000

Step 4. Determine the maximum number of thin film layers that is to be deposited upon one another to form a single pixel. This number is typically less than the total number of thin film layers to improve manufacturing yield.

Step 5. Compute a set of composite transmission values. First, multiply each of the unique values by each of the shared values. Second, multiply each of the unique values by all pairs of the shared values. Third, multiply each of the unique values by all triplets of the shared values. Continue this process until all combinations of the shared values have been used. Fourth, to achieve very dark values, compute the product of all of the shared values and multiple unique values.

Step 6. Compare the transmission values achieved to the transmission values required. If the results are not sufficient, go to Step 3, changing the distribution of layers into unique values and shared values, and/or the value of "A".

This procedure gives a set of transmission values that resemble a floating-point representation. Several thin film layers give an exponent, or scale factor, and the other layers give a fraction or mantissa. The mantissa values are chosen to have a constant proportional difference in optical transmission, rather than a fixed increment, from one transmission value to the next.

Alternatively, a set of shared values can be chosen using the method described above, and a set of unique values having fixed increments can be used with them.

For example, the parameters used in Fabrication Example #2 (*Pap Smear Micro Library #2B*) are:

A=1

Total number of mask and deposition layers=8

Shared transmission values (exponent):

$C0=1.00=0.500^{\wedge}=$clear (no deposition or mask required)

C1=0.500^1

C2=0.250=0.500^2

C3=0.125=500^3

Unique transmission values (fraction):

U6=1.000=C1×k^6=clear (no deposition or mask required)

U5=0.890=C1×k^5

U4=0.792=C1×k^4

U3=0.705=C1×k^3

U2=0.631=C1×k^2

U1=0.560=C1×k^1 where k=2^(1/6)=1.122

As previously explained herein, these transmission values are achieved by depositing different thicknesses of thin films. One of the unique values is combined with any number (typically 0, 1 or 2) of the shared values. The full set of resulting values, and the errors they introduce, are given in Appendix 4, Pixel Translations Used in Fabrication Example #2.

Fabrication Example #2 includes a 256-pixel test grid that shows the use of the pixel translations. The test grid is organized as 16 pixels high by 64 pixels wide, and is located in Row 1 and Columns 6 to 9 of FIG. 25. The test grid is organized as follows:

| FIG. # | File Name | PixelIn Values | Column # |
| --- | --- | --- | --- |
| 26 | gra8×8_0 | 0 to 63 | 6 |
| 27 | gra8×8_1 | 64 to 127 | 7 |
| 28 | gra8×8_2 | 128 to 191 | 8 |
| 29 | gra8×8_3 | 192 to 255 | 9 |

The relationship between a mask plot and the mask code given in Appendix 4 in the Translation(PixelIn) column is:

| Mask # | Transmission Value | Type | Binary Bit in Mask Code |
| --- | --- | --- | --- |
| 1 | .890 | Unique | oooo,oooX |
| 2 | .792 | Unique | oooo,ooXo |
| 3 | .705 | Unique | oooo,oXoo |
| 4 | .631 | Unique | oooo,Xooo |
| 5 | .560 | Unique | oooX,oooo |
| 6 | .500 | Shared | ooXo,oooo |
| 7 | .250 | Shared | oXoo,oooo |
| 8 | .125 | Shared | Xooo,oooo |

From FIGS. 26 to 29 one obtains the Pixel Input (PixelIn) value for any test area in the test grid. By careful inspection of the mask plots in FIGS. 17 to 24, one can see that a test area in the test grid in a given mask plot is black if the binary bit for the value of PixelIn corresponding to that test area and that mask is a "0" in the Translation(PixelIn) column given in Appendix 4.

As a further example of the selection of the number of mask layers and transmission values, to increase the resolution of the unique values, the following values may be used:

A=0.5

Total number of mask and deposition layers=8

Shared transmission values (exponent):

C0=1.000=0.707^0=clear (no deposition or no mask required)

C1=0.707^1

C2=0.500=0.707^2

C3=0.354=0.707^3

Unique transmission values (fraction):

U6=1.000=C1×k^=clear (no deposition or mask required)

U5=0.944=C1×k^5

U4=0.891=C1×k^4

U3=0.841=C1×k^3

U2=0.794=C1×k^2

U1=0.749=C1×k^1, where k=1.414^(1/6)=1.059

6.5 Additional Fabrication Details 6.5.1 Patterning

An Etec *Manufacturing Electron Beam Exposure System* (MEBES), or e-beam machine, was used to create the deposition masks used to build the *Pap Smear Micro Library*. The e-beam machine moves an e-beam over a small portion of a glass plate similar to the way an e-beam is moved over the screen of a video display. A potential of 15 to 20 thousand volts is placed on the plate to attract the e-beam to the plate, and the e-beam is swept over a very small portion of the plate using a magnetic field. The e-beam is rapidly turned on and off as it moves to create a pattern in photoresist that has been placed on the plate.

For *Pap Smear Micro Library #2B* with 1 μm pixels, the area of the plate scanned in one sweep of the e-beam is 1 e-beam pixel wide (0.25 μm) by 1024 e-beam pixels long (256 μm) and takes 25 microseconds. For the photoresist used, a chemical reaction occurs in the photoresist wherever the e-beam strikes it. When the photoresist is developed, it is removed wherever it was contacted by the e-beam, leaving a hole in the photoresist through which a thin metal film is later deposited onto the plate.

In comparison, in a video display, the intensity of the e-beam is varied over a wide range to give a gray scale rather than being on or off. The e-beam is swept both horizontally and vertically over the entire screen of the video display rather than just covering a tiny area. The energy of the e-beam causes different phosphors on the video display to emit various colors of light wherever they are energized by the e-beam, rather than causing a chemical reaction in a photoresist.

In the e-beam machine, the plate is moved continuously as it is scanned by the e-beam. Successive scans are adjacent to one another. The extent of the movement during one scan period is one e-beam pixel, or 0.25 μm in this case. This movement causes an imperceptible tilt in the image created. Through many sweeps of the e-beam, a relatively large section of the plate can be exposed. The maximum size depends upon the amount of pattern memory in the e-beam machine. In the e-beam machine used, there was a capacity of 32 megabytes which gives a maximum area, or stripe, of 256 μm high by 65,536 μm wide with 0.25 μm e-beam pixels. This stripe is repeated over the plate wherever it is needed so that a given portion of the pattern only has to be loaded into the pattern memory once.

If one wants to expose an area higher than 256 μm (*Pap Smear Micro Library #2B* is 2,560 μm high), then different stripes are placed adjacent to one another. Since this placement relies upon the proper mechanical positioning of the plate beneath the e-beam, some alignment errors occur in butting the two stripes. These errors can cause trouble in some devices such as image sensors.

The design of *Pap Smear Micro Library #2B* was based upon grids (like a checkerboard) that were each 256 μm square. Each specimen image is about 200 μm wide by 160 μm high and is placed in the center of a grid. This image size is the field of view of a 35 mm slide taken through a microscope at 200× magnification. A background shade (white) surrounds each specimen image. Thus there is nothing where one stripe butts another, except for the black border around the perimeter of the *Pap Smear Micro Library*.

To use smaller pixel sizes or larger specimen images, a specimen image will span multiple stripes. To minimize the effect of stripe alignment errors, one can use techniques that have been developed for building image sensors. The intensity of the e-beam can be controlled to feather the edges of adjacent stripes together, although this increases writing time. Alternatively, other types of e-beam machines can be used.

6.5.2 Photoresist Selection

A typical photoresist for implementing the printing method is AZ 1350J. Upon developing, a hole is made in the photoresist wherever the photoresist is exposed to an e-beam. For use with the e-beam machine the thickness of the photoresist is 5000±50 Å and the photoresist should be applied in such a fashion that no fringes are formed on the plate. This thickness is fine for a minimum pixel size of 1 µm, as used in *Pap Smear Micro Library #2B*, but a thinner photoresist should be used for smaller pixels to increase the definition of the pixels and to minimize the shadowing of the pixel by the walls of a hole in the photoresist during thin film application.

The intensity distribution of an e-beam is gaussian, so the shape of the volume of photoresist that is exposed as the e-beam travels through the photoresist to a conducting film is circular with sloping sidewalls, with the top surface of a hole being larger than the bottom surface. Thus the smaller the features are, the thinner the photoresist must be to avoid having adjacent pixels distort the shape of one another.

A 4:1 or other ratio of the size of pixel to the size of the e-beam can be used to improve the squareness of each pixel. Thus with a 1/am pixel, an e-beam spot size of about 0.25 µm can be used. This scale factor appeared in the database used to drive the e-beam machine, for it had sixteen (4×4) times as many pixels as the mask file.

6.5.3 Substrate Selection

In many applications, extremely clear glass is needed so that it imparts no color to the images. Because of the amount of handling of the substrate required to build the devices described herein, a relatively thick, 1.5 mm, glass substrate was chosen to minimize the chance of breakage during fabrication.

The substrate also needs to be extremely flat so that the photolithography gives good results. A common flatness, ±2 µm over the entire surface, that is commonly used for making e-beam masks may be used. The glass is in fact fused silica (quartz) that is extremely pure and clear.

The problem with using clear glass is that one cannot record alignment marks upon it. The alignment marks must be precise within the accuracy of an e-beam, about 0.1 µm or less, so it is risky to record a pattern in photoresist and then evaporate a metal film upon it to define the alignment marks.

A solution is to use a common mask plate, which is coated with chrome and photoresist. To make a mask for making semiconductors, a pattern and fiduciary (alignment) marks are written in the photoresist. The alignment marks are used for aligning successive masks to a wafer upon which integrated circuits are being built. In the preferred embodiment of the invention, where the plate is the substrate, one use the fiduciary marks to align the e-beam machine to the same plate multiple times if the alignment marks are protected from deposition.

The problem is that one needs to build optical devices on glass, not on chrome. The chrome must thus be removed from the area where one wants to fabricate the optical devices. The e-beam can be used to define a clear area at the same time as we are making the fiduciary marks. To reduce costs in volume production, one can remove the chrome using simple photolithography.

Unfortunately, with the chrome removed, the plate becomes an insulator. Since the e-beam is a current, charge builds up on the plate and grossly deflects the beam, destroying the ability to make a pattern. A solution is to use a plate that has an antistatic film—a tough, thin metal film that is deposited directly on the quartz. Such plates are used for making phase-shift masks that are used to build extremely fine features for building integrated circuits. Such masks require several exposure steps, like the optical devices described herein. The antistatic film is extremely thin and gives a nearly imperceptible reduction in the optical transmissivity of the plate. It is not removed when the chrome is etched from the plate.

6.5.4 Thin-film Deposition

The invention requires the creation of thin films of material to give particular values of optical transmission. To achieve a fine gray scale, some of the layers are only tens of angstroms thick if a metallic compound such as Inconel is used. By so doing, fifty to a hundred or more, resolvable gray scale levels can be created using only a small number of mask and deposition steps.

Due to variations in deposition rate using limited process controls, one cannot deposit for predetermined periods of time and reliably obtain the transmission values desired for each layer. Instead, one can deposit on two or more plates simultaneously, or set aside an area for testing on a single plate. One plate is for transmission test purposes only and is commonly called a witness plate. The other plate bears the optical devices being made. A beam of light is shown through an initially clear portion of the witness plate during the entire deposition process for a layer, with the starting transmission being calibrated as 100%. When the desired transmission through the witness plate is reached as the thin film is deposited, the deposition process is stopped.

Since the transmission of a very thin film changes when the deposition chamber is vented, the target transmission value is modified slightly based upon experience so that the resulting transmission value is as near the target value as possible. Naturally, manufacturing variations occur. These manufacturing variations can be modeled as a part of the method described herein for creating masks for building optical devices.

The physical configuration of an evaporation chamber is that a quantity of metal is heated at the bottom of the chamber to its boiling point. The plates are placed upside down above the boiling metal on a platform that rotates slowly to increase the uniformity of the deposition. Multiple plates can be processed at the same time. The metal atoms travel upward in all directions from the boiling pot toward the plate and through the holes in the photoresist. A shutter is placed between the plates and the boiling metal to quickly stop the evaporation when a desired optical transmission value is reached. Since the photoresist is so thin and the metal source is relatively distant from the plate, there is presumably negligible shadowing of the plate by the walls of the holes in the photoresist.

Other techniques for applying a thin film to a substrate include sputtering and jet spray. This disclosure refers generally to the creation of a thin film, regardless of the actual technique, as deposition.

6.5.5 Mask Alignment

Most masks for making semiconductors with small feature sizes are made by writing a binary pattern in chrome on a quartz plate. Chrome is used to give a sharp, high-contrast distinction between the presence or the absence of a graphic element. Except for the creation of phase-shift masks, which involve multiple patterning steps using an e-beam, no alignment of the pattern to the plate is required since there is only one layer of patterns on the plate. The plate is then used as a tool in making the semiconductors, and it can be used many times since it is not consumed in the process.

In the preferred embodiment of the invention, the plate is consumed in the process of making the optical devices since it forms the substrate for them. In addition, since a multilayer patterning and deposition process is used, successive patterns must be precisely aligned with one another. The registration should be a small fraction of the size of a pixel so that the effect of an alignment error is minimal. As a practical matter, e-beam machines commonly have a registration accuracy of about 0.1 μm over the entire plate, which is 10% of a 1.0 μm pixel and 20% of a 0.5 μm pixel.

To obtain such high registration accuracy, it is common to write three registration marks on a plate. The fiduciary (FID) marks are written in the chrome that is on the initial plate. The e-beam machine can then read the FID marks through the photoresist during the writing of a mask upon the plate so that successive layers of patterns are aligned with one another. To ensure accuracy, the FID marks are frequently reread during the patterning process. Since rereading the FID marks slowly exposes the photoresist over them, a small amount of additional photoresist or other protective material should be placed over the FID marks immediately before deposition to protect them.

6.5.6 Creation of Reflective Images

As is apparent to one skilled in the art, the novel methods disclosed herein can be applied to the creation of non-transmissive images as well as to the creation of transmissive images.

6.5.7 Creation of Color Images

Neutral gray (black and white), transmissive images are created if a spectrally neutral material such as Inconel is used for forming the thin films, and if there is no dielectric between the thin film layers. Color images can be formed by using spectrally-selective materials for forming the thin films, and/or by forming interference filters among the image layers. As is known in the art, an interference filter can be formed by placing a thin metallic film on either side of a dielectric layer, and multiple interference filters can be used on top of one another to achieve various colors.

6.5.8 Creation of Three-dimensional Images

Since the printing method described herein produces very thin images, three-dimensional images can be created by fabricating multiple images that are spaced apart. The printing method is:

1. fabricate a shaded image as earlier described
2. place a mask on the shaded image where one wants to vary the color
3. place a spacing layer, such as silicon dioxide, upon the shaded image, rather than depositing a metal film
4. fabricate a shaded image upon the spacing layer, aligning the images to give the three-dimensional effect desired
5. repeat steps 2 to 4 as required to add more depth to the image

6.5.9 Correction of Manufacturing Errors

Sometimes a layer will be deposited too light or too dark. Rather than discarding the plate, the preciseness with which masks are aligned enables one to repair the plate.

If a layer is too light, an additional mask and deposition step can be done. The mask for the defective layer can be precisely placed on the plate a second time and another deposition made. The optical transmission of the additional deposition should be chosen so that the combination of it with the original layer gives the proper transmission value.

If a layer is too dark, an additional mask and deposition step can also be done. In this case a new mask must be created that exposes all of the pixels that are too light, i.e., it exposes the pixels that are not in the defective layer. This new mask is precisely placed on the plate and another deposition made. This darkens all of the pixels that are light relative to the pixels using the layer that is too dark. The optical transmission of the additional deposition should be chosen to restore the proper ratios of optical transmission values between the various layers.

6.6 Method for Defining Bit-Mapped Mask Files

The images of multiple specimens must be combined together to create a collection of life-size images such as *Pap Smear Micro Library #2B*. Depending upon the number of images and the number of pixels in each image, plus the amount of annotation used, one may need to manipulate tens of millions of gray-scale pixels to form the mask files for building the optical devices.

Combining the images is just one of the data processing steps for building optical devices. The full set of novel data processing steps for building optical devices as disclosed herein is:

1. digitize each image
2. create test patterns using a test pattern generation program we wrote
3. create labeling images using a graphics editor
4. write a text file that defines the placements of the many images in the device
5. assemble multiple images into a single device and convert to mask format
6. send the mask files to the e-beam mask fabricator by modem or other means
7. convert the mask files to an e-beam format
8. build the optical device using the e-beam mask files These many steps gave many opportunities for data translation and transmission errors.

To solve the problems of combining many images, converting the combined images into a format suitable for mask fabrication, ensuring the proper fabrication of the devices, and ensuring the integrity of the data, two novel procedures were developed. The first enables one to write a concise list of commands that defines all of the images that are to be combined, defines the placements of the images in the optical device, and combines all of the images automatically. The second defines a file format for storing, viewing and ensuring the integrity of the mask files.

6.6.1 Method for Combining Image Files

The method for combining automatically combining image fries to make bit-mapped mask files is:

Step 1. Write a text file that identifies all of the images to be combined, the placements of those images in the optical device in one or more bands or stripes, and which thin-film layers are to be used for each image Step 2. Execute the text file and verify the existence of the input files Step 3. Using image placement data from the text file, verify that the images do not overlap one another Step 4. Using parameters about the output pixel coding method desired and the number of layers desired, create a pixel translation table that converts input pixel values to output mask codes Step 5. Optionally produce a script file identifying the mask files for automatically transferring the mask files to a mask fabricator Step 6. For each stripe:
a. open the input files used in the stripe
b. open the output files used in the stripe, optionally merging the stripes together
c. place the names of the output files in the script file
d. for each scan line in the composite image:
 1. merge the input files used in the current scan line, placing each image at the proper place in the scan line and padding with the background shade if necessary
 2. convert the input pixel values to output mask codes using the pixel translation table
 3. for each mask layer and each pixel, select and output the proper data from the mask codes For example, the file names used to build *Pap-Smear Micro Library #2B* are given graphically in FIG. 25 to show their positions relative to one another. The Figure shows the test pattern file names and specimen image file names in a series of grids. Each grid is 256×256 pixels, or 256×256 µm since the pixel size is 1 µm. The right-most column is labeled CKS, which is where checksum information is automatically placed by our software to ensure the correctness of the data handling. Including the CKS columns, the device is built in 10 rows, or stripes, high by 17 columns wide, for a total size of 2,560 µm high by 4,352 µm wide. The test patterns are cut off from the *Pap Smear Micro Library* during plate dicing.

The text file for automatically creating the eight mask files for *Pap Smear Micro Library #2B* is given in Appendix 6. Such a text file can be created using an ASCII text editor. Annotations have been prefixed by a semicolon to explain the operation of the text file. The general text file format for automatically making mask files is given in FIG. 31.

The use of the novel text file format given in FIG. 31 to automatically create bit-mapped mask files is as follows:

A complex, bit-mapped mask file as shown graphically in FIGS. 17 to 24 is constructed as a series of bands or stripes as shown in FIG. 25. In these figures the stripes are horizontal, but they can be vertical. One or more stripes is used depending upon the amount of memory in the mask-making machine, where the number of stripes is chosen to minimize the amount of time required to fabricate the masks.

As shown in FIG. 31, there is a block of text as 3100, 3106 and 3112 that describes each stripe that is to be created. The first line as 3101 of text in a block gives the X,Y coordinates of the stripe in the overall mask. All coordinates are measured in pixels. For simplicity is assumed that the coordinates must be positive. Each stripe is located at a different, non-overlapping position in the overall mask. The coordinates for the first stripe, Stripe(1), are shown as Stripe(1)_X, in the first column or field, and Stripe(1)_Y, in the second column or field. Commas are shown as delimiters between fields, but any suitable delimiter can be used. For ease of discussion, FIG. 31 shows fixed-width fields, but variable width fields can be used as well.

The directory path and base name of the mask files that are to be created are given in the third field of the first entry 3101 as path/Stripe(1)_name. For ease of discussion, it is assumed that all image and mask files use the ".pcx" file extension. Since each layer requires a different mask file, a set of mask files is created using the base name. For example, using the text file in Appendix 6, the first entry there is given as 0, 0, psml-2b\PSML2B-. This creates the following paths and mask files in the default directory which one selects as the root directory for all files:

psml-2b\PSML2B-1.pcx
psml-2b\PSML2B-2.pcx
psml-2b\PSML2B-3.pcx
psml-2b\PSML2B-4.pcx
psml-2b\PSML2B-5.pcx
psml-2b\PSML2B-6.pcx
psml-2b\PSML2B-7.pcx
psml-2b\PSML2B-8.pcx The limitations of the MS-DOS 5.0 operating system have been assumed, in which case file names are limited to eight characters and file extensions are limited to three characters, but this is not fundamental and is not a limitation to the method given herein.

The next field gives optional parameters in square brackets as to provide room for possible extensions of the format.

The next line 3101 gives the X,Y relative coordinates for the first image, Image(1,1), as Image(1,1)_X in the first column or field, and Image(1,1)_Y, in the second column or field. These X,Y coordinates are relative to the coordinates of the stripe the image is being placed in. The next field gives the path and file name as path\Image(1,1)_name for the first image file. The next field gives optional parameters in square brackets as that describe which masks the image is to be placed in.

In most cases, one wants to fabricate an image as accurately as possible, in which case data about the image should be allowed to appear in as many masks as possible—presumably all of them. If no options are specified for an image file, then all masks are used. However, for the purposes of making test patterns, as shown in rows 2 to 9 and columns 1 to 9 in FIG. 25, it is useful to be able to limit which masks are used. One can thus create a totally black image and cause it to be printed to a specific layer, testing the performance of that one layer. As shown in the example in Appendix 6, Stripe #2 has the first eight images files with the "−1" option that restricts the printing of those images to mask #1. In general, the option selects which mask(s) the image is to be written to.

As many images as required are listed in the block 3100, terminating with the last one 3104. The next line 3 105 marks the end of the stripe by giving the X,Y size of the stripe. The first field gives the width of the stripe as Stripe(1)_Xsize in the first field and the height of the stripe as Stripe(1)_Ysize in the second field. To distinguish these coordinates from others and mark the end of text for a stripe, at least one of the coordinates is given a negative sign. For consistency with the other entries, a dummy name is then given along with options.

The second stripe, if any, is defined in a similar fashion as shown in 3106. The first line 3107 defines the stripe, lines 3108, 3 109 and 3110 define the images to be used, and the last line 3111 delimits the stripe. If the program interpreting the text file is instructed to merge all stripes into one, then the optical devices can be graphically designed as though they have multiple stripes, but only a single set of mask files is created. If only a single set of mask files is created, then the Stripe(2)_name and following stripe file names are irrelevant.

6.6.2 Method for Defining a Mask File

This section describes a novel graphic image file format developed to describe image files for mask-making. This format describes a mask as binary pixels rather than as polygons. This allows the fabrication of natural images and shapes that are difficult to represent efficiently as small polygons since X- and Y- coordinates (requiring 32 bits each) are required to represent each corner of a polygon using a conventional mask file format such as Calma GDS-II. The pixels are arranged in scan lines that describe an image from left to right and from top to bottom. Each device will likely have multiple masks with a separate file for each mask layer.

Each mask is kept in a separate file in a modified, standard bit-mapped format. The use of the PCX format that was popularized by ZSoft in its *PC Paintbrush* product is assumed herein, although other pixel, or bit-mapped, formats, such as TIFF (tagged image file format), could also be used. Numerous commercially available, bit-mapped graphics editor programs including Micrografx' *Picture Publisher,* Aldus' *Photostyler* and ZSoft's *PhotoFinish* can be used to view the mask files created. A complete description of the standard PCX file format is available in the ZSoft Technical Reference Manual (revision 4) from ZSoft in Marietta, Ga.

This novel format starts with the PC-industry standard, .PCX image file format developed by ZSoft, and places additional fields in unused bytes of the header, and, optionally, additional information at the end of each scan line. This modified format allows images to be viewed and manipulated with many existing tools, while adding information to ensure the data integrity required for mask making and to assist in the confirmation that the data is being interpreted correctly.

The additional fields in the header:

1. identify which optional features are present
2. identify the mask layer and logic sense of the mask
3. define the polynomial for a degree-16, cyclic redundancy check (CRC) code that may be placed at the end of the header and/or at the end of every scan line
4. define the physical size of a pixel
5. give the absolute coordinates of a stripe of graphic data
6. annotate the file with an ASCII character string
7. provide a CRC code for the header The additional data at the end of every scan line:

1. identify the mask layer
2. identify the stripe and scan line
3. provide a CRC code for the scan line 6.6.2.1 Header Format Image files used by the ZSoft PC Paintbrush product family (those with a .PCX extension) begin with a 128-byte header. The remainder of the image file consists of encoded graphic data. The encoding method is a simple byte-oriented, run-length technique. Scan lines carry graphic data in a page format, from left to right and from top to bottom. Coordinate (X-0, Y-0) is the upper left-hand corner. X increases from left to right, and Y increases from top to bottom. The coordinates are unsigned.

The file format for mask-making is:

header scan line 0 of binary pixels scan line 1 of binary pixels scan line 2 of binary pixels etc.

trailer (if any)

The novel file format for mask making using bit-mapped images is given in Appendix 5. The "New" field identifies those fields added to the standard .PCX file format. The "Used" field identifies those fields containing variable information that must be provided in the file to create masks using this file format; if the Used field is "no" then the field may be ignored ("don't care") for making masks. Some fields, such as Manufacturer, never change but are required if commercially available software packages are to be used to view the mask files.

6.6.2.2 Layer Identifier

If enabled by the Layer ID bit in the Control byte, then the sixteen pixels immediately preceding the Scan Line Identifier (if any) at the end of each scan line are a Layer Identifier. These pixels ARE to be printed on the mask and are included in the number of pixels defining the scan line, like any other image data. The pixels have a distinctive pattern for ease of identification and are used as follows, with pixel N being the left-most pixel, as usual:

pixel N+0–0 pixel N+1–1 pixel N+2–1 pixel N+3–0 pixel N+4–1 if mask layer 8, otherwise 0 pixel N+5–1 if mask layer 7, otherwise 0 pixel N+6–1 if mask layer 6, otherwise 0 pixel N+7–1 if mask layer 5, otherwise 0 pixel N+8–1 if mask layer 4, otherwise 0 pixel N+9–1 if mask layer 3, otherwise 0 pixel N+10–1 if mask layer 2, otherwise 0 pixel N+11–1 if mask layer 1, otherwise 0 pixel N+12–0 pixel N+13–1 pixel N+14–1 pixel N+15–0

If there are more than eight mask layers, then the mask layer values repeat.

6.6.2.3 Scan Line Identifier

If enabled by the Scan Line D bit in the Control byte, then the 16 pixels immediately preceding the CRC code (if any) and following the Layer D (if any) at the end of a scan line are a stripe and scan line identifier. These pixels ARE to be printed on the mask and are included in the number of pixels defining the scan line, like any other image data. These sixteen pixels, when interpreted as the bits of an integer, give the absolute Y address of the scan line relative to the first scan line in the first stripe (Y=0), as follows:

pixel N - bit 15 (msb)

pixel N+15-bit 0 (lsb)

6.6.2.4 CRC Coding

If enabled by the Scan Line CRC bit in the Control byte, then the last sixteen pixels of each scan line give the CRC code that is calculated from the encoded data (not the raw pixels) in the scan line up to the CRC code. The CRC code does not include itself. The two bytes of the CRC code are stored in the scan line in run-length encoded form with unity replication factor bytes, as: <C1>, <X(16) ... X(9)>, <C1>, <X(8)..X(1)>, which allows them to be viewed as ordinary pixels but identified easily for checking. Padding bytes may follow the CRC bytes to make the width of the image fill BytesPerLine, and are not included in the CRC code.

NOTE: While a file in this format can be viewed with many image-editing programs, a file having scan line CRC coding should not be saved, even if no changes are made, after being viewed by these programs since the run-length encoding at the end of a scan line may be changed, making the CRC code invalid.

The format of the CRC code is a 16-bit value of the form:

pixel N+0-X(16) (treated as msb)

pixel N+15-X(1) (treated as lsb)

where pixel N is the left-most pixel as usual, and X(n) is the final state of bit "n" of the CRC generator.

The sixteen binary CRC Coefficients (if any), bits C(16) ... C(1), in the file header define a degree-16 polynomial of the form:

[C(16)*X(16)]xor[C(15)*X(15)]xor . . . xor[C(2)*X(2)] xor [C(1)*X(1)] xor DIN

Coefficient C(0), which is multiplied by DIN, is not shown or stored since it is always 1.

This equation is the input to the first bit, X(1), in a 16-bit shift register. X(1) is the input to X(2), etc. DIN is the i'th bit of run-length encoded data for all pixels in the scan line except the CRC pixels at the end of the scan line. The Layer Identifier pixels (if any) and Scan Line Identifier pixels (if any) are included in the calculation of the CRC code like any other pixels.

The CRC generator, X(16) . . . X(1), is initialized (cleared) at the beginning of every scan line. Its sixteen bits are included in the number of pixels defining a scan line. The CRC Code for a scan line IS printed to the mask like any other pixels.

If enabled by the Control byte, then a CRC code is also calculated for the first 126 bytes of the header using these same coefficients, and placed at the end of the header. The data in the header is fed into the CRC generator in the same sequence that pixels in a scan line are handled, namely:

byte 0 bit 7, byte 0 bit 6, . . . , byte 0 bit 0,
byte 1 bit 7, byte 1 bit 6 . . . , byte 1 bit 0,
. . . , etc.

6.6.2.5 Example of Layer, Line and CRC Coding simply as CKS in FIG. 25. The coding is in three sections, each sixteen pixels wide. The sections are, from left to right:

first 16 pixels—a mask layer identifier. It is the same for all scan lines in a mask file, but varies from one mask file to the next.

second 16 pixels—a scan line identifier. It counts from one scan line to the next, from top to bottom, giving a vertical staircase pattern to the left.

last 16 pixels—a scan line checksum. Its contents depend upon the contents of the scan line so it appears random.

7. Appendices

Appendix 1 is a table that gives the number of layers deposited in each test area in Fabrication Example #1.

Appendix 2 is a table that gives the measured transmission values for each test area in Fabrication Example #1.

Appendix 3 is a table that gives the errors in the adjusted transmission values in each test area in Fabrication Example #1.

Appendix 4 is a table of pixel translations used in Fabrication Example #2.

Appendix 5 gives the file header format for bit-mapped mask files.

Appendix 6 is the text file used to create Fabrication Example #2, also known herein as *Pap Smear Micro Library #2B*.

APPENDIX 1

Number of Layers Deposited in Each Test Area in Fabrication Example #1

| #1: 0.0000 | #2: 1.0000 | #3: 1.0000 | #4: 2.0000 | #5: 1.0000 | #6: 2.0000 | #7: 2.0000 | #8: 3.0000 |
|---|---|---|---|---|---|---|---|
| #17: 1.0000 | #18: 2.0000 | #19: 2.0000 | #20: 3.0000 | #21: 2.0000 | #22: 3.0000 | #23: 3.0000 | #24: 4.0000 |
| #33: 1.0000 | #34: 2.0000 | #35: 2.0000 | #36: 3.0000 | #37: 2.0000 | #38: 3.0000 | #39: 3.0000 | #40: 4.0000 |
| #49: 2.0000 | #50: 3.0000 | #51: 3.0000 | #52: 4.0000 | #53: 4.0000 | #54: 4.0000 | #55: 4.0000 | #56: 5.0000 |
| #65: 1.0000 | #66: 2.0000 | #67: 2.0000 | #68: 3.0000 | #69: 2.0000 | #70: 3.0000 | #71: 3.0000 | #72: 4.0000 |
| #81: 2.0000 | #82: 3.0000 | #83: 3.0000 | #84: 4.0000 | #85: 3.0000 | #86: 4.0000 | #87: 4.0000 | #88: 5.0000 |
| #97: 2.0000 | #98: 3.0000 | #99: 3.0000 | #100: 4.0000 | #101: 3.0000 | #102: 4.0000 | #103: 4.0000 | #104: 5.0000 |
| #113: 3.0000 | #114: 4.0000 | #115: 4.0000 | #116: 5.0000 | #117: 4.0000 | #118: 5.0000 | #119: 5.0000 | #120: 6.0000 |
| #129: 1.0000 | #130: 2.0000 | #131: 2.0000 | #132: 3.0000 | #133: 2.0000 | #134: 3.0000 | #135: 3.0000 | #136: 4.0000 |
| #145: 2.0000 | #146: 3.0000 | #147: 3.0000 | #148: 4.0000 | #149: 3.0000 | #150: 4.0000 | #151: 4.0000 | #152: 5.0000 |
| #161: 2.0000 | #162: 3.0000 | #163: 3.0000 | #164: 4.0000 | #165: 3.0000 | #166: 4.0000 | #167: 4.0000 | #168: 5.0000 |
| #177: 3.0000 | #178: 4.0000 | #179: 4.0000 | #180: 5.0000 | #181: 4.0000 | #182: 5.0000 | #183: 5.0000 | #184: 6.0000 |
| #193: 2.0000 | #194: 3.0000 | #195: 3.0000 | #196: 4.0000 | #197: 3.0000 | #198: 4.0000 | #199: 4.0000 | #200: 5.0000 |
| #209: 3.0000 | #210: 4.0000 | #211: 4.0000 | #212: 5.0000 | #213: 4.0000 | #214: 5.0000 | #215: 5.0000 | #216: 6.0000 |
| #225: 3.0000 | #226: 4.0000 | #227: 4.0000 | #228: 5.0000 | #229: 4.0000 | #230: 5.0000 | #231: 5.0000 | #232: 6.0000 |
| #241: 4.0000 | #242: 5.0000 | #243: 5.0000 | #244: 6.0000 | #245: 5.0000 | #246: 6.0000 | #247: 6.0000 | #248: 7.0000 |
| #9: 1.0000 | #10: 2.0000 | #11: 2.0000 | #12: 3.0000 | #13: 2.0000 | #14: 3.0000 | #15: 3.0000 | #16: 4.0000 |
| #25: 2.0000 | #26: 3.0000 | #27: 3.0000 | #28: 4.0000 | #29: 3.0000 | #30: 4.0000 | #31: 4.0000 | #32: 5.0000 |
| #41: 2.0000 | #42: 3.0000 | #43: 3.0000 | #44: 4.0000 | #45: 3.0000 | #46: 4.0000 | #47: 4.0000 | #48: 5.0000 |
| #57: 3.0000 | #58: 4.0000 | #59: 4.0000 | #60: 5.0000 | #61: 4.0000 | #62: 5.0000 | #63: 5.0000 | #64: 6.0000 |
| #73: 2.0000 | #74: 3.0000 | #75: 3.0000 | #76: 4.0000 | #77: 3.0000 | #78: 4.0000 | #79: 4.0000 | #80: 5.0000 |
| #89: 3.0000 | #90: 4.0000 | #91: 4.0000 | #92: 5.0000 | #93: 4.0000 | #94: 5.0000 | #95: 5.0000 | #96: 6.0000 |
| #105: 3.0000 | #106: 4.0000 | #107: 4.0000 | #108: 5.0000 | #109: 4.0000 | #110: 5.0000 | #111: 5.0000 | #112: 6.0000 |
| #121: 4.0000 | #122: 5.0000 | #123: 5.0000 | #124: 6.0000 | #125: 5.0000 | #126: 6.0000 | #127: 6.0000 | #128: 7.0000 |
| #137: 2.0000 | #138: 3.0000 | #139: 3.0000 | #140: 4.0000 | #141: 3.0000 | #142: 4.0000 | #143: 4.0000 | #144: 5.0000 |
| #153: 3.0000 | #154: 4.0000 | #155: 4.0000 | #156: 5.0000 | #157: 4.0000 | #158: 5.0000 | #159: 5.0000 | #160: 6.0000 |
| #169: 3.0000 | #170: 4.0000 | #171: 4.0000 | #172: 5.0000 | #173: 4.0000 | #174: 5.0000 | #175: 5.0000 | #176: 6.0000 |
| #185: 4.0000 | #186: 5.0000 | #187: 5.0000 | #188: 6.0000 | #189: 5.0000 | #190: 6.0000 | #191: 6.0000 | #192: 7.0000 |
| #201: 3.0000 | #202: 4.0000 | #203: 4.0000 | #204: 5.0000 | #205: 4.0000 | #206: 5.0000 | #207: 5.0000 | #208: 6.0000 |
| #217: 4.0000 | #218: 5.0000 | #219: 5.0000 | #220: 6.0000 | #221: 5.0000 | #222: 6.0000 | #223: 6.0000 | #224: 7.0000 |
| #233: 4.0000 | #234: 5.0000 | #235: 5.0000 | #236: 6.0000 | #237: 5.0000 | #238: 6.0000 | #239: 6.0000 | #240: 7.0000 |
| #249: 5.0000 | #250: 6.0000 | #251: 6.0000 | #252: 7.0000 | #253: 6.0000 | #254: 7.0000 | #255: 7.0000 | #256: 8.0000 |

A greatly magnified portion of the error detection coding for Mask File #1 for *Pap Smear Micro Library #2B* is shown in FIG. 30. Individual pixels, originally 1 μm, can be seen. This coding is applied at the fight edge of each mask file to assure the proper handling of the mask data. It is indicated

APPENDIX 2

Measured Transmission Values from Fabrication Example #1

| #1: |1.0000| | #2: |0.4360| | #3: |0.4600| | #4: | 0.2400 | #5: |0.7760| | #6: | 0.3550 | #7: | 0.3800 | #8: | 0.2000 |
|---|---|---|---|---|---|---|---|---|---|---|---|---|---|---|---|
| #17: |0.0530| | #18: | 0.0270 | #19: | 0.0290 | #20: | 0.0150 | #21: | 0.0430 | #22: | 0.0210 | #23: | 0.0230 | #24: | 0.0120 |
| #33: |0.1950| | #34: | 0.1090 | #35: | 0.1140 | #36: | 0.0610 | #37: | 0.1620 | #38: | 0.0890 | #39: | 0.0950 | #40: | 0.0500 |
| #49: | 0.0180 | #50: | 0.0067 | #51: | 0.0072 | #52: | 0.0036 | #53: | 0.0100 | #54: | 0.0052 | #55: | 0.0058 | #56: | 0.0028 |
| #65: |0.2800| | #66: | 0.1540 | #67: | 0.0660 | #68: | 0.0910 | #69: | 0.2510 | #70: | 0.1340 | #71: | 0.1470 | #72: | 0.0810 |
| #81: | 0.0200 | #82: | 0.0100 | #83: | 0.0110 | #84: | 0.0055 | #85: | 0.0170 | #86: | 0.0083 | #87: | 0.0093 | #88: | 0.0047 |
| #97: | 0.0810 | #98: | 0.0420 | #99: | 0.0460 | #100: | 0.0230 | #101: | 0.0720 | #102: | 0.0350 | #103: | 0.0330 | #104: | 0.0195 |
| #113: | 0.0052 | #114: | 0.0026 | #115: | 0.0028 | #116: | 0.0014 | #117: | 0.0042 | #118: | 0.0021 | #119: | 0.0022 | #120: | 0.0011 |
| #129: |0.3460| | #130: | 0.1820 | #131: | 0.1950 | #132: | 0.1020 | #133: | 0.2950 | #134: | 0.1540 | #135: | 0.1660 | #136: | 0.0890 |
| #145: | 0.0250 | #146: | 0.0117 | #147: | 0.0125 | #148: | 0.0060 | #149: | 0.0195 | #150: | 0.0093 | #151: | 0.0100 | #152: | 0.0049 |
| #161: | 0.0850 | #162: | 0.0430 | #163: | 0.0470 | #164: | 0.0230 | #165: | 0.0720 | #166: | 0.0350 | #167: | 0.0400 | #168: | 0.0190 |
| #177: | 0.0062 | #178: | 0.0030 | #179: | 0.0032 | #180: | 0.0015 | #181: | 0.0047 | #182: | 0.0022 | #183: | 0.0024 | #184: | 0.0012 |
| #193: | 0.1310 | #194: | 0.0680 | #195: | 0.0740 | #196: | 0.0370 | #197: | 0.1140 | #198: | 0.0590 | #199: | 0.0650 | #200: | 0.0320 |
| #209: | 0.0100 | #210: | 0.0050 | #211: | 0.0052 | #212: | 0.0025 | #213: | 0.0079 | #214: | 0.0035 | #215: | 0.0041 | #216: | 0.0020 |
| #225: | 0.0350 | #226: | 0.0170 | #227: | 0.0180 | #228: | 0.0089 | #229: | 0.0290 | #230: | 0.0140 | #231: | 0.0150 | #232: | 0.0070 |
| #241: | 0.0008 | #242: | 0.0014 | #243: | 0.0064 | #244: | 0.0007 | #245: | 0.0020 | #246: | 0.0010 | #247: | 0.0013 | #248: | 0.0006 |

| #9: |0.9120| | #10: | 0.3890 | #11: | 0.4170 | #12: | 0.2190 | #13: | 0.7080 | #14: | 0.3240 | #15: | 0.3470 | #16: | 0.1910 |
|---|---|---|---|---|---|---|---|---|---|---|---|---|---|---|---|
| #25: | 0.0460 | #26: | 0.0230 | #27: | 0.0260 | #28: | 0.0130 | #29: | 0.0400 | #30: | 0.0200 | #31: | 0.0220 | #32: | 0.0110 |
| #41: | 0.1690 | #42: | 0.0930 | #43: | 0.1000 | #44: | 0.0520 | #45: | 0.1440 | #46: | 0.0790 | #47: | 0.0870 | #48: | 0.0440 |
| #57: | 0.0100 | #58: | 0.0053 | #59: | 0.0058 | #60: | 0.0029 | #61: | 0.0089 | #62: | 0.0045 | #63: | 0.0050 | #64: | 0.0025 |
| #73: | 0.2690 | #74: | 0.1470 | #75: | 0.0850 | #76: | 0.0850 | #77: | 0.2390 | #78: | 0.1310 | #79: | 0.1540 | #80: | 0.0770 |
| #89: | 0.0177 | #90: | 0.0091 | #91: | 0.0100 | #92: | 0.0049 | #93: | 0.0154 | #94: | 0.0078 | #95: | 0.0112 | #96: | 0.0048 |
| #105: | 0.0720 | #106: | 0.0370 | #107: | 0.0420 | #108: | 0.0200 | #109: | 0.0620 | #110: | 0.0320 | #111: | 0.0350 | #112: | 0.0180 |
| #121: | 0.0042 | #122: | 0.0022 | #123: | 0.0024 | #124: | 0.0012 | #125: | 0.0036 | #126: | 0.0018 | #127: | 0.0022 | #128: | 0.0011 |
| #137: | 0.3230 | #138: | 0.1690 | #139: | 0.1060 | #140: | 0.0980 | #141: | 0.2800 | #142: | 0.1470 | #143: | 0.1620 | #144: | 0.0850 |
| #153: | 0.0200 | #154: | 0.0098 | #155: | 0.0110 | #156: | 0.0052 | #157: | 0.0175 | #158: | 0.0081 | #159: | 0.0091 | #160: | 0.0045 |
| #169: | 0.0790 | #170: | 0.0390 | #171: | 0.0436 | #172: | 0.0213 | #173: | 0.0676 | #174: | 0.0330 | #175: | 0.0370 | #176: | 0.0180 |
| #185: | 0.0048 | #186: | 0.0023 | #187: | 0.0026 | #188: | 0.0013 | #189: | 0.0040 | #190: | 0.0020 | #191: | 0.0022 | #192: | 0.0011 |
| #201: | 0.1250 | #202: | 0.0650 | #203: | 0.0720 | #204: | 0.0360 | #205: | 0.1120 | #206: | 0.0580 | #207: | 0.0660 | #208: | 0.0330 |
| #217: | 0.0081 | #218: | 0.0039 | #219: | 0.0044 | #220: | 0.0022 | #221: | 0.0068 | #222: | 0.0033 | #223: | 0.0043 | #224: | 0.0019 |
| #233: | 0.0320 | #234: | 0.0150 | #235: | 0.0220 | #236: | 0.0083 | #237: | 0.0270 | #238: | 0.0130 | #239: | 0.0160 | #240: | 0.0074 |
| #249: | 0.0020 | #250: | 0.0010 | #251: | 0.0011 | #252: | 7.0006 | #253: | 0.0017 | #254: | 7.0009 | #255: | 7.0010 | #256: | 0.0006 |

APPENDIX 3

Errors in Adjusted Transmission Values in Fabrication Example #1

| #1: |0.0000| | #2: |0.0000| | #3: |0.0000| | #4: | −0.0394 | #5: |0.0000| | #6: | −0.0167 | #7: | −0.0230 | #8: | −0.0444 |
|---|---|---|---|---|---|---|---|---|---|---|---|---|---|---|---|
| #17: |0.0000| | #18: | −0.0039 | #19: | −0.0046 | #20: | −0.0019 | #21: | −0.0031 | #22: | −0.0031 | #23: | −0.0041 | #24: | −0.0038 |
| #33: |0.0000| | #34: | −0.0240 | #35: | −0.0243 | #36: | −0.0219 | #37: | −0.0107 | #38: | −0.0230 | #39: | −0.0254 | #40: | −0.0197 |
| #49: | −0.0077 | #50: | −0.0022 | #51: | −0.0024 | #52: | −0.0015 | #53: | −0.0020 | #54: | −0.0017 | #55: | −0.0021 | #56: | −0.0012 |
| #65: |0.0000| | #66: | −0.0319 | #67: | 0.0628 | #68: | −0.0348 | #69: | −0.0337 | #70: | −0.0393 | #71: | −0.0471 | #72: | −0.0374 |
| #81: | −0.0052 | #82: | −0.0035 | #83: | −0.0042 | #84: | −0.0025 | #85: | −0.0055 | #86: | −0.0033 | #87: | −0.0040 | #88: | −0.0024 |
| #97: | −0.0264 | #98: | −0.0182 | #99: | −0.0209 | #100: | −0.0120 | #101: | −0.0296 | #102: | −0.0165 | #103: | −0.0135 | #104: | −0.0110 |
| #113: | −0.0023 | #114: | −0.0013 | #115: | −0.0015 | #116: | −0.0008 | #117: | −0.0020 | #118: | −0.0011 | #119: | −0.0012 | #120: | −0.0006 |
| #129: |0.0000| | #130: | −0.0311 | #131: | −0.0358 | #132: | −0.0326 | #133: | −0.0265 | #134: | −0.0369 | #135: | −0.0425 | #136: | −0.0352 |
| #145: | −0.0067 | #146: | −0.0037 | #147: | −0.0041 | #148: | −0.0023 | #149: | −0.0053 | #150: | −0.0031 | #151: | −0.0035 | #152: | −0.0020 |
| #161: | −0.0175 | #162: | −0.0136 | #163: | −0.0160 | #164: | −0.0095 | #165: | −0.0196 | #166: | −0.0122 | #167: | −0.0159 | #168: | −0.0085 |
| #177: | −0.0026 | #178: | −0.0014 | #179: | −0.0016 | #180: | −0.0008 | #181: | −0.0019 | #182: | −0.0010 | #183: | −0.0011 | #184: | −0.0006 |
| #193: | −0.0341 | #194: | −0.0258 | #195: | −0.0294 | #196: | −0.0176 | #197: | −0.0388 | #198: | −0.0262 | #199: | −0.0304 | #200: | −0.0169 |
| #209: | −0.0049 | #210: | −0.0028 | #211: | −0.0028 | #212: | −0.0015 | #213: | −0.0039 | #214: | −0.0018 | #215: | −0.0023 | #216: | −0.0012 |
| #225: | −0.0161 | #226: | −0.0088 | #227: | −0.0093 | #228: | −0.0051 | #229: | −0.0143 | #230: | −0.0076 | #231: | −0.0083 | #232: | −0.0041 |
| #241: | 0.0002 | #242: | −0.0010 | #243: | −0.0059 | #244: | −0.0005 | #245: | −0.0012 | #246: | −0.0007 | #247: | −0.0009 | #248: | −0.0004 |

| #9: |0.0000| | #10: | 0.0086 | #11: | 0.0025 | #12: | −0.0361 | #13: | −0.0003 | #14: | −0.0154 | #15: | −0.0215 | #16: | −0.0491 |
|---|---|---|---|---|---|---|---|---|---|---|---|---|---|---|---|
| #25: | 0.0023 | #26: | −0.0019 | #27: | −0.0038 | #28: | −0.0033 | #29: | −0.0025 | #30: | −0.0036 | #31: | −0.0047 | #32: | −0.0035 |
| #41: | 0.0088 | #42: | −0.0155 | #43: | −0.0182 | #44: | −0.0163 | #45: | −0.0060 | #46: | −0.0188 | #47: | −0.0235 | #48: | −0.0163 |
| #57: | −0.0006 | #58: | −0.0012 | #59: | −0.0015 | #60: | −0.0010 | #61: | −0.0016 | #62: | −0.0013 | #63: | −0.0016 | #64: | −0.0010 |
| #73: | −0.0136 | #74: | −0.0357 | #75: | 0.0325 | #76: | −0.0338 | #77: | −0.0408 | #78: | −0.0446 | #79: | −0.0628 | #80: | −0.0373 |
| #89: | −0.0042 | #90: | −0.0032 | #91: | −0.0038 | #92: | −0.0022 | #93: | −0.0049 | #94: | −0.0032 | #95: | −0.0064 | #96: | −0.0027 |
| #105: | −0.0022 | #106: | −0.0153 | #107: | −0.0191 | #108: | −0.0100 | #109: | −0.0234 | #110: | −0.0152 | #111: | −0.0172 | #112: | −0.0103 |
| #121: | −0.0016 | #122: | −0.0010 | #123: | −0.0012 | #124: | −0.0007 | #125: | −0.0016 | #126: | −0.0009 | #127: | −0.0013 | #128: | −0.0007 |
| #137: | −0.0074 | #138: | −0.0314 | #139: | 0.0392 | #140: | −0.0347 | #141: | −0.0351 | #142: | −0.0402 | #143: | −0.0494 | #144: | −0.0359 |
| #153: | −0.0033 | #154: | −0.0025 | #155: | −0.0033 | #156: | −0.0018 | #157: | −0.0045 | #158: | −0.0024 | #159: | −0.0031 | #160: | −0.0019 |
| #169: | −0.0175 | #170: | −0.0122 | #171: | −0.0153 | #172: | −0.0090 | #173: | −0.0199 | #174: | −0.0122 | #175: | −0.0150 | #176: | −0.0084 |
| #185: | −0.0015 | #186: | −0.0009 | #187: | −0.0011 | #188: | −0.0006 | #189: | −0.0015 | #190: | −0.0009 | #191: | −0.0010 | #192: | −0.0006 |

APPENDIX 3-continued

Errors in Adjusted Transmission Values in Fabrication Example #1

| | | | | | | | | | | | | | | |
|---|---|---|---|---|---|---|---|---|---|---|---|---|---|---|
| #201: | −0.0366 | #202: | −0.0265 | #203: | −0.0314 | #204: | −0.0183 | #205: | −0.0434 | #206: | −0.0281 | #207: | −0.0345 | #208: | −0.0192 |
| #217: | −0.0034 | #218: | −0.0019 | #219: | −0.0022 | #220: | −0.0013 | #221: | −0.0032 | #222: | −0.0017 | #223: | −0.0026 | #224: | −0.0012 |
| #233: | −0.0148 | #234: | −0.0075 | #235: | −0.0141 | #236: | −0.0048 | #237: | −0.0136 | #238: | −0.0072 | #239: | −0.0098 | #240: | −0.0047 |
| #249: | −0.0011 | #250: | −0.0006 | #251: | −0.0007 | #252: | −0.0004 | #253: | −0.0010 | #254: | −0.0006 | #255: | −0.0007 | #256: | −0.0005 |

APPENDIX 4

Pixel Translations Used in Fabrication Example #2

| Translation(PixelIn) = Masks Code in decimal = Masks Code in binary | PixelIn = Percent of Full Scale (= 255) | PixelOut = Value in decimal = Percent of Full Scale (= 255) | PixelOut − PixelIn = difference in decimal = Percent of Fun Scale (= 255) |
|---|---|---|---|
| T(0) = 0 = 00000000B | PixelIn = .1% | PixelOut = 1 = .5% | Out − In = 1 = .3% |
| T(1) = 0 = 00000000B | PixelIn = .5% | PixelOut = 1 = .5% | Out − In = 0 = 0% |
| T(2) = 15 = 00001111B | PixelIn = .9% | PixelOut = 2 = .9% | Out − In = 0 = 0% |
| T(3) = 29 = 00011101B | PixelIn = 1.3% | PixelOut = 3 = 1.3% | Out − In = 0 = 0% |
| T(4) = 47 = 00101111B | PixelIn = 1.7% | PixelOut = 5 = 2.1% | Out − In = 1 = .3% |
| T(5) = 55 = 00110111B | PixelIn = 2.1% | PixelOut = 5 = 2.1% | Out − In = 0 = 0% |
| T(6) = 61 = 00111101B | PixelIn = 2.5% | PixelOut = 7 = 2.9% | Out − In = 1 = .3% |
| T(7) = 62 = 00111110B | PixelIn = 2.9% | PixelOut = 7 = 2.9% | Out − In = 0 = 0% |
| T(8) = 63 = 00111111B | PixelIn = 3.3% | PixelOut = 8 = 3.3% | Out − In = 0 = 0% |
| T(9) = 79 = 01001111B | PixelIn = 3.7% | PixelOut = 9 = 3.7% | Out − In = 0 = 0% |
| T(10) = 87 = 01010111B | PixelIn = 4.1% | PixelOut = 10 = 4.1% | Out − In = 0 = 0% |
| T(11) = 91 = 01011011B | PixelIn = 4.5% | PixelOut = 12 = 4.9% | Out − In = 1 = .3% |
| T(12) = 91 = 01011011B | PixelIn = 4.9% | PixelOut = 12 = 4.9% | Out − In = 0 = 0% |
| T(13) = 93 = 01011101B | PixelIn = 5.2% | PixelOut = 13 = 5.2% | Out − In = 0 = 0% |
| T(14) = 94 = 01011110B | PixelIn = 5.6% | PixelOut = 14 = 5.6% | Out − In = 0 = 0% |
| T(15) = 94 = 01011110B | PixelIn = 6% | PixelOut = 14 = 5.6% | Out − In = −1 = −.4% |
| T(16) = 95 = 01011111B | PixelIn = 6.4% | PixelOut = 16 = 6.4% | Out − In = 0 = 0% |
| T(17) = 95 = 01011111B | PixelIn = 6.8% | PixelOut = 16 = 6.4% | Out − In = −1 = −.4% |
| T(18) = 111 = 01101111B | PixelIn = 7.2% | PixelOut = 18 = 7.2% | Out − In = 0 = 0% |
| T(19) = 111 = 01101111B | PixelIn = 7.6% | PixelOut = 18 = 7.2% | Out − In = −1 = −.4% |
| T(20) = 119 = 01110111B | PixelIn = 8% | PixelOut = 20 = 8% | Out − In = 0 = 0% |
| T(21) = 119 = 01110111B | PixelIn = 8.4% | PixelOut = 20 = 8% | Out − In = −1 = −.4% |
| T(22) = 123 = 01111011B | PixelIn = 8.8% | PixelOut = 23 = 9.2% | Out − In = 1 = .3% |
| T(23) = 123 = 01111011B | PixelIn = 9.2% | PixelOut = 23 = 9.2% | Out − In = 0 = 0% |
| T(24) = 123 = 01111011B | PixelIn = 9.6% | PixelOut = 23 = 9.2% | Out − In = −1 = −.4% |
| T(25) = 125 = 01111101B | PixelIn = 10% | PixelOut = 26 = 10.3% | Out − In = 1 = .3% |
| T(26) = 125 = 01111101B | PixelIn = 10.3% | PixelOut = 26 = 10.3% | Out − In = 0 = 0% |
| T(27) = 126 = 01111110B | PixelIn = 10.7% | PixelOut = 29 = 11.5% | Out − In = 2 = .7% |
| T(28) = 126 = 01111110B | PixelIn = 11.1% | PixelOut = 29 = 11.5% | Out − In = 1 = .3% |
| T(29) = 126 = 01111110B | PixelIn = 11.5% | PixelOut = 29 = 11.5% | Out − In = 0 = 0% |
| T(30) = 126 = 01111110B | PixelIn = 11.9% | PixelOut = 29 = 11.5% | Out − In = −1 = −.4% |
| T(31) = 127 = 01111111B | PixelIn = 12.3% | PixelOut = 32 = 12.7% | Out − In = 1 = .3% |
| T(32) = 127 = 01111111B | PixelIn = 12.7% | PixelOut = 32 = 12.7% | Out − In = 0 = 0% |
| T(33) = 127 = 01111111B | PixelIn = 13.1% | PixelOut = 32 = 12.7% | Out − In = −1 = −.4% |
| T(34) = 127 = 01111111B | PixelIn = 13.5% | PixelOut = 32 = 12.7% | Out − In = −2 = −.8% |
| T(35) = 175 = 10101111B | PixelIn = 13.9% | PixelOut = 36 = 14.3% | Out − In = 1 = .3% |
| T(36) = 175 = 10101111B | PixelIn = 14.3% | PixelOut = 36 = 14.3% | Out − In = 0 = 0% |
| T(37) = 175 = 10101111B | PixelIn = 14.7% | PixelOut = 36 = 14.3% | Out − In = −1 = −.4% |
| T(38) = 175 = 10101111B | PixelIn = 15% | PixelOut = 36 = 14.3% | Out − In = −2 = −.8% |
| T(39) = 183 = 10110111B | PixelIn = 15.4% | PixelOut = 40 = 15.8% | Out − In = 1 = .3% |
| T(40) = 183 = 10110111B | PixelIn = 15.8% | PixelOut = 40 = 15.8% | Out − In = 0 = 0% |
| T(41) = 183 = 10110111B | PixelIn = 16.2% | PixelOut = 40 = 15.8% | Out − In = −1 = −.4% |
| T(42) = 183 = 10110111B | PixelIn = 16.6% | PixelOut = 40 = 15.8% | Out − In = −2 = −.8% |
| T(43) = 187 = 10111011B | PixelIn = 17% | PixelOut = 45 = 17.8% | Out − In = 2 = .7% |
| T(44) = 187 = 10111011B | PixelIn = 17.4% | PixelOut = 45 = 17.8% | Out − In = 1 = .3% |
| T(45) = 187 = 10111011B | PixelIn = 17.8% | PixelOut = 45 = 17.8% | Out − In = 0 = 0% |
| T(46) = 187 = 10111011B | PixelIn = 18.2% | PixelOut = 45 = 17.8% | Out − In = −1 = −.4% |
| T(47) = 187 = 10111011B | PixelIn = 18.6% | PixelOut = 45 = 17.8% | Out − In = −2 = −.8% |
| T(48) = 187 = 10111011B | PixelIn = 19% | PixelOut = 45 = 17.8% | Out − In = −3 = −1.2% |
| T(49) = 189 = 10111101B | PixelIn = 19.4% | PixelOut = 51 = 20.1% | Out − In = 2 = .7% |
| T(50) = 189 = 10111101B | PixelIn = 19.8% | PixelOut = 51 = 20.1% | Out − In = 1 = .3% |
| T(51) = 189 = 10111101B | PixelIn = 20.1% | PixelOut = 51 = 20.1% | Out − In = 0 = 0% |
| T(52) = 189 = 10111101B | PixelIn = 20.5% | PixelOut = 51 = 20.1% | Out − In = −1 = −.4% |
| T(53) = 189 = 10111101B | PixelIn = 20.9% | PixelOut = 51 = 20.1% | Out − In = −2 = −.8% |
| T(54) = 189 = 10111101B | PixelIn = 21.3% | PixelOut = 51 = 20.1% | Out − In = −3 = −1.2% |
| T(55) = 190 = 10111110B | PixelIn = 21.7% | PixelOut = 57 = 22.5% | Out − In = 2 = .7% |
| T(56) = 190 = 10111110B | PixelIn = 22.1% | PixelOut = 57 = 22.5% | Out − In = 1 = .3% |
| T(57) = 190 = 10111110B | PixelIn = 22.5% | PixelOut = 57 = 22.5% | Out − In = 0 = 0% |
| T(58) = 190 = 10111110B | PixelIn = 22.9% | PixelOut = 57 = 22.5% | Out − In = −1 = −.4% |
| T(59) = 190 = 10111110B | PixelIn = 23.3% | PixelOut = 57 = 22.5% | Out − In = −2 = −.8% |
| T(60) = 190 = 10111110B | PixelIn = 23.7% | PixelOut = 57 = 22.5% | Out − In = −3 = −1.2% |

APPENDIX 4-continued

Pixel Translations Used in Fabrication Example #2

| Translation(PixelIn) = Masks Code in decimal = Masks Code in binary | PixelIn = Percent of Full Scale (= 255) | PixelOut = Value in decimal = Percent of Full Scale (= 255) | PixelOut − PixelIn = difference in decimal = Percent of Fun Scale (= 255) |
|---|---|---|---|
| T(61) = 191 = 10111111B | PixelIn = 24.1% | PixelOut = 64 = 25.2% | Out − In = 3 = 1.1% |
| T(62) = 191 = 10111111B | PixelIn = 24.5% | PixelOut = 64 = 25.2% | Out − In = 2 = .7% |
| T(63) = 191 = 10111111B | PixelIn = 24.9% | PixelOut = 64 = 25.2% | Out − In = 1 = .3% |
| T(64) = 191 = 10111111B | PixelIn = 25.2% | PixelOut = 64 = 25.2% | Out − In = 0 = 0% |
| T(65) = 191 = 10111111B | PixelIn = 25.6% | PixelOut = 64 = 25.2% | Out − In = −1 = −.4% |
| T(66) = 191 = 10111111B | PixelIn = 26% | PixelOut = 64 = 25.2% | Out − In = −2 = −.8% |
| T(67) = 191 = 10111111B | PixelIn = 26.4% | PixelOut = 64 = 25.2% | Out − In = −3 = −1.2% |
| T(68) = 191 = 10111111B | PixelIn = 26.8% | PixelOut = 64 = 25.2% | Out − In = −4 = −1.6% |
| T(69) = 207 = 11001111B | PixelIn = 27.2% | PixelOut = 72 = 28.4% | Out − In = 3 = 1.1% |
| T(70) = 207 = 11001111B | PixelIn = 27.6% | PixelOut = 72 = 28.4% | Out − In = 2 = .7% |
| T(71) = 207 = 11001111B | PixelIn = 28% | PixelOut = 72 = 28.4% | Out − In = 1 = .3% |
| T(72) = 207 = 11001111B | PixelIn = 28.4% | PixelOut = 72 = 28.4% | Out − In = 0 = 0% |
| T(73) = 207 = 11001111B | PixelIn = 28.8% | PixelOut = 72 = 28.4% | Out − In = −1 = −.4% |
| T(74) = 207 = 11001111B | PixelIn = 29.2% | PixelOut = 72 = 28.4% | Out − In = −2 = −.8% |
| T(75) = 207 = 11001111B | PixelIn = 29.6% | PixelOut = 72 = 28.4% | Out − In = −3 = −1.2% |
| T(76) = 207 = 11001111B | PixelIn = 30% | PixelOut = 72 = 28.4% | Out − In = −4 = −1.6% |
| T(77) = 215 = 11010111B | PixelIn = 30.3% | Pixelout = 81 = 31.9% | Out − In = 4 = 1.5% |
| T(78) = 215 = 11010111B | PixelIn = 30.7% | PixelOut = 81 = 31.9% | Out − In = 3 = 1.1% |
| T(79) = 215 = 11010111B | PixelIn = 31.1% | PixelOut = 81 = 31.9% | Out − In = 2 = .7% |
| T(80) = 215 = 11010111B | PixelIn = 31.5% | PixelOut = 81 = 31.9% | Out − In = 1 = .3% |
| T(81) = 215 = 11010111B | PixelIn = 31.9% | PixelOut = 81 = 31.9% | Out − In = 0 = 0% |
| T(82) = 215 = 11010111B | PixelIn = 32.3% | PixelOut = 81 = 31.9% | Out − In = −1 = −.4% |
| T(83) = 215 = 11010111B | PixelIn = 32.7% | PixelOut = 81 = 31.9% | Out − In = −2 = −.8% |
| T(84) = 215 = 11010111B | PixelIn = 33.1% | PixelOut = 81 = 31.9% | Out − In = −3 = −1.2% |
| T(85) = 215 = 11010111B | PixelIn = 33.5% | PixelOut = 81 = 31.9% | Out − In = −4 = −1.6% |
| T(86) = 219 = 11011011B | PixelIn = 33.9% | PixelOut = 90 = 35.4% | Out − In = 4 = 1.5% |
| T(87) = 219 = 11011011B | PixelIn = 34.3% | PixelOut = 90 = 35.4% | Out − In = 3 = 1.1% |
| T(88) = 219 = 11011011B | PixelIn = 34.7% | PixelOut = 90 = 35.4% | Out − In = 2 = .7% |
| T(89) = 219 = 11011011B | PixelIn = 35% | PixelOut = 90 = 35.4% | Out − In = 1 = .3% |
| T(90) = 219 = 11011011B | PixelIn = 35.4% | PixelOut = 90 = 35.4% | Out − In = 0 = 0% |
| T(91) = 219 = 11011011B | PixelIn = 35.8% | PixelOut = 90 = 35.4% | Out − In = −1 = −.4% |
| T(92) = 219 = 11011011B | PixelIn = 36.2% | PixelOut = 90 = 35.4% | Out − In = −2 = −.8% |
| T(93) = 219 = 11011011B | PixelIn = 36.6% | PixelOut = 90 = 35.4% | Out − In = −3 = −1.2% |
| T(94) = 219 = 11011011B | PixelIn = 37% | PixelOut = 90 = 35.4% | Out − In = −4 = −1.6% |
| T(95) = 219 = 11011011B | PixelIn = 37.4% | PixelOut = 90 = 35.4% | Out − In = −5 = −2% |
| T(96) = 221 = 11011101B | PixelIn = 37.8% | PixelOut = 101 = 39.8% | Out − In = 5 = 1.9% |
| T(97) = 221 = 11011101B | PixelIn = 38.2% | PixelOut = 101 = 39.8% | Out − In = 4 = 1.5% |
| T(98) = 221 = 11011101B | PixelIn = 38.6% | PixelOut = 101 = 39.8% | Out − In = 3 = 1.1% |
| T(99) = 221 = 11011101B | PixelIn = 39% | PixelOut = 101 = 39.8% | Out − In = 2 = .7% |
| T(100) = 221 = 11011101B | PixelIn = 39.4% | PixelOut = 101 = 39.8% | Out − In = 1 = .3% |
| T(101) = 221 = 11011101B | PixelIn = 39.8% | PixelOut = 101 = 39.8% | Out − In = 0 = 0% |
| T(102) = 221 = 11011101B | PixelIn = 40.1% | PixelOut = 101 = 39.8% | Out − In = −1 = −.4% |
| T(103) = 221 = 11011101B | PixelIn = 40.5% | PixelOut = 101 = 39.8% | Out − In = −2 = −.8% |
| T(104) = 221 = 11011101B | PixelIn = 40.9% | PixelOut = 101 = 39.8% | Out − In = −3 = −1.2% |
| T(105) = 221 = 11011101B | PixelIn = 41.3% | PixelOut = 101 = 39.8% | Out − In = −4 = −1.6% |
| T(106) = 221 = 11011101B | PixelIn = 41.7% | PixelOut = 101 = 39.8% | Out − In = −5 = −2% |
| T(107) = 221 = 11011101B | PixelIn = 42.1% | PixelOut = 101 = 39.8% | Out − In = −6 = −2.4% |
| T(108) = 222 = 11011110B | PixelIn = 42.5% | PixelOut = 114 = 44.9% | Out − In = 6 = 2.3% |
| T(109) = 222 = 11011110B | PixelIn = 42.9% | Pixelout = 114 = 44.9% | Out − In = 5 = 1.9% |
| T(110) = 222 = 11011110B | PixelIn = 43.3% | PixelOut = 114 = 44.9% | Out − In = 4 = 1.5% |
| T(111) = 222 = 11011110B | PixelIn = 43.7% | PixelOut = 114 = 44.9% | Out − In = 3 = 1.1% |
| T(112) = 222 = 11011110B | PixelIn = 44.1% | PixelOut = 114 = 44.9% | Out − In = 2 = .7% |
| T(113) = 222 = 11011110B | PixelIn = 44.5% | PixelOut = 114 = 44.9% | Out − In = 1 = .3% |
| T(114) = 222 = 11011110B | PixelIn = 44.9% | PixelOut = 114 = 44.9% | Out − In = 0 = 0% |
| T(115) = 222 = 11011110B | PixelIn = 45.2% | PixelOut = 114 = 44.9% | Out − In = −1 = −.4% |
| T(116) = 222 = 11011110B | PixelIn = 45.6% | PixelOut = 114 = 44.9% | Out − In = −2 = −.8% |
| T(117) = 222 = 11011110B | PixelIn = 46% | PixelOut = 114 = 44.9% | Out − In = −3 = −1.2% |
| T(118) = 222 = 11011110B | PixelIn = 46.4% | PixelOut = 114 = 44.9% | Out − In = −4 = −1.6% |
| T(119) = 222 = 11011110B | PixelIn = 46.8% | PixelOut = 114 = 44.9% | Out − In = −5 = −2% |
| T(120) = 222 = 11011110B | PixelIn = 47.2% | PixelOut = 114 = 44.9% | Out − In = −6 = −2.4% |
| T(121) = 223 = 11011111B | PixelIn = 47.6% | PixelOut = 128 = 50.3% | Out − In = 7 = 2.7% |
| T(122) = 223 = 11011111B | PixelIn = 48% | PixelOut = 128 = 50.3% | Out − In = 6 = 2.3% |
| T(123) = 223 = 11011111B | PixelIn = 48.4% | PixelOut = 128 = 50.3% | Out − In = 5 = 1.9% |
| T(124) = 223 = 11011111B | PixelIn = 48.8% | PixelOut = 128 = 50.3% | Out − In = 4 = 1.5% |
| T(125) = 223 = 11011111B | PixelIn = 49.2% | PixelOut = 128 = 50.3% | Out − In = 3 = 1.1% |
| T(126) = 223 = 11011111B | PixelIn = 49.6% | PixelOut = 128 = 50.3% | Out − In = 2 = .7% |
| T(127) = 223 = 11011111B | PixelIn = 50% | PixelOut = 128 = 50.3% | Out − In = 1 = .3% |
| T(128) = 223 = 11011111B | PixelIn = 50.3% | PixelOut = 128 = 50.3% | Out − In = 0 = 0% |
| T(129) = 223 = 11011111B | PixelIn = 50.7% | PixelOut = 128 = 50.3% | Out − In = −1 = −.4% |
| T(130) = 223 = 11011111B | PixelIn = 51.1% | PixelOut = 128 = 50.3% | Out − In = −2 = −.8% |
| T(131) = 223 = 11011111B | PixelIn = 51.5% | PixelOut = 128 = 50.3% | Out − In = −3 = −1.2% |
| T(132) = 223 = 11011111B | PixelIn = 51.9% | PixelOut = 128 = 50.3% | Out − In = −4 = −1.6% |

APPENDIX 4-continued

Pixel Translations Used in Fabrication Example #2

| Translation(PixelIn) = Masks Code in decimal = Masks Code in binary | PixelIn = Percent of Full Scale (= 255) | PixelOut = Value in decimal = Percent of Full Scale (= 255) | PixelOut − PixelIn = difference in decimal = Percent of Fun Scale (= 255) |
|---|---|---|---|
| T(133) = 223 = 11011111B | PixelIn = 52.3% | PixelOut = 128 = 50.3% | Out − In = −5 = −2% |
| T(134) = 223 = 11011111B | PixelIn = 52.7% | PixelOut = 128 = 50.3% | Out − In = −6 = −2.4% |
| T(135) = 223 = 11011111B | PixelIn = 53.1% | PixelOut = 128 = 50.3% | Out − In = −7 = −2.8% |
| T(136) = 239 = 11101111B | PixelIn = 53.5% | PixelOut = 143 = 56.2% | Out − In = 7 = 2.7% |
| T(137) = 239 = 11101111B | PixelIn = 53.9% | PixelOut = 143 = 56.2% | Out − In = 6 = 2.3% |
| T(138) = 239 = 11101111B | PixelIn = 54.3% | PixelOut = 143 = 56.2% | Out − In = 5 = 1.9% |
| T(139) = 239 = 11101111B | PixelIn = 54.7% | PixelOut = 143 = 56.2% | Out − In = 4 = 1.5% |
| T(140) = 239 = 11101111B | PixelIn = 55% | PixelOut = 143 = 56.2% | Out − In = 3 = 1.1% |
| T(141) = 239 = 11101111B | PixelIn = 55.4% | PixelOut = 143 = 56.2% | Out − In = 2 = .7% |
| T(142) = 239 = 11101111B | PixelIn = 55.8% | PixelOut = 143 = 56.2% | Out − In = 1 = .3% |
| T(143) = 239 = 11101111B | PixelIn = 56.2% | PixelOut = 143 = 56.2% | Out − In = 0 = 0% |
| T(144) = 239 = 11101111B | PixelIn = 56.6% | PixelOut = 143 = 56.2% | Out − In = −1 = −.4% |
| T(145) = 239 = 11101111B | PixelIn = 57% | PixelOut = 143 = 56.2% | Out − In = −2 = −.8% |
| T(146) = 239 = 11101111B | PixelIn = 57.4% | PixelOut = 143 = 56.2% | Out − In = −3 = −1.2% |
| T(147) = 239 = 11101111B | PixelIn = 57.8% | PixelOut = 143 = 56.2% | Out − In = −4 = −1.6% |
| T(148) = 239 = 11101111B | PixelIn = 58.2% | PixelOut = 143 = 56.2% | Out − In = −5 = −2% |
| T(149) = 239 = 11101111B | PixelIn = 58.6% | PixelOut = 143 = 56.2% | Out − In = −6 = −2.4% |
| T(150) = 239 = 11101111B | PixelIn = 59% | PixelOut = 143 = 56.2% | Out − In = −7 = −2.8% |
| T(151) = 239 = 11101111B | PixelIn = 59.4% | PixelOut = 143 = 56.2% | Out − In = −8 = −3.2% |
| T(152) = 239 = 11101111B | PixelIn = 59.8% | PixelOut = 143 = 56.2% | Out − In = −9 = −3.6% |
| T(153) = 247 = 11110111B | PixelIn = 60.1% | PixelOut = 161 = 63.3% | Out − In = 8 = 3.1% |
| T(154) = 247 = 11110111B | PixelIn = 60.5% | PixelOut = 161 = 63.3% | Out − In = 7 = 2.7% |
| T(155) = 247 = 11110111B | PixelIn = 60.9% | PixelOut = 161 = 63.3% | Out − In = 6 = 2.3% |
| T(156) = 247 = 11110111B | PixelIn = 61.3% | PixelOut = 161 = 63.3% | Out − In = 5 = 1.9% |
| T(157) = 247 = 11110111B | PixelIn = 61.7% | PixelOut = 161 = 63.3% | Out − In = 4 = 1.5% |
| T(158) = 247 = 11110111B | PixelIn = 62.1% | PixelOut = 161 = 63.3% | Out − In = 3 = 1.1% |
| T(159) = 247 = 11110111B | PixelIn = 62.5% | PixelOut = 161 = 63.3% | Out − In = 2 = .7% |
| T(160) = 247 = 11110111B | PixelIn = 62.9% | PixelOut = 161 = 63.3% | Out − In = 1 = .3% |
| T(161) = 247 = 11110111B | PixelIn = 63.3% | PixelOut = 161 = 63.3% | Out − In = 0 = 0% |
| T(162) = 247 = 11110111B | PixelIn = 63.7% | PixelOut = 161 = 63.3% | Out − In = −1 = −.4% |
| T(163) = 247 = 11110111B | PixelIn = 64.1% | PixelOut = 161 = 63.3% | Out − In = −2 = −.8% |
| T(164) = 247 = 11110111B | PixelIn = 64.5% | PixelOut = 161 = 63.3% | Out − In = −3 = −1.2% |
| T(165) = 247 = 11110111B | PixelIn = 64.9% | PixelOut = 161 = 63.3% | Out − In = −4 = −1.6% |
| T(166) = 247 = 11110111B | PixelIn = 65.2% | PixelOut = 161 = 63.3% | Out − In = −5 = −2% |
| T(167) = 247 = 11110111B | PixelIn = 65.6% | PixelOut = 161 = 63.3% | Out − In = −6 = −2.4% |
| T(168) = 247 = 11110111B | PixelIn = 66% | PixelOut = 161 = 63.3% | Out − In = −7 = −2.8% |
| T(169) = 247 = 11110111B | PixelIn = 66.4% | PixelOut = 161 = 63.3% | Out − In = −8 = −3.2% |
| T(170) = 247 = 11110111B | PixelIn = 66.8% | PixelOut = 161 = 63.3% | Out − In = −9 = −3.6% |
| T(171) = 251 = 11111011B | PixelIn = 67.2% | PixelOut = 181 = 71.1% | Out − In = 10 = 3.9% |
| T(172) = 251 = 11111011B | PixelIn = 67.6% | PixelOut = 181 = 71.1% | Out − In = 9 = 3.5% |
| T(173) = 251 = 11111011B | PixelIn = 68% | PixelOut = 181 = 71.1% | Out − In = 8 = 3.1% |
| T(174) = 251 = 11111011B | PixelIn = 68.4% | PixelOut = 181 = 71.1% | Out − In = 7 = 2.7% |
| T(175) = 251 = 11111011B | PixelIn = 68.8% | PixelOut = 181 = 71.1% | Out − In = 6 = 2.3% |
| T(176) = 251 = 11111011B | PixelIn = 69.2% | PixelOut = 181 = 71.1% | Out − In = 5 = 1.9% |
| T(177) = 251 = 11111011B | PixelIn = 69.6% | PixelOut = 181 = 71.1% | Out − In = 4 = 1.5% |
| T(178) = 251 = 11111011B | PixelIn = 70% | PixelOut = 181 = 71.1% | Out − In = 3 = 1.1% |
| T(179) = 251 = 11111011B | PixelIn = 70.3% | PixelOut = 181 = 71.1% | Out − In = 2 = .7% |
| T(180) = 251 = 11111011B | PixelIn = 70.7% | PixelOut = 181 = 71.1% | Out − In = 1 = .3% |
| T(181) = 251 = 11111011B | PixelIn = 71.1% | PixelOut = 181 = 71.1% | Out − In = 0 = 0% |
| T(182) = 251 = 11111011B | PixelIn = 71.5% | PixelOut = 181 = 71.1% | Out − In = −1 = −.4% |
| T(183) = 251 = 11111011B | PixelIn = 71.9% | PixelOut = 181 = 71.1% | Out − In = −2 = −.8% |
| T(184) = 251 = 11111011B | PixelIn = 72.3% | PixelOut = 181 = 71.1% | Out − In = −3 = −1.2% |
| T(185) = 251 = 11111011B | PixelIn = 72.7% | PixelOut = 181 = 71.1% | Out − In = −4 = −1.6% |
| T(186) = 251 = 11111011B | PixelIn = 73.1% | PixelOut = 181 = 71.1% | Out − In = −5 = −2% |
| T(187) = 251 = 11111011B | PixelIn = 73.5% | PixelOut = 181 = 71.1% | Out − In = −6 = −2.4% |
| T(188) = 251 = 11111011B | PixelIn = 73.9% | PixelOut = 181 = 71.1% | Out − In = −7 = −2.8% |
| T(189) = 251 = 11111011B | PixelIn = 74.3% | PixelOut = 181 = 71.1% | Out − In = −8 = −3.2% |
| T(190) = 251 = 11111011B | PixelIn = 74.7% | PixelOut = 181 = 71.1% | Out − In = −9 = −3.6% |
| T(191) = 251 = 11111011B | PixelIn = 75% | PixelOut = 181 = 71.1% | Out − In = −10 = −4% |
| T(192) = 253 = 11111101B | PixelIn = 75.4% | PixelOut = 203 = 79.8% | Out − In = 11 = 4.3% |
| T(193) = 253 = 11111101B | PixelIn = 75.8% | PixelOut = 203 = 79.8% | Out − In = 10 = 3.9% |
| T(194) = 253 = 11111101B | PixelIn = 76.2% | PixelOut = 203 = 79.8% | Out − In = 9 = 3.5% |
| T(195) = 253 = 11111101B | PixelIn = 76.6% | PixelOut = 203 = 79.8% | Out − In = 8 = 3.1% |
| T(196) = 253 = 11111101B | PixelIn = 77% | PixelOut = 203 = 79.8% | Out − In = 7 = 2.7% |
| T(197) = 253 = 11111101B | PixelIn = 77.4% | PixelOut = 203 = 79.8% | Out − In = 6 = 2.3% |
| T(198) = 253 = 11111101B | PixelIn = 77.8% | PixelOut = 203 = 79.8% | Out − In = 5 = 1.9% |
| T(199) = 253 = 11111101B | PixelIn = 78.2% | PixelOut = 203 = 79.8% | Out − In = 4 = 1.5% |
| T(200) = 253 = 11111101B | PixelIn = 78.6% | PixelOut = 203 = 79.8% | Out − In = 3 = 1.1% |
| T(201) = 253 = 11111101B | PixelIn = 79% | PixelOut = 203 = 79.8% | Out − In = 2 = .7% |
| T(202) = 253 = 11111101B | PixelIn = 79.4% | PixelOut = 203 = 79.8% | Out − In = 1 = .3% |
| T(203) = 253 = 11111101B | PixelIn = 79.8% | PixelOut = 203 = 79.8% | Out − In = 0 = 0% |
| T(204) = 253 = 11111101B | PixelIn = 80.1% | PixelOut = 203 = 79.8% | Out − In = −1 = −.4% |

APPENDIX 4-continued

Pixel Translations Used in Fabrication Example #2

| Translation(PixelIn) = Masks Code in decimal = Masks Code in binary | PixelIn = Percent of Full Scale (= 255) | PixelOut = Value in decimal = Percent of Full Scale (= 255) | PixelOut − PixelIn = difference in decimal = Percent of Fun Scale (= 255) |
|---|---|---|---|
| T(205) = 253 = 11111101B | PixelIn = 80.5% | PixelOut = 203 = 79.8% | Out − In = −2 = −.8% |
| T(206) = 253 = 11111101B | PixelIn = 80.9% | PixelOut = 203 = 79.8% | Out − In = −3 = −1.2% |
| T(207) = 253 = 11111101B | PixelIn = 81.3% | PixelOut = 203 = 79.8% | Out − In = −4 = −1.6% |
| T(208) = 253 = 11111101B | PixelIn = 81.7% | PixelOut = 203 = 79.8% | Out − In = −5 = −2% |
| T(209) = 253 = 11111101B | PixelIn = 82.1% | PixelOut = 203 = 79.8% | Out − In = −6 = −2.4% |
| T(210) = 253 = 11111101B | PixelIn = 82.5% | PixelOut = 203 = 79.8% | Out − In = −7 = −2.8% |
| T(211) = 253 = 11111101B | PixelIn = 82.9% | PixelOut = 203 = 79.8% | Out − In = −8 = −3.2% |
| T(212) = 253 = 11111101B | PixelIn = 83.3% | PixelOut = 203 = 79.8% | Out − In = −9 = −3.6% |
| T(213) = 253 = 11111101B | PixelIn = 83.7% | PixelOut = 203 = 79.8% | Out − In = −10 = −4% |
| T(214) = 253 = 11111101B | PixelIn = 84.1% | PixelOut = 203 = 79.8% | Out − In = −11 = −4.4% |
| T(215) = 254 = 11111110B | PixelIn = 84.5% | PixelOut = 227 = 89.2% | Out − In = 12 = 4.7% |
| T(216) = 254 = 11111110B | PixelIn = 84.9% | PixelOut = 227 = 89.2% | Out − In = 11 = 4.3% |
| T(217) = 254 = 11111110B | PixelIn = 85.2% | PixelOut = 227 = 89.2% | Out − In = 10 = 3.9% |
| T(218) = 254 = 11111110B | PixelIn = 85.6% | PixelOut = 227 = 89.2% | Out − In = 9 = 3.5% |
| T(219) = 254 = 11111110B | PixelIn = 86% | PixelOut = 227 = 89.2% | Out − In = 8 = 3.1% |
| T(220) = 254 = 11111110B | PixelIn = 86.4% | PixelOut = 227 = 89.2% | Out − In = 7 = 2.7% |
| T(221) = 254 = 11111110B | PixelIn = 86.8% | PixelOut = 227 = 89.2% | Out − In = 6 = 2.3% |
| T(222) = 254 = 11111110B | PixelIn = 87.2% | PixelOut = 227 = 89.2% | Out − In = 5 = 1.9% |
| T(223) = 254 = 11111110B | PixelIn = 87.6% | PixelOut = 227 = 89.2% | Out − In = 4 = 1.5% |
| T(224) = 254 = 11111110B | PixelIn = 88% | PixelOut = 227 = 89.2% | Out − In = 3 = 1.1% |
| T(225) = 254 = 11111110B | PixelIn = 88.4% | PixelOut = 227 = 89.2% | Out − In = 2 = .7% |
| T(226) = 254 = 11111110B | PixelIn = 88.8% | PixelOut = 227 = 89.2% | Out − In = 1 = .3% |
| T(227) = 254 = 11111110B | PixelIn = 89.2% | PixelOut = 227 = 89.2% | Out − In = 0 = 0% |
| T(228) = 254 = 11111110B | PixelIn = 89.6% | PixelOut = 227 = 89.2% | Out − In = −1 = −.4% |
| T(229) = 254 = 11111110B | PixelIn = 90% | PixelOut = 227 = 89.2% | Out − In = −2 = −.8% |
| T(230) = 254 = 11111110B | PixelIn = 90.3% | PixelOut = 227 = 89.2% | Out − In = −3 = −1.2% |
| T(231) = 254 = 11111110B | PixelIn = 90.7% | PixelOut = 227 = 89.2% | Out − In = −4 = −1.6% |
| T(232) = 254 = 11111110B | PixelIn = 91.1% | PixelOut = 227 = 89.2% | Out − In = −5 = −2% |
| T(233) = 254 = 11111110B | PixelIn = 91.5% | Pixelout = 227 = 89.2% | Out − In = −6 = −2.4% |
| T(234) = 254 = 11111110B | PixelIn = 91.9% | PixelOut = 227 = 89.2% | Out − In = −7 = −2.8% |
| T(235) = 254 = 11111110B | PixelIn = 92.3% | PixelOut = 227 = 89.2% | Out − In = −8 = −3.2% |
| T(236) = 254 = 11111110B | PixelIn = 92.7% | PixelOut = 227 = 89.2% | Out − In = −9 = −3.6% |
| T(237) = 254 = 11111110B | PixelIn = 93.1% | PixelOut = 227 = 89.2% | Out − In = −10 = −4% |
| T(238) = 254 = 11111110B | PixelIn = 93.5% | PixelOut = 227 = 89.2% | Out − In = −11 = −4.4% |
| T(239) = 254 = 11111110B | PixelIn = 93.9% | PixelOut = 227 = 89.2% | Out − In = −12 = −4.8% |
| T(240) = 254 = 11111110B | PixelIn = 94.3% | PixelOut = 227 = 89.2% | Out − In = −13 = −5.1% |
| T(241) = 254 = 11111110B | PixelIn = 94.7% | PixelOut = 227 = 89.2% | Out − In = −14 = −5.5% |
| T(242) = 255 = 11111111B | PixelIn = 95% | PixelOut = 255 = 100% | Out − In = 13 = 5% |
| T(243) = 255 = 11111111B | PixelIn = 95.4% | PixelOut = 255 = 100% | Out − In = 12 = 4.7% |
| T(244) = 255 = 11111111B | PixelIn = 95.8% | PixelOut = 255 = 100% | Out − In = 11 = 4.3% |
| T(245) = 255 = 11111111B | PixelIn = 96.2% | PixelOut = 255 = 100% | Out − In = 10 = 3.9% |
| T(246) = 255 = 11111111B | PixelIn = 96.6% | PixelOut = 255 = 100% | Out − In = 9 = 3.5% |
| T(247) = 255 = 11111111B | PixelIn = 97% | PixelOut = 255 = 100% | Out − In = 8 = 3.1% |
| T(248) = 255 = 11111111B | PixelIn = 97.4% | PixelOut = 255 = 100% | Out − In = 7 = 2.7% |
| T(249) = 255 = 11111111B | PixelIn = 97.8% | PixelOut = 255 = 100% | Out − In = 6 = 2.3% |
| T(250) = 255 = 11111111B | PixelIn = 98.2% | PixelOut = 255 = 100% | Out − In = 5 = 1.9% |
| T(251) = 255 = 11111111B | PixelIn = 98.6% | PixelOut = 255 = 100% | Out − In = 4 = 1.5% |
| T(252) = 255 = 11111111B | PixelIn = 99% | PixelOut = 255 = 100% | Out − In = 3 = 1.1% |
| T(253) = 255 = 11111111B | PixelIn = 99.4% | PixelOut = 255 = 100% | Out − In = 2 = .7% |
| T(254) = 255 = 11111111B | PixelIn = 99.8% | PixelOut = 255 = 100% | Out − In = 1 = .3% |
| T(255) = 255 = 11111111B | PixelIn = 100% | PixelOut = 255 = 100% | Out − In = 0 = 0% |

The mask values used are:
Layer 1 transmission is .890, pixel value is 227
Layer 2 transmission is .792, pixel value is 202
Layer 3 transmission is .705, pixel value is 180
Layer 4 transmission is .631, pixel value is 161
Layer 5 transmission is .560, pixel value is 143
Layer 6 transmission is .501, pixel value is 128
Layer 7 transmission is .250, pixel value is 64
Layer 8 transmission is .125, pixel value is 32

APPENDIX 5

File Header Format for Bit-Mapped Mask Files

| Byte (hex) | Item | Size (dec) | New | Used | Description/Comments |
|---|---|---|---|---|---|
| 0 | Manufacturer | 1 | no | yes | Constant Flag (values below in decimal): 10 = ZSoft.pcx |
| 1 | Version | 1 | no | yes | Version information (values below in decimal): 5 = Version 3.0 and greater of PC Paintbrush and PC Paintbrush+, includes Publisher's Paintbrush. Includes 24-bit .PCX files. |
| 2 | Encoding | 1 | no | yes | 1 = .Pcx run-length encoding |
| 3 | BitsPerPixel | 1 | no | yes | Number of bits to represent a pixel = 1 |
| 4 | Window | 8 | no | yes | Image Dimensions (2 bytes each): Xmin, Ymin, Xmax, Ymax |
| C | HDpi | 2 | no | no | Horizontal Resolution of image in DPI* |
| E | VDpi | 2 | no | no | Vertical Resolution of image in DPI* |
| 10 | ColorMap | 48 | no | no | Color palette setting |
| 40 | Reserved | 1 | no | no | Should be set to 0 |
| 41 | NPlanes | 1 | no | yes | Number of color planes = 1 |
| 42 | BytesPerLine | 2 | no | yes | Number of bytes to allocate for a scan line plane. MUST be an EVEN number. Do NOT calculate from Xmax − Xmin. |
| 44 | PaletteInfo | 2 | no | yes | How to interpret palette = 1 for color/BW |
| 46 | HScreenSize | 2 | no | no | Horizontal screen size in pixels. Found only in ZSoft PaintBrush IV/IV+. |
| 48 | VScreenSize | 2 | no | no | Vertical screen size in pixels. Found only in ZSoft PaintBrush IV/IV+. |
| (4A) | (Filler) | (54) | (no) | (no) | (Formerly blank to fill out 128 byte header.) |
| 4A | MaskID | 1 | yes | yes | positive value if a pixel = 0 makes a hole in the mask photo resist, or a negative value in 2's complement notation if a pixel = 1 makes a hole in the resist. The absolute value of the Mask ID is a mask layer identifier in the range 1 . . . 127. |
| 4B | Control | 1 | yes | yes | defines which functions are used in a particular mask file: bit 0 = 1 if a scan line ID is at end of each scan line, bit 1 = 1 if a CRC code is at end of each scan line, bit 2 - 1 if a CRC code is at end of header, bit 3 = 1 if a layer ID is at end of each scan line, bits 4 . . . 7 - unused, normally 0 |
| 4C | PixelSize | 2 | yes | yes | physical size of a pixel in .01 micrometers |
| 4E | StripeCoor | 4 | yes | yes | X,Y positive, absolute coordinates (2 bytes each, unsigned) of the upper left hand pixel of this stripe. If X=0 and Y=0, then this stripe is the first stripe in an image and subsequent stripes (in other files) are to the right and/or below it. |
| 52 | CRC_Coef | 2 | yes | yes | a 16-bit CRC code is computed using this coefficient, with bits C(16) . . . C(1), and placed at the end of the header and/or at the end of every scan line if enabled by the Control byte. C(0) is always 1 and is not stored. |
| 54 | Annotation | 42 | yes | yes | ASCII annotation for this file (optional) |
| 7E | HeaderCRC | 2 | yes | yes | 16-bit CRC code computed over the preceding bytes of the header (if enabled by Control byte) |

NOTES:
All sizes are measured in BYTES.
All variables of SIZE 2 bytes are integers that are stored in the file at least significant byte first.
*HDpi and VDpi represent the Hoizontal and Vertical resolutions with which the image was created (either printer or scanner); i.e. and image which was scanned might have 300 and 300 in each of these fields. These values are irrelevant to mask-making.

APPENDIX 6

Text File Used to Create Pap Smear Micro Library #2B

```
;Stripe #1:
    0, 0, psml-2b\PSML2B-        ;absolute X-Y coordinates, path and output file name for this stripe
    0, 0, psml-2b\rimg13mh       ;relative X-Y coordinates, path and input file name for image #1
```

APPENDIX 6-continued

Text File Used to Create Pap Smear Micro Library #2B

```
    512, 0, testfile\ran1x256       ;relative X-Y coordinates, path and input file name for image #2
    768, 0, testfile\ran2x256       ;relative X-Y coordinates, path and input file name for image #3
   1024, 0, testfile\ran4x256       ;relative X-Y coordinates, path and input file name for image #4
   1280, 0, testfile\gra8x8_0       ;relative X-Y coordinates, path and input file name for image #5
   1536, 0, testfile\gra8x8_1       ;relative X-Y coordinates, path and input file name for image #6
   1792, 0, testfile\gra8x8_2       ;relative X-Y coordinates, path and input file name for image #7
   2048, 0, testfile\gra8x8_3       ;relative X-Y coordinates, path and input file name for image #8
   2560, 0, testfile\topleft        ;relative X-Y coordinates, path and input file name for image #9
   2816, 0, testfile\top1           ;relative X-Y coordinates, path and input file name for image #10
   3072, 0, testfile\top2           ;relative X-Y coordinates, path and input file name for image #11
   3328, 0, testfile\top3           ;relative X-Y coordinates, path and input file name for image #12
   3584, 0, testfile\top4           ;relative X-Y coordinates, path and input file name for image #13
   3840, 0, testfile\topright       ;relative X-Y coordinates, path and input file name for image #14
  -4304, -256, null                 ;negative of X and Y size of this stripe, and dummy name
;Stripe #2:
      0, 256, psml-2b\null
      0, 0, testfile\#1-890, -1     ;the -1 is an option that sends the data to only mask #1
    512, 0, testfile\black, -1
    768, 0, testfile\vert-1, -1
   1024, 0, testfile\vert-2, -1
   1280, 0, testfile\horiz-1, -1
   1536, 0, testfile\horiz-2, -1
   1792, 0, testfile\check-1, 1
   2048, 0, testfile\check-2, -1
   2560, 0, testfile\left-a
   2848, 64, psml-2b\fimg261g
   3104, 64, psml-2b\fimg221g
   3360, 64, psml-2b\fimg211g
   3616, 64, psml-2b\fimg201g
   3840, 0, testfile\right-a
      0, -1, null
;Stripe #3:
      0, 512, psml-2b\null
      0, 0, testfile\#2-792, -2     ;the -2 is an option that sends the data to only mask #2
    512, 0, testfile\black, -2
    768, 0, testfile\vert-1, -2
   1024, 0, testfile\vert-2, -2
   1280, 0, testfile\horiz-1, -2
   1536, 0, testfile\horiz-2, -2
   1792, 0, testfile\check-1, -2
   2048, 0, testfile\check-2, -2
   2560, 0, testfile\left-b
   2848, 64, psml-2b\fimg171g
   3104, 64, psml-2b\fimg241g
   3360, 64, psml-2b\fimg251g
   3616, 64, psml-2b\fimg031g
   3840, 0, testfile\right-b
      0, -1, null
;Stripe #4:
      0, 768, psml-2b\null
      0, 0, testfile\#3-705, -3
    512, 0, testfile\black, -3
    768, 0, testfile\vert-1, -3
   1024, 0, testfile\vert-2, -3
   1280, 0, testfile\horiz-1, -3
   1536, 0, testfile\horiz-2, -3
   1792, 0, testfile\check-1, -3
   2048, 0, testfile\check-2, -3
   2560, 0, testfile\left-c
   2848, 64, psml-2b\rimg011g
   3104, 64, psml-2b\rimg371g
   3360, 64, psml-2b\rimg331g
   3616, 64, psml-2b\rimg261g
   3840, 0, testfile\right-c
      0, -1, null
;Stripe #5:
      0, 1024, psml-2b\null
      0, 0, testfile\#4-631, -4
    512, 0, testfile\black, -4
    768, 0, testfile\vert-1, -4
   1024, 0, testfile\vert-2, -4
   1280, 0, testfile\horiz-1, -4
   1536, 0, testfile\horiz-2, -4
   1792, 0, testfile\check-1, -4
   2048, 0, testfile\check-2, -4
   2560, 0, testfile\left-d
   2848, 64, psml-2b\rimg091g
```

APPENDIX 6-continued

Text File Used to Create Pap Smear Micro Library #2B

```
    3104, 64, psml-2b\rimg111g
    3360, 64, psml-2b\rimg071g
    3616, 64, psml-2b\rimg221g
    3840, 0, testfile\right-d
    0, -1, null
;Stripe #6:
    0, 1280, psml-2b\null
    0, 0, testfile\#5-560, -5
    512, 0, testfile\black, -5
    768, 0, testfile\vert-1, -5
    1024, 0, testfile\vert-2, -5
    1280, 0, testfile\horiz- 1, -5
    1536, 0, testfile\horiz-2, -5
    1792, 0, testfile\check-1, -5
    2048, 0, testfile\check-2, -5
    2560, 0, testfile\left-e
    2848, 64, psml-2b\rimg241g
    3104, 64, psml-2b\rimg131g
    3360, 64, psml-2b\rimg281g
    3616, 64, psml-2b\rimg311g
    3840, 0, testfile\right-e
    -0, -1, null
;Stripe #7:
    0, 1536, psml-2b\null
    0, 0, testfile\#6-500, -6
    512, 0, testfile\black, -6
    768, 0, testfile\vert-1, -6
    1024, 0, testfile\vert-2, -6
    1280, 0, testfile\horiz-1, -6
    1536, 0, testfile\horiz-2, -6
    1792, 0, testfile\check-1, -6
    2048, 0, testfile\check-2, -6
    2560, 0, testfile\left-f
    2848, 64, psml-2b\rimg301g
    3104, 64, psml-2b\rimg161g
    3360, 64, psml-2b\rimg051g
    3616, 64, psml-2b\rimg031g
    3840, 0, testfile\right-f
    -0, -1, null
;Stripe #8:
    0, 1792, psml-2b\null
    0, 0, testfile\#7-250, -7
    512, 0, testfile\black, -7
    768, 0, testfile\vert-1, -7
    1024, 0, testfile\vert-2, -7
    1280, 0, testfile\horiz-1, -7
    1536, 0, testfile\horiz-2, -7
    1792, 0, testfile\check-1, -7
    2048, 0, testfile\check-2, -7
    2560, 0, testfile\left-g
    2848, 64, psml-2b\rimg201g
    3840, 0, testfile\right-g
    0, -1, null
;Stripe #9:
    0, 2048, psml-2b\null
    0, 0, testfile\#8-125, -8
    512, 0, testfile\black, -8
    768, 0, testfile\vert-1, -8
    1024, 0, testfile\vert-2, -8
    1280, 0, testfile\horiz-1, -8
    1536, 0, testfile\horiz-2, -8
    1792, 0, testfile\check-1, -8
    2048, 0, testfile\check-2, -8
    2560, 0, testfile\left
    2816, 0, psml-2b\psml#2b
    3840, 0, testfile\right
    0, -1, null
;Stripe #10:
    0, 2304, psml-2b\null
    0, 0, psml-2b\rimg13hh
    512, 0, testfile\black
    768, 0, testfile\vert-1
    1024, 0, testfile\vert-2
    1280, 0, testfile\horiz-1
    1536, 0, testfile\horiz-2
    1792, 0, testfile\check-1
    2048, 0, testfile\check-2
```

APPENDIX 6-continued

Text File Used to Create Pap Smear Micro Library #2B

```
2560, 0, testfile\botleft
2816, 0, testfile\bot1
3072, 0, testflie\bot2
3328, 0, testfile\bot3
3584, 0, testfile\bot4
3840, 0, testfile\botright
0, -1, null
```

I claim:

1. An optical device comprised of a substrate that bears upon a surface thereof at least one multi-layered pattern forming a life-size image of a cytology specimen, said image having sufficient detail to show details of a cell nucleus, wherein said image is comprised of a plurality of picture elements, and wherein specified ones of said picture elements are comprised of from one thin film layer to a plurality of superimposed thin film layers.

2. An optical device as set forth in claim 1, wherein at least one of said superimposed thin film layers has an optical density that differs from an optical density of others of said superimposed thin film layers.

3. An optical device as set forth in claim 2, wherein a set of thin film optical density values is selected to provide a desired range of gray-scale values for picture elements that comprise the at least one image.

4. An optical device as set forth in claim 1, wherein said substrate further bears on said surface at least one test pattern image.

5. An optical device as set forth in claims 2, wherein said substrate is transparent to light used to view said life-size image, and wherein said life-size image is a transmissive image.

6. An image-bearing structure, comprising:

a substrate having at least one major surface; and at least one image disposed upon said at least one major surface, said at least one image being capable of exhibiting microscopic detail and comprised of a plurality of picture elements, individual ones of said picture elements being comprised of one of zero, at least one layer of material having a predetermined optical characteristics, and a plurality of superimposed layers of material, individual ones of said superimposed layers each having a predetermined optical characteristic.

7. An image-bearing structure as set forth in claim 6, wherein at least some of the picture elements of the at least one image have a color, and wherein a plurality of layers of material provide, for each picture element having a color, a spectral selectivity that corresponds to a desired picture element color.

8. An image-bearing structure as set forth in claim 6, wherein at least some of the picture elements of the at least one image have a gray-scale value, and wherein a plurality of layers of material provide, for each picture element having a gray-scale value, an optical transmission value that corresponds to a desired picture element gray-scale value.

9. An image-bearing structure as set forth in claim 6, wherein at least some of the picture elements of the at least one image have a gray-scale value, and wherein a thickness of a plurality of the layers of material is varied to provide, for each picture element having a gray-scale value, an optical transmission value that corresponds to a desired picture element gray-scale value.

10. An image-bearing structure as set forth in claim 6, wherein each of the picture elements has a size that results in an observation of the picture element being diffraction limited.

11. An image-bearing structure as set forth in claim 6, wherein said substrate is comprised of a material that is substantially transparent.

12. An image-bearing structure as set forth in claim 6, wherein said substrate is comprised of glass, and wherein said material is comprised of at least one metal.

13. An image-bearing structure as set forth in claim 6, wherein said substrate is comprised of fused quartz, and wherein said material is comprised of nickel and chromium.

14. An image-bearing structure as set forth in claim 6, wherein said substrate is comprised of a material that is substantially transparent, and further comprising a substantially transparent, electrically conductive layer that is disposed on said major surface of said substrate and beneath said plurality of deposited layers of material.

15. An image-bearing structure as set forth in claim 6, wherein said substrate is partitioned into a plurality of image-bearing regions, and wherein individual ones of said image-bearing regions contain substantially identical image information such that said substrate can be physically subdivided into a plurality of image bearing sub-structures each of which contains the substantially identical image information.

16. An image-bearing structure as set forth in claim 6, wherein said at least one image has at least one visual characteristic that is selected from at least one of: a transmissive image visual characteristic; a reflective image visual characteristic; a two-dimensional image visual characteristic; a three-dimensional image visual characteristic; a gray scale image visual characteristic; and a color image visual characteristic.

17. An image-bearing structure as set forth in claim 6, wherein said at least one image is a life-size image of a cytology specimen, said life-size image having sufficient tonal and spatial resolution to show details of a cell nucleus.

18. An image-bearing structure as set forth in claim 6, wherein said substrate is transparent to light used to view said at least one image, and wherein said at least one image is a transmissive image.

19. A structure having a surface that bears a deposited pattern that is fabricated to represent an image having microscopic detail, said structure being formed in accordance with a method that comprises the steps of:

providing a digital representation of a desired image;

converting the digital representation of the desired image into a plurality of mask specifications, each of the mask specifications defining one or more openings within a mask through which a layer of material having a predetermined optical characteristic is to be deposited, wherein an opening corresponds to at least one region of the deposited pattern;

providing a substrate; and fabricating the pattern by providing, in turn, a mask corresponding to each of the mask specifications, depositing a layer of material though the one or more openings within the mask, and removing the mask, wherein each region of the pattern is comprised of from zero to a plurality of layers of the deposited material and has a visual characteristic that is a function of the combined optical characteristics of the layer or layers of material, if any, that comprise the region, and wherein the combined optical characteristics of the layer or layers of material in the pattern regions form the desired image with microscopic detail.

20. A structure as set forth in claim 19, wherein said pattern represents an image that has at least one visual characteristic that is selected from at least one of: a transmissive image visual characteristic; a reflective image visual characteristic; a two-dimensional image visual characteristic; a three-dimensional image visual characteristic; a gray scale image visual characteristic; and a color image visual characteristic.

21. A structure as set forth in claim 19, wherein said pattern represents a life-size image of a cytology specimen having sufficient tonal and spatial resolution to show details of a cell nucleus.

22. A structure as set forth in claim 19, wherein said substrate is transparent to light used to view said image, and wherein said image is a transmissive image.

* * * * *